(12) United States Patent
Yamazaki et al.

(10) Patent No.: US 12,266,392 B2
(45) Date of Patent: Apr. 1, 2025

(54) DRIVING METHOD OF SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Hajime Kimura, Kanagawa (JP); Hitoshi Kunitake, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 156 days.

(21) Appl. No.: 18/006,323

(22) PCT Filed: Jul. 20, 2021

(86) PCT No.: PCT/IB2021/056525
§ 371 (c)(1),
(2) Date: Jan. 20, 2023

(87) PCT Pub. No.: WO2022/029534
PCT Pub. Date: Feb. 10, 2022

(65) Prior Publication Data
US 2023/0298650 A1     Sep. 21, 2023

(30) Foreign Application Priority Data
Aug. 3, 2020   (JP) .................. 2020-131964

(51) Int. Cl.
*G11C 11/22*     (2006.01)
*H10B 51/30*     (2023.01)
*H10B 53/30*     (2023.01)

(52) U.S. Cl.
CPC ............ *G11C 11/221* (2013.01); *H10B 51/30* (2023.02); *H10B 53/30* (2023.02)

(58) Field of Classification Search
CPC .............. G11C 11/221; G11C 11/2259; G11C 11/2273; G11C 11/2275; H10B 53/30; H10B 51/30
See application file for complete search history.

(56) References Cited

U.S. PATENT DOCUMENTS 5,519,234 A    5/1996  Paz de araujo et al.
5,851,841 A    12/1998 Ushikubo et al.
(Continued)

FOREIGN PATENT DOCUMENTS

CN    106716539 A    5/2017
EP       2647009 B    1/2019
(Continued)

OTHER PUBLICATIONS

Yanazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
(Continued)

*Primary Examiner* — Ly D Pham
(74) *Attorney, Agent, or Firm* — Fish & Richardson P.C.

(57) ABSTRACT

Provided is a semiconductor device capable of retaining data for a long time. The semiconductor device includes a cell provided with a capacitor, a first transistor, and a second transistor; the capacitor includes a first electrode, a second electrode, and a ferroelectric layer; the ferroelectric layer is provided between the first electrode and the second electrode and polarization reversal occurs by application of a first saturated polarization voltage or a second saturated polarization voltage whose polarity is different from that of the first saturated polarization voltage; and the first electrode, one of a source and a drain of the first transistor, and a gate of the second transistor are electrically connected to one another. In a first period, the first saturated polarization
(Continued)

voltage is applied to the ferroelectric layer. In a second period, a voltage having a value between the first saturated polarization voltage and the second saturated polarization voltage is applied to the ferroelectric layer as a data voltage.

20 Claims, 28 Drawing Sheets

(56) References Cited

U.S. PATENT DOCUMENTS

| | | | |
|---|---|---|---|
| 7,446,361 | B2 | 11/2008 | Maruyama |
| 7,675,795 | B2 | 3/2010 | Koyama |
| 7,928,910 | B2 | 4/2011 | Suzuki et al. |
| 8,760,907 | B2 | 6/2014 | Evans, Jr. et al. |
| 8,787,063 | B2 | 7/2014 | Evans, Jr. et al. |
| 8,964,446 | B2 | 2/2015 | Evans et al. |
| 9,269,416 | B2 | 2/2016 | Evans, Jr. |
| 9,324,405 | B2 | 4/2016 | Evans, Jr. et al. |
| 9,496,019 | B2 | 11/2016 | Evans, Jr. et al. |
| 10,020,042 | B2 | 7/2018 | Evans, Jr. et al. |
| 10,121,705 | B2 | 11/2018 | Shinohara et al. |
| 11,296,708 | B2 | 4/2022 | Manipatruni et al. |
| 11,521,953 | B1 | 12/2022 | Manipatruni et al. |
| 2007/0171693 | A1 | 7/2007 | Koyama |
| 2008/0174494 | A1 | 7/2008 | Suzuki et al. |
| 2011/0176348 | A1 | 7/2011 | Yamazaki et al. |
| 2012/0134196 | A1 | 5/2012 | Evans, Jr. et al. |
| 2015/0137239 | A1 | 5/2015 | Shinohara et al. |

FOREIGN PATENT DOCUMENTS

| | | |
|---|---|---|
| JP | 2014-503930 | 2/2014 |
| JP | 2015-103555 A | 6/2015 |
| KR | 2014-0007346 A | 1/2014 |
| WO | WO-2012/074776 | 6/2012 |
| WO | WO-2015/112609 | 7/2015 |
| WO | WO-2016/048653 | 3/2016 |

OTHER PUBLICATIONS

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

Slesazeck.S et al., "Uniting the Trinity of Ferroelectric HfO2 Memory Devices in a Single Memory Cell", IMW 2019 (11th IEEE International Memory Workshop), May 12, 2019, pp. 20-23.

Okuno.J et al., "SoC compatible 1T1C FeRAM memory array based on ferroelectric Hf0.5Zr0.5O2", 2020 Symposium on VLSI Technology : Digest of Technical Papers, Jun. 16, 2020, p. 2pages.

International Search Report (Application No. PCT/IB2021/056525) Dated Sep. 28, 2021.

Written Opinion (Application No. PCT/IB2021/056525) Dated Sep. 28, 2021.

FIG. 1A
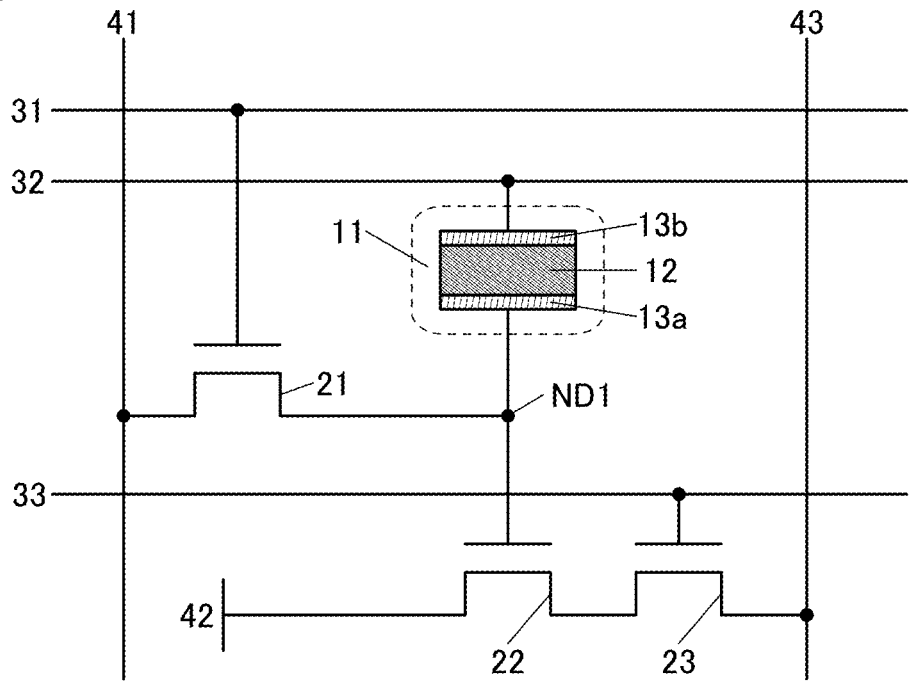
FIG. 1B1
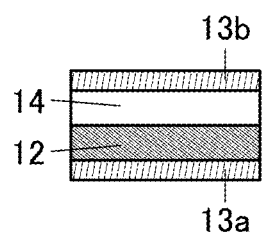
FIG. 1B2
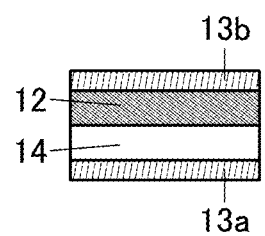
FIG. 1B3
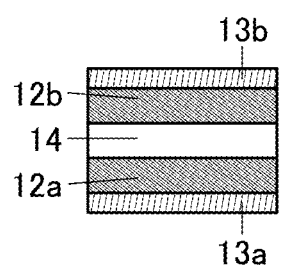
FIG. 1B4
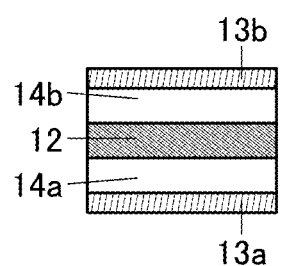

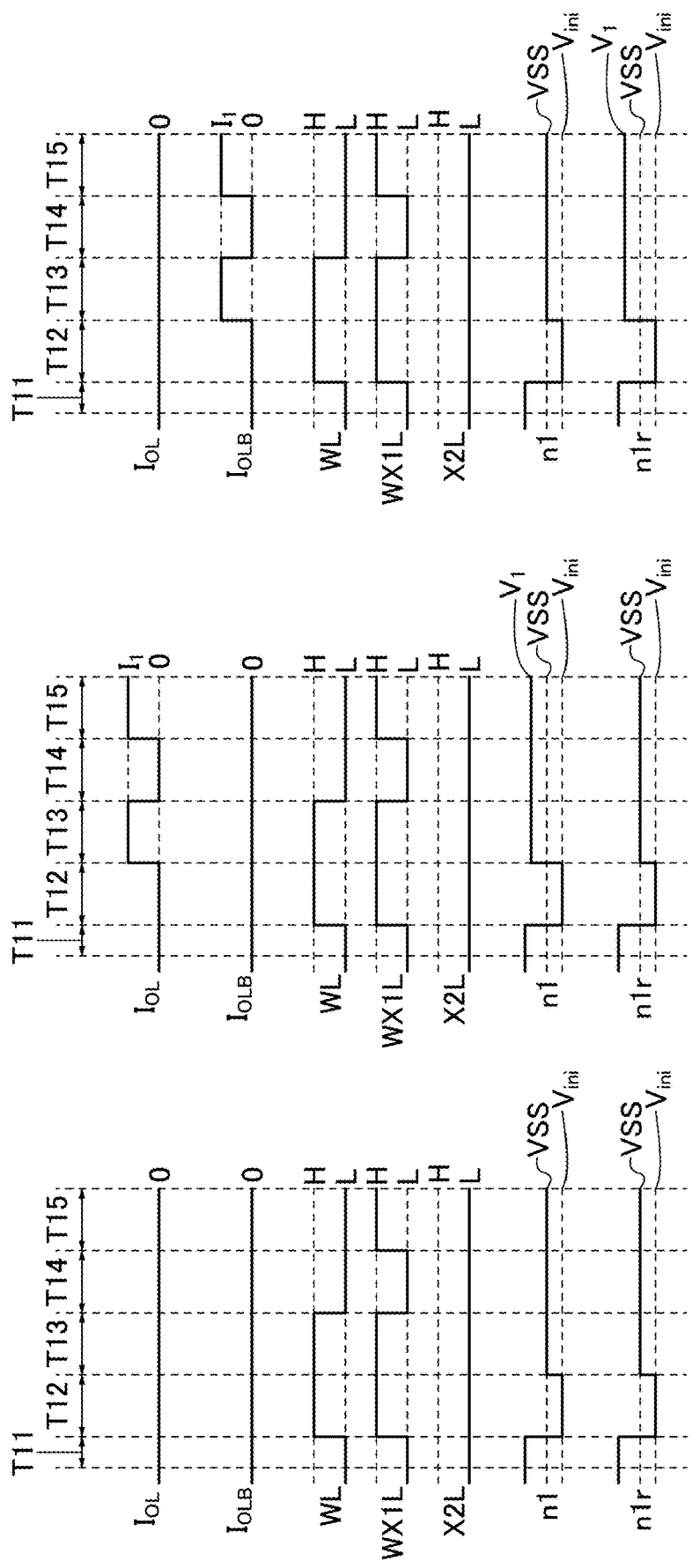

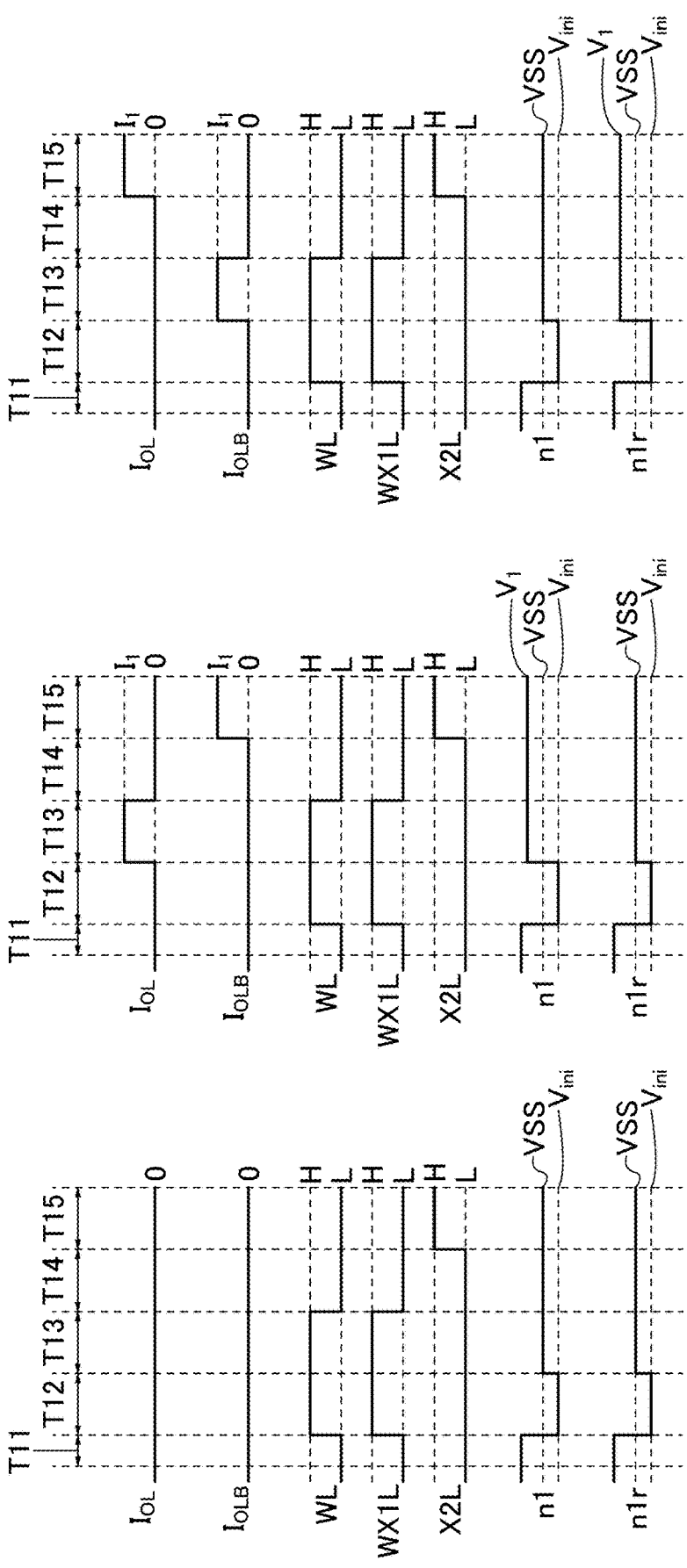

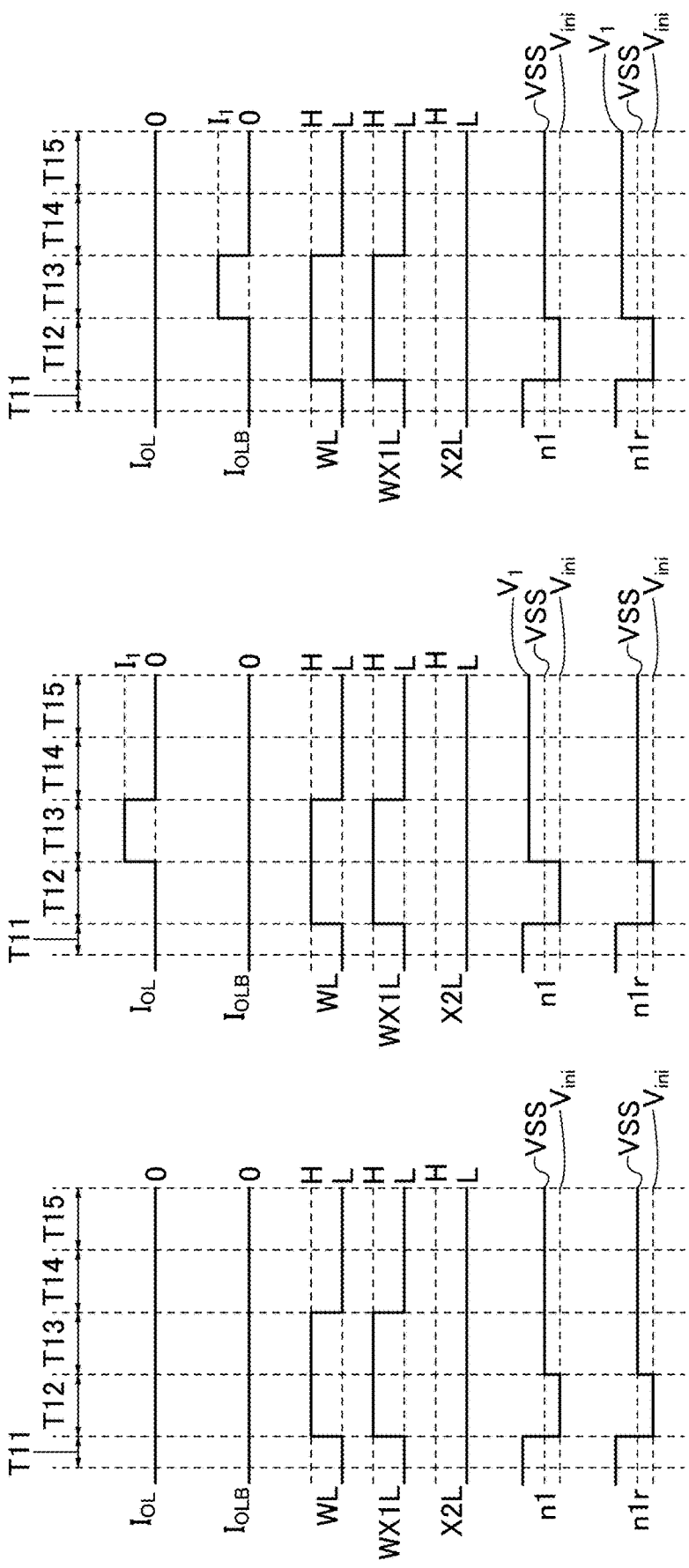

FIG. 21A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 21B
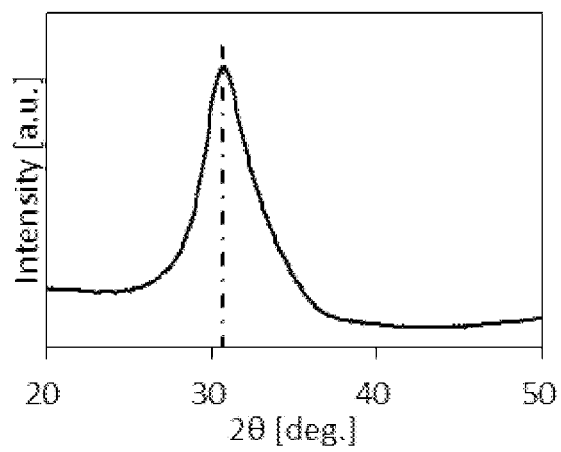
FIG. 21C
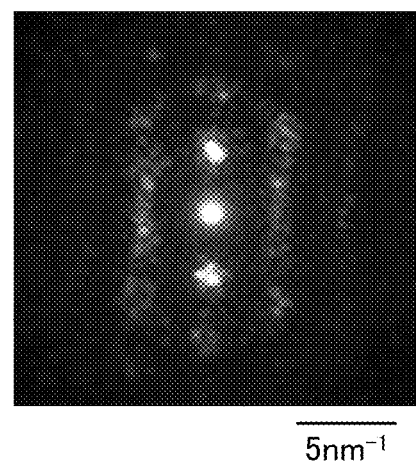

DRIVING METHOD OF SEMICONDUCTOR DEVICE

CROSS REFERENCE TO RELATED APPLICATIONS

This application is a U.S. National Phase Application under 35 U.S.C. § 371 of International Application PCT/IB2021/056525, filed on Jul. 20, 2021, which is incorporated by reference and claims the benefit of a foreign priority application filed in Japan on Aug. 3, 2020, as Application No. 2020-131964.

TECHNICAL FIELD

One embodiment of the present invention relates to, for example, a driving method of a semiconductor device.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a memory device, a display system, an electronic device, a lighting device, an input device, an input/output device, a driving method thereof, and a manufacturing method thereof.

BACKGROUND ART

As a semiconductor applicable to a transistor, a metal oxide has been attracting attention. An In—Ga—Zn oxide called "IGZO" and the like is a typical multi-component metal oxide. From researches on IGZO, a CAAC (c-axis aligned crystalline) structure and an nc (nanocrystalline) structure, which are neither single crystal nor amorphous, have been found (e.g., Non-Patent Document 1).

It has been reported that a transistor containing a metal oxide semiconductor in its channel formation region (hereinafter referred to as an "oxide semiconductor transistor" or an "OS transistor" in some cases) has an extremely low off-state current (e.g., Non-Patent Documents 1 and 2). A variety of semiconductor devices using OS transistors have been manufactured (e.g., Non-Patent Documents 3 and 4).

A memory utilizing an extremely low off-state current of an OS transistor (also referred to as an OS memory in some cases) is proposed. For example, a circuit configuration of a NOSRAM is disclosed in Patent Document 1. Note that "NOSRAM (registered trademark)" is an abbreviation for "Nonvolatile Oxide Semiconductor RAM". A NOSRAM is a memory in which its cell is a 2-transistor (2T) or 3-transistor (3T) gain cell, and its access transistor is an OS transistor. An OS transistor has an extremely low current that flows between a source and a drain in an off state, that is, leakage current. The NOSRAM can be used as a nonvolatile memory by retaining electric charge corresponding to data in the cell, using characteristics of an extremely low leakage current.

REFERENCE

Patent Document

[Patent Document 1] Specification of United States Patent Application Publication No. 2011/0176348

Non-Patent Document

[Non-Patent Document 1] S. Yamazaki et al., "Properties of crystalline In—Ga—Zn-oxide semiconductor and its transistor characteristics," Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide," Jpn. J. Appl. Phys., vol. 51, 021201 (2012).

[Non-Patent Document 3] S. Amano et al., "Low Power LC Display Using In—Ga—Zn-Oxide TFTs Based on Variable Frame Frequency," SID Symp. Dig. Papers, vol. 41, pp. 626-629 (2010).

[Non-Patent Document 4] T. Ishizu et al., "Embedded Oxide Semiconductor Memories: A Key Enabler for Low-Power ULSI," ECS Tran., vol. 79, pp. 149-156 (2017).

SUMMARY OF THE INVENTION

Problems to be Solved by the Invention

In a memory such as a NOSRAM, electric charge corresponding to data is retained in a capacitor included in a cell. Thus, when the amount of electric charge that can be retained in the capacitor is small, data reading accuracy is significantly decreased because of the leakage of electric charge from the capacitor. As a result, data cannot be retained in the cell for a long time in some cases.

An object of one embodiment of the present invention is to provide a semiconductor device capable of retaining data for a long time and a driving method thereof. Another object of one embodiment of the present invention is to provide a semiconductor device with low power consumption and a driving method thereof. Another object of one embodiment of the present invention is to provide a semiconductor device to which a high voltage can be applied and a driving method thereof. Another object of one embodiment of the present invention is to provide a highly reliable semiconductor device and a driving method thereof. Another object of one embodiment of the present invention is to provide a novel semiconductor device and a driving method thereof.

One embodiment of the present invention does not necessarily achieve all the above objects and only needs to achieve at least one of the objects. The description of the above objects does not preclude the existence of other objects. Objects other than these objects will be apparent from the description of the specification, the claims, the drawings, and the like, and objects other than these objects can be derived from the description of the specification, the claims, the drawings, and the like.

Means for Solving the Problems

One embodiment of the present invention is a driving method of a semiconductor device, in which the semiconductor device includes a cell provided with a capacitor, a first transistor, and a second transistor; the capacitor includes a first electrode, a second electrode, and a ferroelectric layer; the ferroelectric layer is provided between the first electrode and the second electrode; polarization reversal occurs in the ferroelectric layer by application of a first saturated polarization voltage or a second saturated polarization voltage whose polarity is different from a polarity of the first saturated polarization voltage; and the first electrode, one of a source and a drain of the first transistor, and a gate of the second transistor are electrically connected to one another.

In the driving method of the semiconductor device, the first saturated polarization voltage is applied to the ferroelectric layer in a first period, and a voltage having a value between the first saturated polarization voltage and the second saturated polarization voltage is applied to the ferroelectric layer as a data voltage in a second period.

In the above embodiment, a potential of the first electrode in the first period may be different from a potential of the first electrode in the second period, and a potential of the second electrode in the first period may be different from a potential of the second electrode in the second period.

In the above embodiment, the first transistor may be in an on state in the first period and the second period, and the first transistor may be in an off state in a third period.

In the above embodiment, the cell may include a third transistor, one of a source and a drain of the second transistor may be electrically connected to one of a source and a drain of the third transistor, the third transistor may be in an off state in the first to third periods, and the third transistor may be in an on state in a fourth period.

In the above embodiment, a potential of the second electrode is not necessarily changed in the second to fourth periods.

In the above embodiment, a constant potential may be supplied to the other of the source and the drain of the second transistor in the first to fourth periods.

In the above embodiment, a polarity of a polarization amount of the ferroelectric layer in the first period and a polarity of a polarization amount of the ferroelectric layer in the second period may be the same.

In the above embodiment, the data voltage may represent analog data.

In the above embodiment, the first transistor may contain a metal oxide in a channel formation region.

Effect of the Invention

According to one embodiment of the present invention, a semiconductor device capable of retaining data for a long time and a driving method thereof can be provided. Alternatively, according to one embodiment of the present invention, a semiconductor device with low power consumption and a driving method thereof can be provided. Alternatively, according to one embodiment of the present invention, a semiconductor device to which a high voltage can be applied and a driving method thereof can be provided. Alternatively, according to one embodiment of the present invention, a highly reliable semiconductor device and a driving method thereof can be provided. Alternatively, according to one embodiment of the present invention, a novel semiconductor device and a driving method thereof can be provided.

The description of a plurality of effects does not preclude the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 1A is a circuit diagram illustrating a configuration example of a cell. FIG. 1B1 to FIG. 1B4 are diagrams illustrating structure examples of a capacitor.

FIG. 16A to FIG. 16C are timing charts showing operation examples of a semiconductor device.

FIG. 17A to FIG. 17C are timing charts showing operation examples of a semiconductor device.

FIG. 18A to FIG. 18C are timing charts showing operation examples of a semiconductor device.

FIG. 21A is a diagram showing the classification of crystal structures of IGZO. FIG. 21B is a diagram showing an XRD spectrum of crystalline IGZO. FIG. 21C is a diagram showing a nanobeam electron diffraction pattern of crystalline IGZO.

MODE FOR CARRYING OUT THE INVENTION

Figure 2:
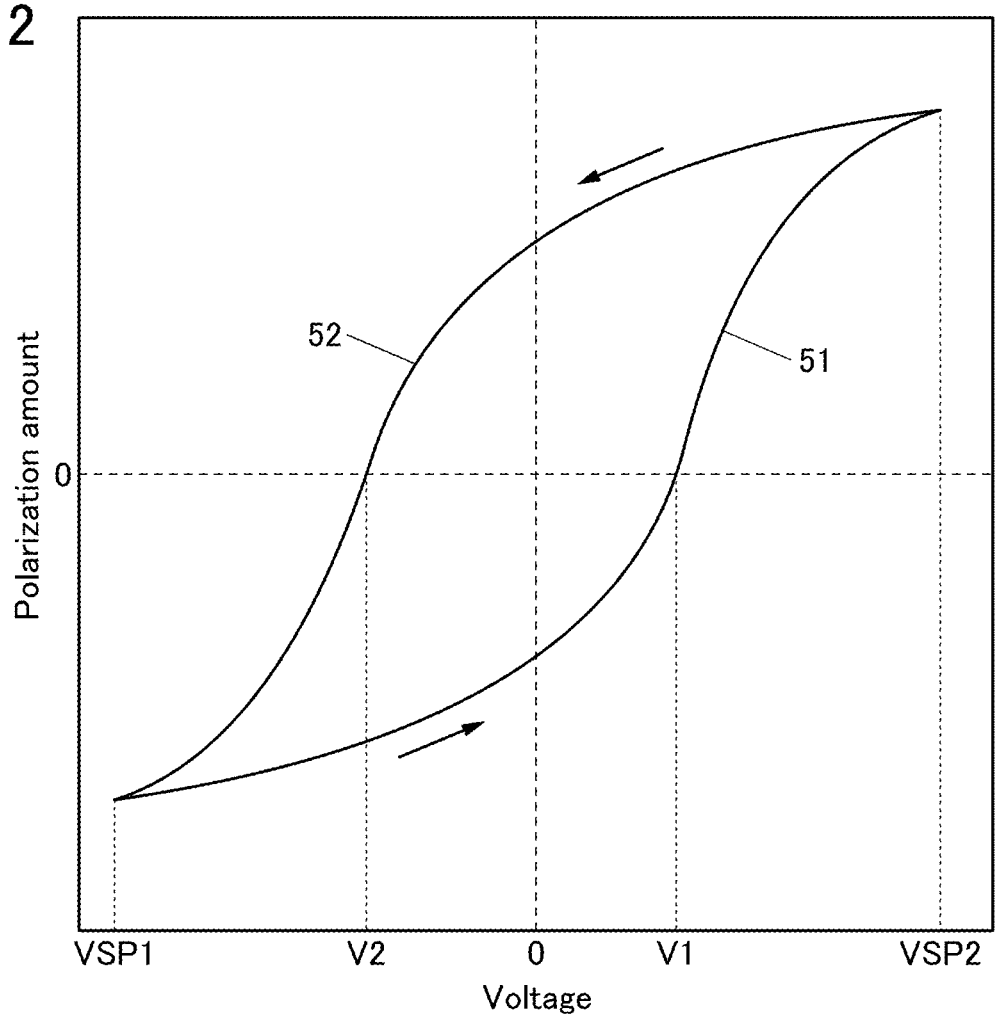
FIG. 2 is a diagram showing hysteresis characteristics of a ferroelectric.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the following embodiments.

In addition, ordinal numbers such as "first", "second", and "third" in this specification and the like are used to avoid confusion among components. Thus, the ordinal numbers do not limit the number of components. Furthermore, the ordinal numbers do not limit the order of components. For example, a "first" component in one embodiment in this specification and the like can be referred to as a "second" component in other embodiments, or the scope of claims. For another example, a "first" component in one embodiment in this specification and the like can be omitted in other embodiments, or the scope of claims.

The same components, components having similar functions, components made of the same material, components formed at the same time, and the like in the drawings are denoted by the same reference numerals, and repeated description thereof is skipped in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS FET or an OS transistor is mentioned, it can also be referred to as a transistor including a metal oxide or an oxide semiconductor.

In addition, in this specification and the like, a metal oxide containing nitrogen is also collectively referred to as a metal oxide in some cases. Furthermore, a metal oxide containing nitrogen may be referred to as a metal oxynitride.

Embodiment 1

In this embodiment, a semiconductor device of one embodiment of the present invention and a driving method thereof will be described.

One embodiment of the present invention relates to a semiconductor device including a cell. The cell has a function of retaining data. Specifically, the cell has a capacitor and electric charge is retained in the capacitor, whereby data written to the cell can be retained. Hence, the cell can be referred to as a memory cell and the semiconductor device can be referred to as a memory device.

In one embodiment of the present invention, the capacitor has a structure including a first electrode, a second electrode, and a ferroelectric layer. The ferroelectric layer is provided between the first electrode and the second electrode. Owing to such a structure of the capacitor, the amount of electric charge that can be retained in the capacitor can be larger than in the case of a capacitor with a structure in which a paraelectric layer is provided between the first electrode and the second electrode. Thus, the semiconductor device of one embodiment of the present invention can retain data for a long time. Accordingly, the frequency of refresh (data rewriting to the cell) can be reduced, leading to a reduction in power consumption of the semiconductor device of one embodiment of the present invention.

In this specification and the like, a ferroelectric indicates a material in which polarization is caused by voltage application and the polarization is maintained even after the voltage application is stopped. A paraelectric indicates a material in which polarization is caused by voltage application and the polarization disappears without being maintained when the voltage application is stopped.

<Configuration Example_1 of Cell>

FIG. 1A is a circuit diagram illustrating a configuration example of a cell 10 included in the semiconductor device of one embodiment of the present invention.

The cell 10 includes a capacitor 11, a transistor 21, a transistor 22, and a transistor 23. The capacitor 11 includes a ferroelectric layer 12, an electrode 13a, and an electrode 13b, and the ferroelectric layer 12 is provided between the electrode 13a and the electrode 13b.

The electrode 13a is electrically connected to one of a source and a drain of the transistor 21. The one of the source and the drain of the transistor 21 is electrically connected to a gate of the transistor 22. One of a source and a drain of the transistor 22 is electrically connected to one of a source and a drain of the transistor 23. Here, a node to which the electrode 13a, the one of the source and the drain of the transistor 21, and the gate of the transistor 22 are electrically connected is a node ND1.

A gate of the transistor 21 is electrically connected to a wiring 31. The electrode 13b is electrically connected to a wiring 32. A gate of the transistor 23 is electrically connected to a wiring 33. The other of the source and the drain of the transistor 21 is electrically connected to a wiring 41. The other of the source and the drain of the transistor 22 is electrically connected to a wiring 42. The other of the source and the drain of the transistor 23 is electrically connected to a wiring 43. Here, the wiring 42 can be supplied with a constant potential.

Note that although the transistor 21 to the transistor 23 illustrated in FIG. 1A are not provided with back gates, back gates may be provided. For example, some of the transistor 21 to the transistor 23 may be provided with back gates or all of them may be provided with back gates.

In the cell 10 illustrated in FIG. 1A, the potential of the wiring 31 can be the potential of the gate of the transistor 21. Furthermore, the potential of the wiring 32 can be the potential of the electrode 13b. Moreover, the potential of the wiring 33 can be the potential of the gate of the transistor 23. In the case where the transistor 21 is an n-channel transistor, for example, the transistor 21 can be brought into an on state when the wiring 31 is set to have a high potential, and the transistor 21 can be brought into an off state when the wiring 31 is set to have a low potential. The same applies to the relationship between the transistor 23 and the wiring 33.

When the transistor 21 is brought into an on state, the node ND1 and the wiring 41 are brought into conduction. Thus, the potential of the wiring 41 can be written to the node ND1. Specifically, electric charge corresponding to the potential of the wiring 41 can be accumulated in the node ND1. According to the above, when the transistor 21 is brought into an on state and a signal is supplied to the wiring 41, data represented by the signal can be written to the cell 10. Thus, the wiring 41 can be referred to as a write line.

When the transistor 21 is brought into an off state after the data is written to the cell 10, the electric charge in the node ND1 is retained. Accordingly, the data can be retained in the cell 10.

The potential of the gate of the transistor 22 is the potential of the node ND1. Thus, when the transistor 23 is brought into an on state while data is retained in the cell 10, current with the amount corresponding to the size of the data flows to the wiring 43 through the transistor 22 and the transistor 23. In this manner, the data retained in the cell 10 can be read. Thus, the wiring 43 can be referred to as a read line.

As described above, the ferroelectric layer 12 is provided between the electrode 13a and the electrode 13b in the capacitor 11. In that case, although the details will be described later, the capacitance value of the capacitor 11 becomes larger than in the case where the ferroelectric layer 12 is not provided and a paraelectric layer is provided between the electrode 13a and the electrode 13b, on the assumption that the ferroelectric layer 12 and the paraelectric layer have the same permittivity. Accordingly, a large amount of electric charge can be accumulated in the capacitor 11. Thus, a change in the potential of the node ND1 due to electric charge leakage from the capacitor 11 becomes small. Hence, data can be retained in the cell 10 for a long time. Accordingly, the frequency of refresh (data rewriting to the cell 10) can be reduced, leading to a reduction in power consumption of the semiconductor device of one embodiment of the present invention.

Here, since the change in the potential of the node ND1 due to electric charge leakage from the capacitor 11 becomes small, the data retained in the cell 10 can be analog data. Alternatively, the data retained in the cell 10 can be multilevel digital data, specifically digital data of three or more levels. It is needless to say that the cell 10 can retain binary digital data.

For the ferroelectric layer 12, barium titanate, lead zirconate titanate, or strontium bismuth tantalate can be used, for example.

The transistor 21 is preferably an OS transistor. OS transistors have characteristics of having an extremely low off-state current. Thus, the use of an OS transistor as the transistor 21 can inhibit leakage of the electric charge accumulated in the node ND1 through the transistor 21. Accordingly, the electric charge can be retained in the node ND1 for a long time; thus, the data in the cell 10 can be retained for a long time. Accordingly, the frequency of refresh can be reduced, leading to a reduction in power consumption of the semiconductor device of one embodiment of the present invention.

Each of the transistor 22 and the transistor 23 can be a transistor containing silicon in its channel formation region (hereinafter referred to as a Si transistor). As the silicon, amorphous silicon (referred to as hydrogenated amorphous silicon in some cases), microcrystalline silicon, polycrystalline silicon, single crystal silicon, or the like can be used, for example.

The use of Si transistors as the transistor 22 and the transistor 23 can increase on-state current of the transistor 22 and the transistor 23. As described above, data retained in the cell 10 can be read when current with the amount corresponding to the level of the potential of the node ND1 flows to the wiring 43 through the transistor 22 and the transistor 23. Accordingly, the use of Si transistors as the transistor 22 and the transistor 23 enables high-speed data reading.

Note that a Si transistor can be used as the transistor 21. Furthermore, OS transistors can be used as the transistor 22 and the transistor 23. OS transistors have characteristics of having a high withstand voltage. Thus, when the transistor 21 to the transistor 23 are OS transistors, a high voltage can be supplied to the node ND1. As a result, a difference between the minimum value and the maximum value of the potential of a signal that can be supplied to the wiring 41 can be large.

FIG. 1B1 to FIG. 1B4 are diagrams illustrating structure examples of the capacitor 11. In the capacitor 11 illustrated in each of FIG. 1B1 to FIG. 1B4, a layer provided between the electrode 13a and the electrode 13b is different from that of the capacitor 11 illustrated in FIG. 1A.

In each of the capacitor 11 illustrated in FIG. 1B1 and the capacitor 11 illustrated in FIG. 1B2, a paraelectric layer 14 is provided in addition to the ferroelectric layer 12. FIG. 1B1 illustrates a structure in which the ferroelectric layer 12 has a region in contact with the electrode 13a and the paraelectric layer 14 has a region in contact with the electrode 13b. Meanwhile, FIG. 1B2 illustrates a structure in which the paraelectric layer 14 has a region in contact with the electrode 13a and the ferroelectric layer 12 has a region in contact with the electrode 13b.

Figure 3:
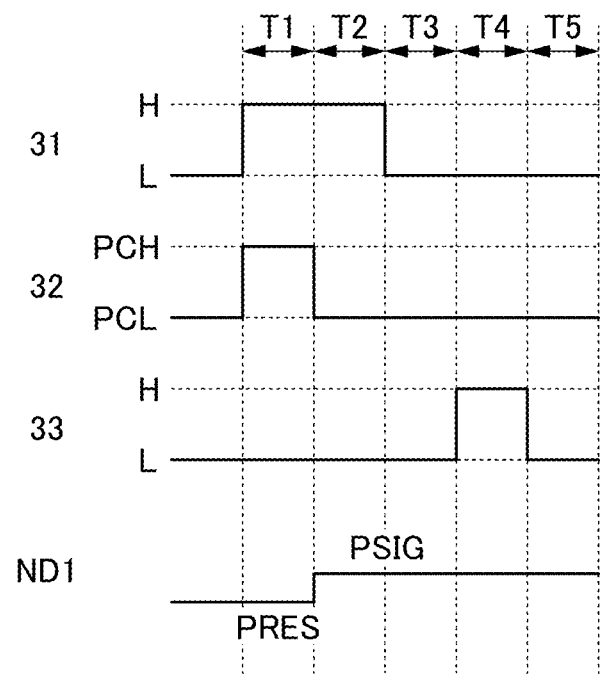
FIG. 3 is a timing chart showing an example of a driving method of a cell.

The capacitor 11 illustrated in FIG. 1B3 is provided with a ferroelectric layer 12a, a ferroelectric layer 12b, and the paraelectric layer 14. The ferroelectric layer 12a has a region in contact with the electrode 13a, and the ferroelectric layer 12b has a region in contact with the electrode 13b. The paraelectric layer 14 is provided between the ferroelectric layer 12a and the ferroelectric layer 12b. A material similar to that for the ferroelectric layer 12 can be used for the ferroelectric layer 12a and the ferroelectric layer 12b.

The capacitor 11 illustrated in FIG. 1B4 is provided with the ferroelectric layer 12, a paraelectric layer 14a, and a paraelectric layer 14b. The paraelectric layer 14a has a region in contact with the electrode 13a, and the paraelectric layer 14b has a region in contact with the electrode 13b. The ferroelectric layer 12 is provided between the paraelectric layer 14a and the paraelectric layer 14b.

A high dielectric constant (high-k) material such as aluminum oxide, hafnium oxide, tantalum oxide, or zirconium oxide can be used for the paraelectric layer 14, the paraelectric layer 14a, and the paraelectric layer 14b, for example. As a result, the capacitor 11 can have a large capacitance value.

The capacitor 11 with a structure in which a plurality of dielectric layers are stacked, as illustrated in FIG. 1B1 to FIG. 1B4, can inhibit leakage of the electric charge accumulated in the capacitor 11. Accordingly, the electric charge can be retained in the node ND1 for a long time; thus, the data in the cell 10 can be retained for a long time. Accordingly, the frequency of refresh can be reduced, leading to a reduction in power consumption of the semiconductor device of one embodiment of the present invention.

<Characteristics of Ferroelectric Layer 12>

The ferroelectric layer 12 has hysteresis characteristics. FIG. 2 is a graph showing the hysteresis characteristics of the ferroelectric layer 12. In FIG. 2, the horizontal axis represents voltage applied to the ferroelectric layer 12, specifically a value obtained by subtracting the potential of the electrode 13b from the potential of the electrode 13a. The vertical axis represents the polarization amount of the ferroelectric layer 12; a positive value indicates that positive electric charge is polarized on the electrode 13b side and negative electric charge is polarized on the electrode 13a side. Meanwhile, a polarization amount with a negative value indicates that positive electric charge is polarized on the electrode 13a side and negative electric charge is polarized on the electrode 13b side. Note that the voltage represented by the horizontal axis of the graph in FIG. 2 may be a value obtained by subtracting the potential of the electrode 13a from the potential of the electrode 13b. Furthermore, the polarization amount represented by the vertical axis of the graph in FIG. 2 may be a positive value when positive electric charge is polarized on the electrode 13a side and negative electric charge is polarized on the electrode 13b side, and may be a negative value when positive electric charge is polarized on the electrode 13b side and negative electric charge is polarized on the electrode 13a side.

As in FIG. 2, the hysteresis characteristics of the ferroelectric layer 12 can be shown by a curve 51 and a curve 52. Voltages at the intersection points of the curve 51 and the curve 52 are voltage VSP1 and voltage VSP2. In FIG. 2, the voltage VSP1 has a negative value and the voltage VSP2 has a positive value. The voltage VSP1 and the voltage VSP2 can be regarded as having different polarities.

After the voltage VSP1 is applied to the ferroelectric layer 12, voltage applied to the ferroelectric layer 12 is increased, whereby the polarization amount of the ferroelectric layer 12 increases along the curve 51. Meanwhile, after the voltage VSP2 is applied to the ferroelectric layer 12, voltage applied to the ferroelectric layer 12 is decreased, whereby the polarization amount of the ferroelectric layer 12 decreases along the curve 52. Thus, the voltage VSP1 and the voltage VSP2 can each be referred to as saturated polarization voltage.

Here, voltage applied to the ferroelectric layer 12 when the polarization amount of the ferroelectric layer 12 is zero in the case where the polarization amount of the ferroelectric layer 12 changes along the curve 51 is voltage $V_1$. Furthermore, voltage applied to the ferroelectric layer 12 when the polarization amount of the ferroelectric layer 12 is zero in the case where the polarization amount of the ferroelectric layer 12 changes along the curve 52 is voltage $V_2$. As shown in FIG. 2, the voltage $V_1$ can have a positive value and the voltage $V_2$ can have a negative value. The value of the voltage $V_1$ and the value of the voltage $V_2$ can be between the values of the voltage VSP1 and the voltage VSP2.

<Example_1 of Driving Method of Cell>

FIG. 3 is a timing chart showing an example of a driving method of the cell 10. In the timing chart in FIG. 3, "H" represents a high potential and "L" represents a low potential. Note that in the timing chart in FIG. 3, changes in potential, signal delay, and the like due to a wiring resistance, the resistance between a drain and a source of a transistor, or the like are not taken into consideration. The same applies to other timing charts.

In Period T1, the potential of the wiring 31 is set to a high potential, the potential of the wiring 32 is set to a potential PCH, and the potential of the wiring 33 is set to a low potential. Since the potential of the wiring 31 is set to a high potential, the transistor 21 is brought into an on state, and since the potential of the wiring 33 is set to a low potential, the transistor 23 is brought into an off state. In this state, the potential of the wiring 41 is set to a potential PRES. Since the transistor 21 is in an on state, the potential of the node ND1 becomes the potential PRES. Accordingly, voltage applied to the ferroelectric layer 12, specifically, a difference between the potential of the electrode 13a and the potential of the electrode 13b, becomes voltage "PRES-PCH". The voltage applied to the ferroelectric layer 12 means the difference between the potential of the electrode 13a and the potential of the electrode 13b also in the following description.

Figure 4A:
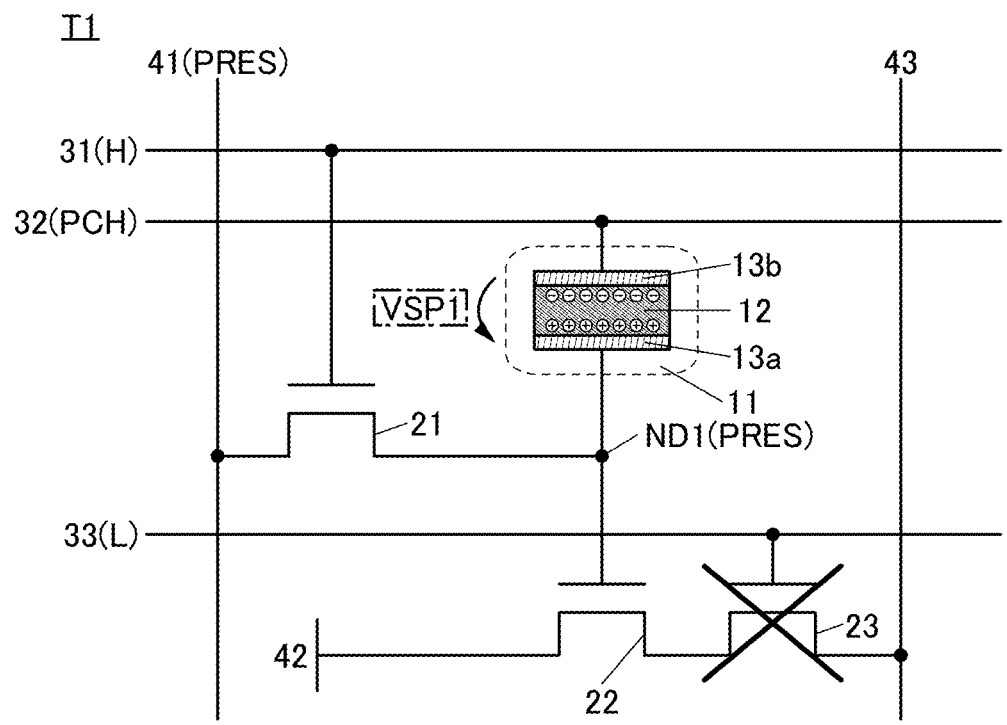
FIG. 4A and FIG. 4B are circuit diagrams illustrating an example of a driving method of a cell.

FIG. 4A is a circuit diagram illustrating a state of the cell 10 in Period T1. In FIG. 4A, a transistor in an off state is marked with x. The same applies to other drawings in some cases.

As illustrated in FIG. 4A, the voltage VSP1 is applied to the ferroelectric layer 12 in Period T1. Specifically, the values of the potential PRES and the potential PCH are set such that the value of the voltage "PRES-PCH" becomes equal to the value of the voltage VSP1. In the case where the voltage VSP1 is −3.3 V, for example, the potential PRES is set to 0 V and the potential PCH is set to 3.3 V.

Note that the voltage applied to the ferroelectric layer 12 is surrounded by a dashed-dotted line in FIG. 4A. The same applies to other drawings in some cases.

In Period T1, the voltage VSP1, which is saturated polarization voltage, is applied to the ferroelectric layer 12, whereby the polarization state of the ferroelectric layer 12 can be reset. Thus, the potential PRES supplied to the node ND1 in Period T1 can be referred to as a reset potential. In addition, the operation in Period T1 can be referred to as reset operation.

In Period T2, the potential of the wiring 32 is set to a potential PCL. In this state, a data signal is supplied to the wiring 41. Specifically, the potential of the wiring 41 is set to a potential PSIG. Since the transistor 21 is in an on state, the potential of the node ND1 becomes the potential PSIG. Accordingly, the voltage applied to the ferroelectric layer 12 becomes voltage "PSIG-PCL". Here, the potential PCL can be a potential lower than the potential PCH.

Figure 4B:
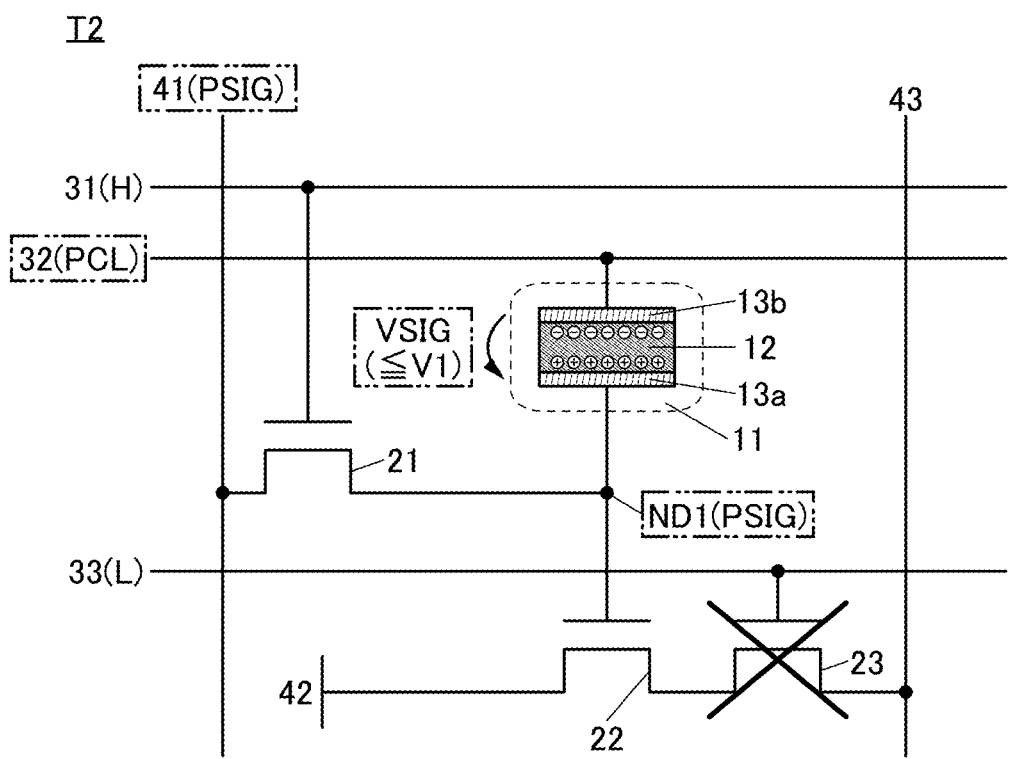

FIG. 4B is a circuit diagram illustrating a state of the cell 10 in Period T2. Note that potentials and voltage changed from those in Period T1 are surrounded by dashed double-dotted lines in FIG. 4B. The same applies to other drawings in some cases.

As denoted in FIG. 4B, the voltage applied to the ferroelectric layer 12 in Period T2 is referred to as voltage VSIG. The potential PSIG supplied to the node ND1 in Period T2 is a potential corresponding to the data signal; thus, the voltage VSIG can be referred to as data voltage. Since the voltage VSP1 is applied to the ferroelectric layer 12 in Period T1, the ferroelectric layer 12 has, in Period T2, a polarization amount as shown by the curve 51 in FIG. 2.

The values of the potential PSIG and the potential PCL are set such that the value of the voltage VSIG becomes higher than the voltage VSP1 and lower than the voltage VSP2. It is particularly preferable that, because the capacitance value of the capacitor 11 has a value corresponding to the slope of the curve 51, specifically, the slope of the tangent of the curve 51, for example, the value of the voltage VSIG be set such that the slope of the curve 51 becomes larger than or equal to a certain value. In that case, the capacitor 11 can have a large capacitance value. Specifically, as described above, the capacitance value of the capacitor 11 becomes larger than in the case where the ferroelectric layer 12 is not provided and a paraelectric layer is provided between the electrode 13a and the electrode 13b, on the assumption that the ferroelectric layer 12 and the paraelectric layer have the same permittivity.

Specifically, the value of the voltage VSIG is preferably set higher than or equal to a voltage at which the slope of the curve 51 becomes larger than or equal to a certain value, and lower than or equal to a voltage at an inflection point of the curve 51, for example. Furthermore, the value of the voltage VSIG is preferably set to a value with which the polarity of the polarization amount of the ferroelectric layer 12 in Period T1 becomes the same as the polarity of the polarization amount of the ferroelectric layer 12 in Period T2. In other words, in the case where the polarity of the ferroelectric layer 12 in Period T1 is negative, specifically, in the case where positive electric charge is polarized on the electrode 13a side and negative electric charge is polarized on the electrode 13b side, the polarity of the ferroelectric layer 12 in Period T2 is also preferably negative. Thus, the voltage VSIG is preferably set lower than or equal to the voltage $V_1$ shown in FIG. 2. In FIG. 4B and the like, the voltage VSIG is assumed to be lower than or equal to the voltage V1.

According to the above, the value of the voltage VSIG is preferably set higher than or equal to a voltage at which the slope of the curve 51 becomes larger than or equal to a certain value, and lower than or equal to the voltage V1, for example. In the case where the voltage V1 is 1.2 V and the potential PCL is 0 V, for example, the potential PSIG is preferably set higher than or equal to 0 V and lower than or equal to 1.2 V. In that case, the voltage VSIG is higher than or equal to 0 V and lower than or equal to 1.2 V.

In the above manner, data can be written to the cell 10 in Period T2.

In Period T3, the potential of the wiring 31 is set to a low potential. Thus, the transistor 21 is brought into an off state, and the electric charge accumulated in the node ND1 is retained. Hence, the potential of the node ND1 is retained as the potential PSIG.

Figure 5A:
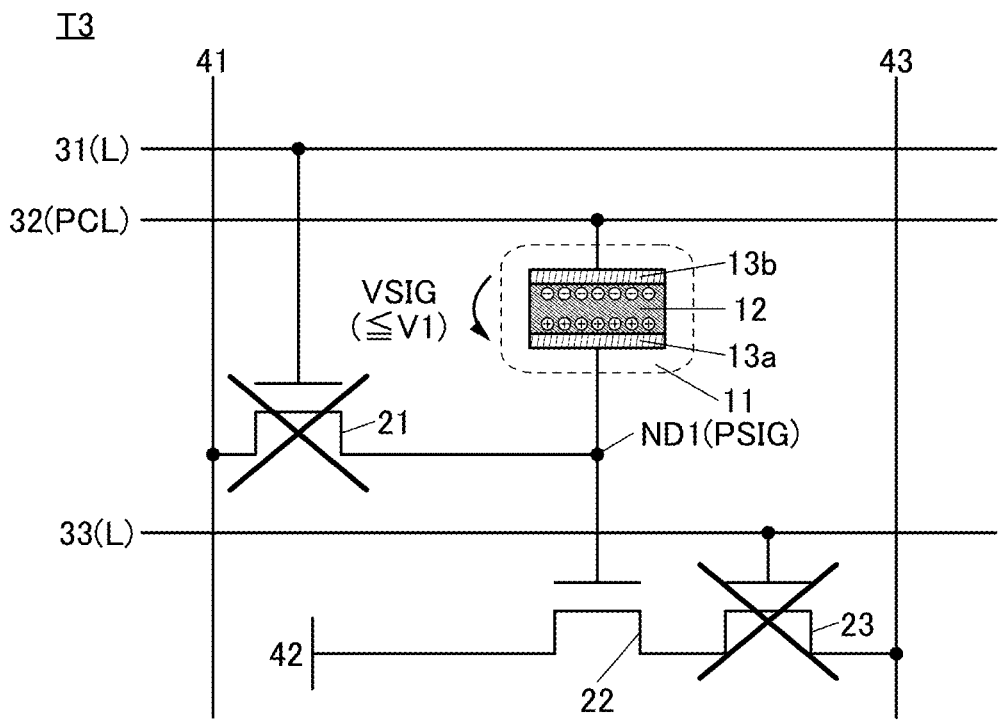
FIG. 5A and FIG. 5B are circuit diagrams illustrating an example of a driving method of a cell.

FIG. 5A is a circuit diagram illustrating a state of the cell 10 in Period T3. As illustrated in FIG. 5A, the voltage applied to the ferroelectric layer 12 in Period T3 is retained as the voltage VSIG.

When data is written to the cell 10 by the method in Period T1 and Period T2, the capacitance value of the capacitor 11 can be large as described above. Accordingly, a large amount of electric charge can be accumulated in the capacitor 11. Thus, a change in the potential of the node ND1 due to electric charge leakage from the capacitor 11 can be small in Period T3. Hence, the data can be retained in the cell 10 for a long time. Accordingly, the frequency of refresh can be reduced, leading to a reduction in power consumption of the semiconductor device of one embodiment of the present invention. As described above, the data retained in the cell 10 can be analog data. Alternatively, the data retained in the cell 10 can be multilevel digital data, specifically digital data of three or more levels. It is needless to say that the cell 10 can retain binary digital data.

In Period T4, the potential of the wiring 33 is set to a high potential. Accordingly, the transistor 23 is brought into an on state, and current with the amount corresponding to the level of the potential PSIG of the node ND1 flows to the wiring 43 through the transistor 22 and the transistor 23. In this manner, the data retained in the cell 10 can be read.

Figure 5B:
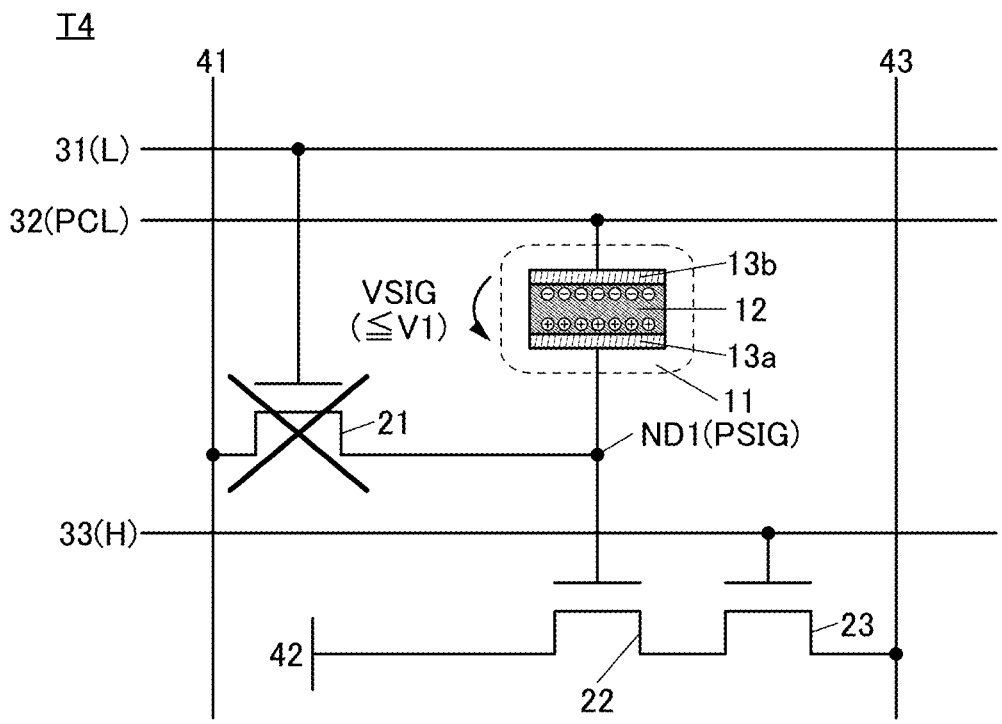

FIG. 5B is a circuit diagram illustrating a state of the cell 10 in Period T4. The transistor 23 is brought into an on state, and the data retained in the cell 10 is read through the wiring 43.

In Period T5, the potential of the wiring 33 is set to a low potential. Accordingly, the transistor 23 is brought into an off state, and reading of the data retained in the cell 10 is terminated. Since the potential of the node ND1 is not changed by the data reading, this reading is regarded as non-destructive reading.

The above is an example of the driving method of the cell 10.

<Example_2 of Driving Method of Cell>

Figure 6:
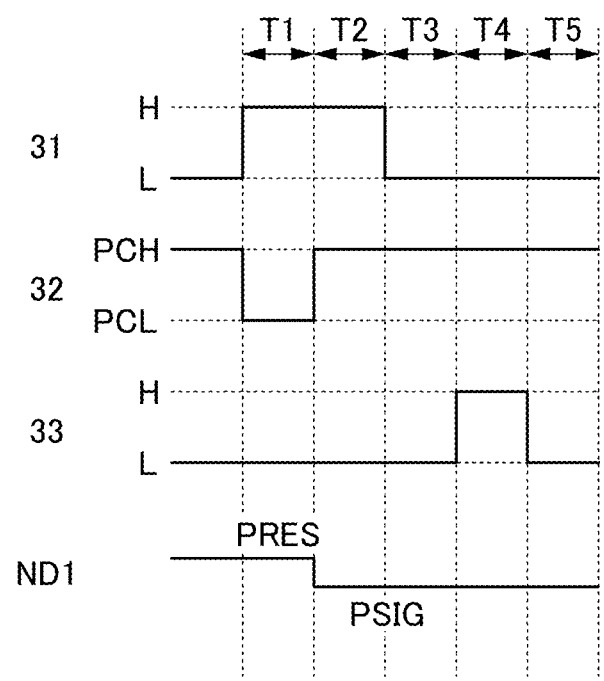
FIG. 6 is a timing chart showing an example of a driving method of a cell.
Figure 7A:
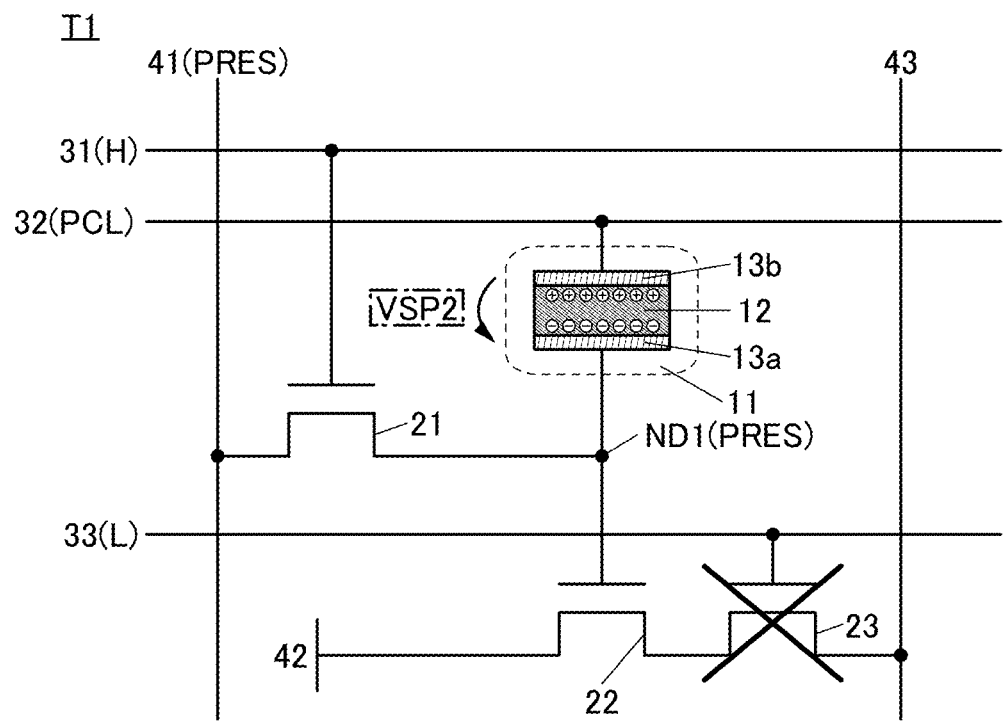
FIG. 7A and FIG. 7B are circuit diagrams illustrating an example of a driving method of a cell.
Figure 7B:
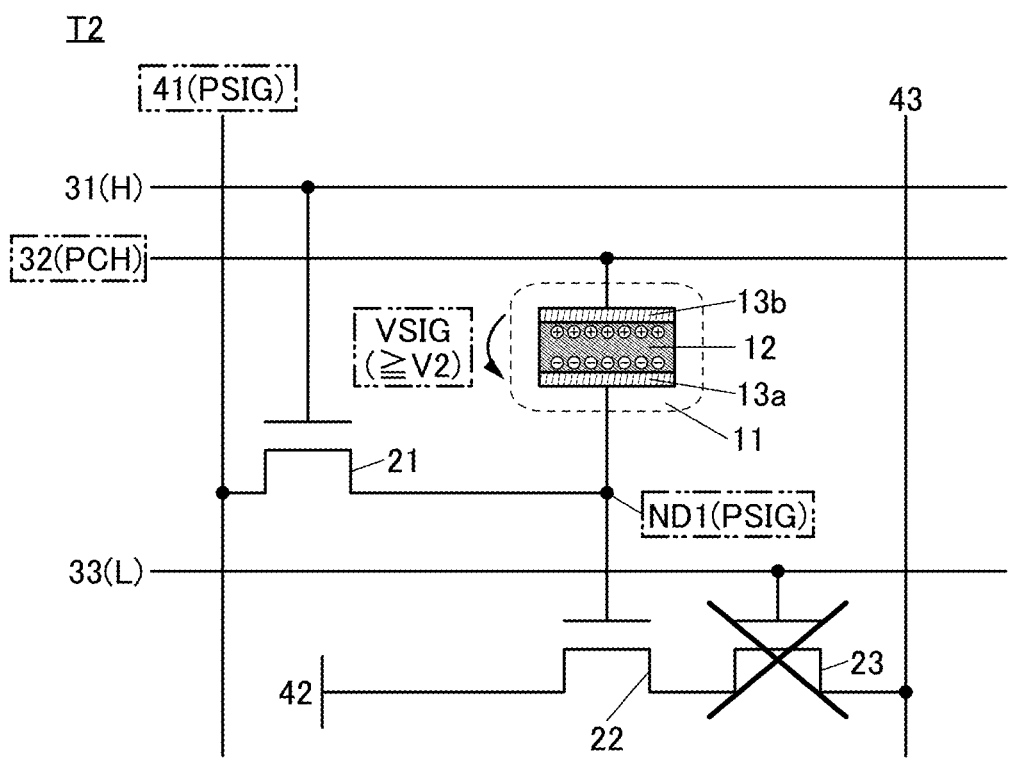
Figure 8A:
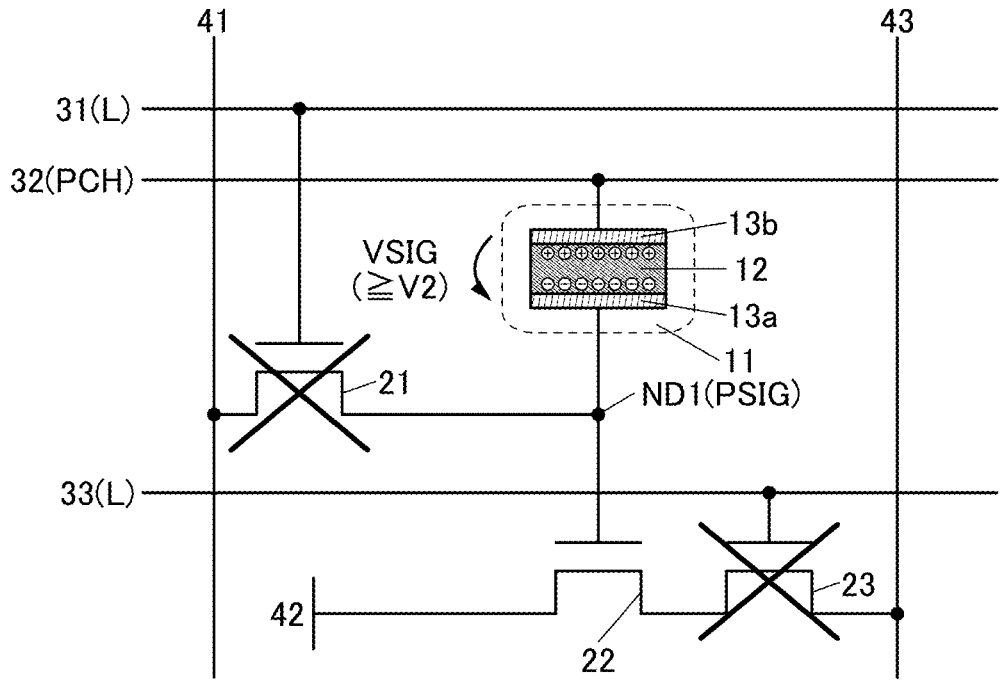
FIG. 8A and FIG. 8B are circuit diagrams illustrating an example of a driving method of a cell.
Figure 8B:
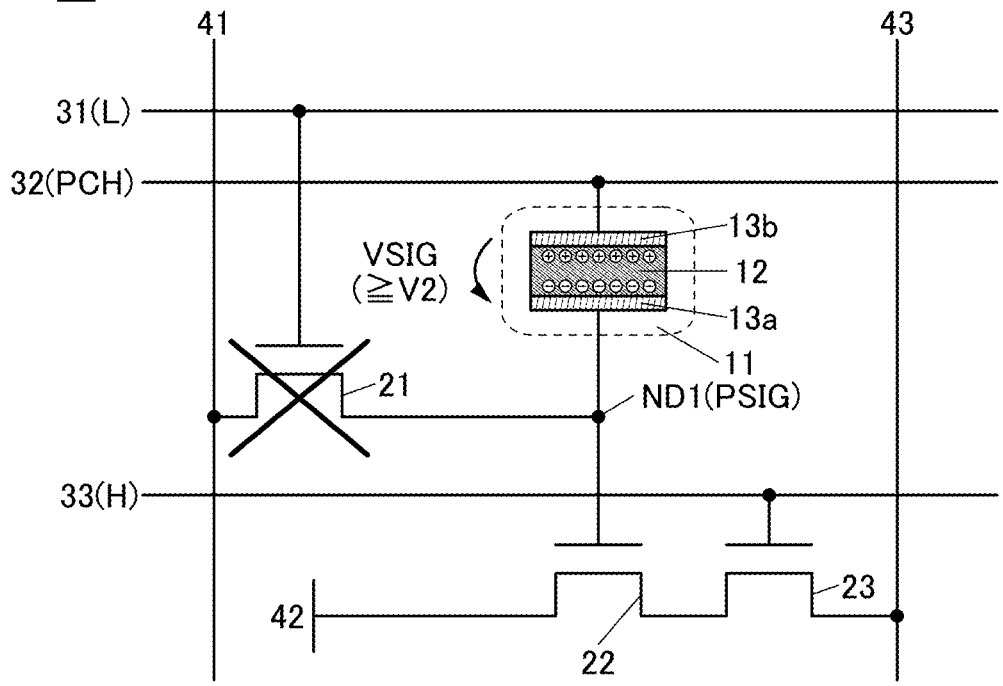

Although the voltage VSP1 is applied to the ferroelectric layer 12 in Period T1 in the driving method shown in FIG. 3 to FIG. 5, the voltage VSP2, which is saturated polarization voltage whose polarity is different from that of the voltage VSP1, may be applied to the ferroelectric layer 12 in Period T1. FIG. 6 is a timing chart showing an example of the driving method of the cell 10 of the case where the voltage VSP2 is applied to the ferroelectric layer 12 in Period T1. FIG. 7A, FIG. 7B, FIG. 8A, and FIG. 8B are circuit diagrams illustrating states of the cell 10 in Period T1 to Period T4 shown in FIG. 6.

As shown in FIG. 6, the potential of the wiring 32 can be set to the potential PCL in Period T1 and to the potential PCH in Period T2 to Period T5. Although the potential PRES is lower than the potential PSIG in the driving method shown in FIG. 3, for example, the potential PRES can be higher than the potential PSIG in the driving method shown in FIG. 6.

In the case where the cell 10 is driven by the method shown in FIG. 6, the values of the potential PRES and the potential PCL are set such that the value of voltage "PRES-PCL" becomes equal to the value of the voltage VSP2. In the case where the voltage VSP2 is 3.3 V, for example, the potential PRES is set to 3.3 V and the potential PCL is set to 0 V.

In the case where the cell 10 is driven by the method shown in FIG. 6, the voltage applied to the ferroelectric layer 12 in Period T2 becomes voltage "PSIG-PCH". Since the voltage VSP2 is applied to the ferroelectric layer 12 in Period T1, the ferroelectric layer 12 has, in Period T2, a polarization amount as shown by the curve 52 in FIG. 2.

In the case where the cell 10 is driven by the method shown in FIG. 6, the value of the voltage VSIG is preferably set higher than or equal to the voltage $V_2$ shown in FIG. 2 and lower than or equal to a voltage at which the slope of the curve 52, specifically, the slope of the tangent of the curve 52, for example, becomes larger than or equal to a certain value, for example. In the case where the voltage $V_2$ is −1.2 V and the potential PCH is 3.3 V, for example, the potential PSIG is preferably higher than or equal to 2.1 V and lower than or equal to 3.3 V. In that case, the voltage VSIG is higher than or equal to −1.2 V and lower than or equal to 0 V. Note that in FIG. 7B and the like, the voltage VSIG is assumed to be higher than or equal to the voltage $V_2$.

<Example_3 of Driving Method of Cell>

Figure 9:
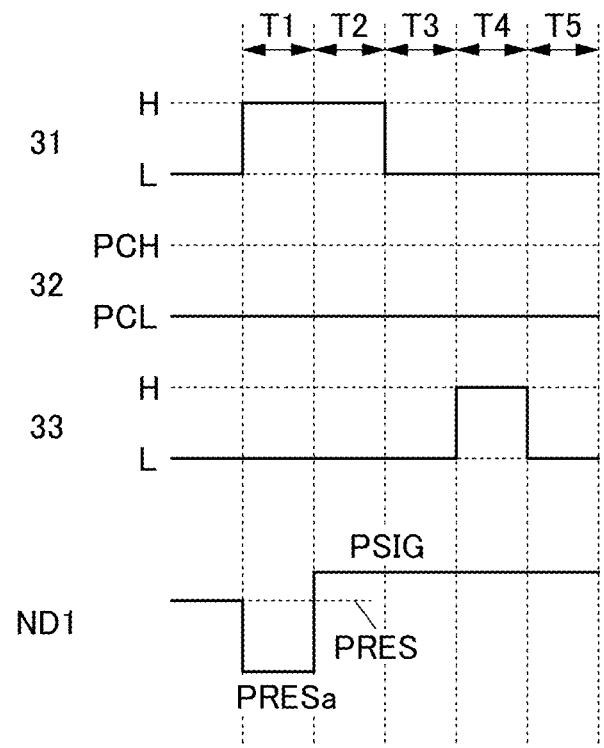
FIG. 9 is a timing chart showing an example of a driving method of a cell.

Although the potential of the wiring 32 is changed in the driving method shown in FIG. 3 to FIG. 5, the potential of the wiring 32 may be a constant potential. FIG. 9 is a timing chart showing an example of the driving method of the cell 10 of the case where the potential PCL is supplied as a constant potential to the wiring 32 in Period T1 to Period T5.

In the case where the cell 10 is driven by the method shown in FIG. 9, the potential of the node ND1 in Period T1 is set to a potential PRESa. The potential PRESa can be a potential lower than the potential PRES shown in FIG. 3 and the like. In the case where the voltage VSP1 is −3.3 V and the potential PCL is 0 V, for example, the potential PRESa can be set to −3.3 V. When the voltage VSP1 is set to −3.3 V, for example, the potential PRES can be set to 0 V as described above. Thus, assuming that the voltage VSP1 has an equal value, the potential PRESa can be set lower than the potential PRES.

In the case where the cell 10 is driven by the method shown in FIG. 9, an OS transistor is preferably used as the transistor 21. As described above, OS transistors have characteristics of having high withstand voltage. Thus, when an OS transistor is used as the transistor 21, the potential PRESa can be low. Similarly, an OS transistor is preferably used also as the transistor 22. Furthermore, an OS transistor may be used as the transistor 23.

<Configuration Example_2 of Cell>

Figure 10A:
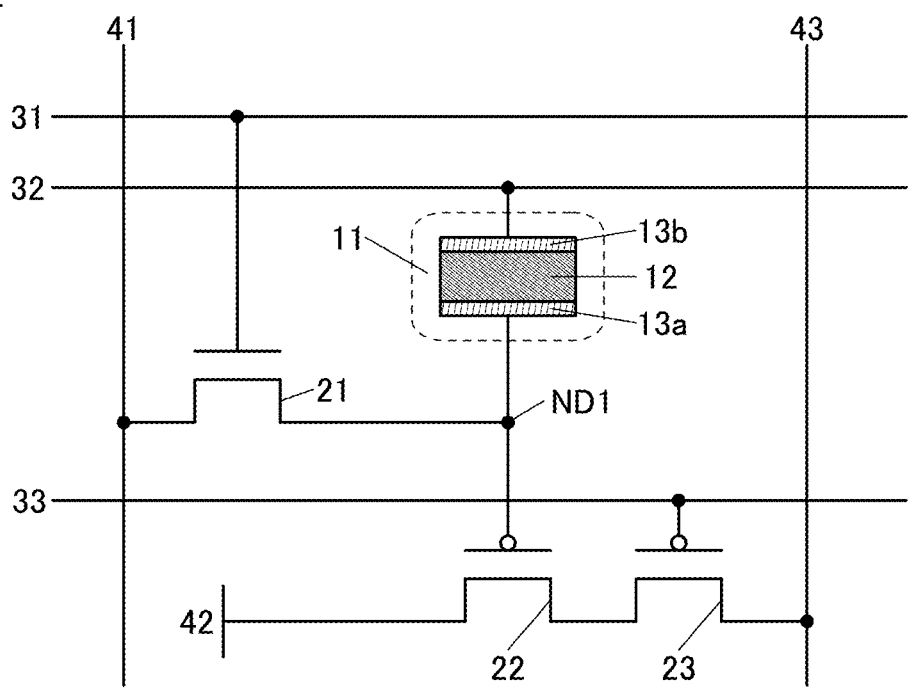
FIG. 10A and FIG. 10B are circuit diagrams illustrating configuration examples of a cell.

In the cell 10 illustrated in FIG. 1A, all of the transistor 21 to the transistor 23 are n-channel transistors; however, one embodiment of the present invention is not limited thereto. FIG. 10A is a circuit diagram illustrating a configuration example of the cell 10 of the case where the transistor 22 and the transistor 23 are p-channel transistors. In the cell 10 illustrated in FIG. 10A, the transistor 21 can be, for example, an OS transistor or a Si transistor. The transistor 22 and the transistor 23 can be Si transistors.

Figure 10B:
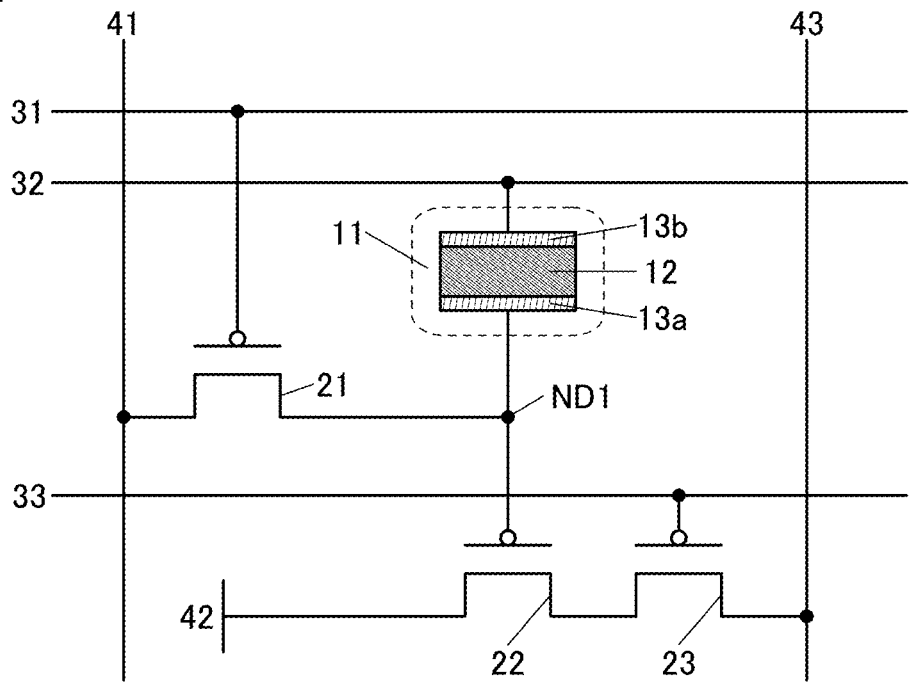

FIG. 10B is a circuit diagram illustrating a configuration example of the cell 10 of the case where all of the transistor 21 to the transistor 23 are p-channel transistor. In the cell 10 illustrated in FIG. 10B, the transistor 21 to the transistor 23 can be Si transistors, for example.

The driving methods shown in FIG. 3 to FIG. 9 can be used even when the cell 10 has the configuration illustrated in FIG. 10A or FIG. 10B, by changing the magnitude relationship of the potentials as appropriate, for example.

Figure 11A:
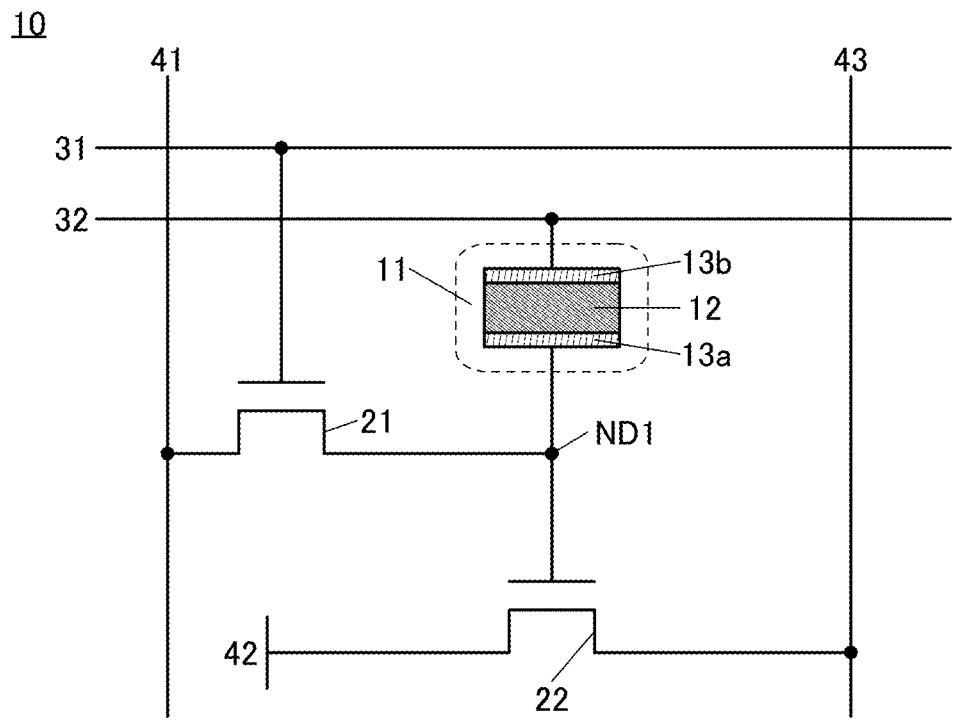
FIG. 11A and FIG. 11B are circuit diagrams illustrating configuration examples of a cell.

Although the cell 10 illustrated in FIG. 1A includes the transistor 23, the transistor 23 is not necessary provided. FIG. 11A is a circuit diagram illustrating a configuration example of the cell 10 in which the transistor 23 is omitted. In the cell 10 with the configuration illustrated in FIG. 11A, the one of the source and the drain of the transistor 22 is electrically connected to the wiring 43. In the case of driving the cell 10 illustrated in FIG. 11A, data retained in the cell 10 can be read through the wiring 43 without the operation in Period T4 shown in FIG. 3 and the like.

Although the wiring 41 is a wiring functioning as a write line and the wiring 43 is a wiring functioning as a read line in the cell 10 illustrated in FIG. 11A and the like, a common wiring may be used as both a write line and a read line. The cell 10 illustrated in FIG. 11B is different from the cell 10 illustrated in FIG. 11A in that a wiring 44 is used as both a wiring functioning as a write line and a wiring functioning as a read line.

Figure 11B:
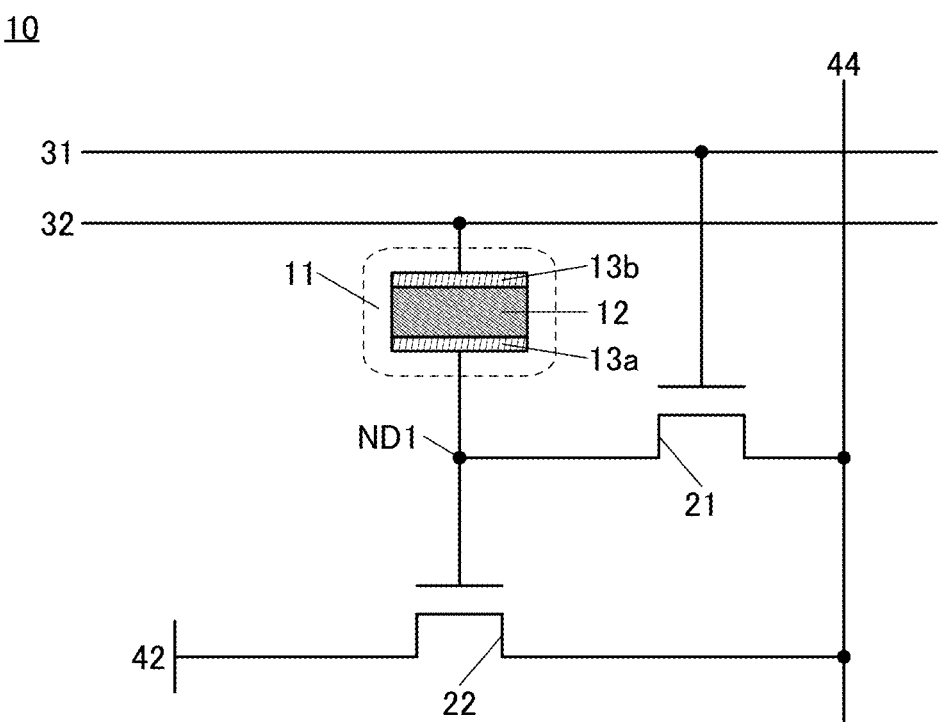

In the cell 10 illustrated in FIG. 11B, the other of the source and the drain of the transistor 21 and the one of the source and the drain of the transistor 22 are electrically connected to the wiring 44. When one wiring is used as both a write line and a read line as described above, the number of wirings provided in the semiconductor device including the cell 10 can be reduced. Accordingly, the semiconductor device can be reduced in size.

Figure 12A:
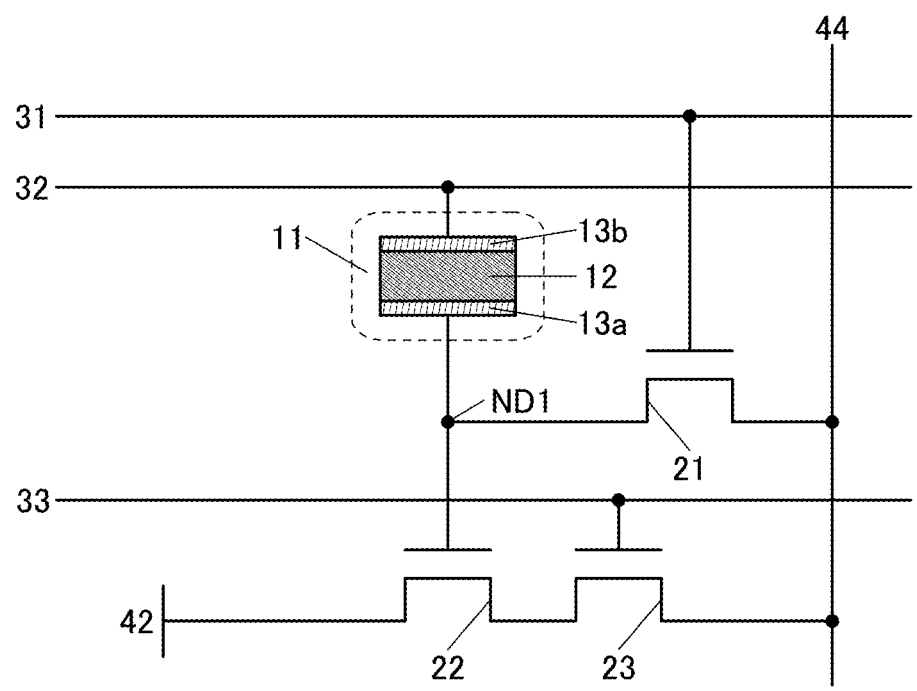
FIG. 12A and FIG. 12B are circuit diagrams illustrating configuration examples of a cell.

FIG. 12A is a modification example of the cell 10 illustrated in FIG. 1A, and is different from the cell 10 illustrated in FIG. 1A in that the wiring 44 is used as both a wiring functioning as a write line and a wiring functioning as a read line. In the cell 10 with the configuration illustrated in FIG. 12A, the other of the source and the drain of the transistor 21 and the other of the source and the drain of the transistor 23 are electrically connected to the wiring 44.

Figure 12B:
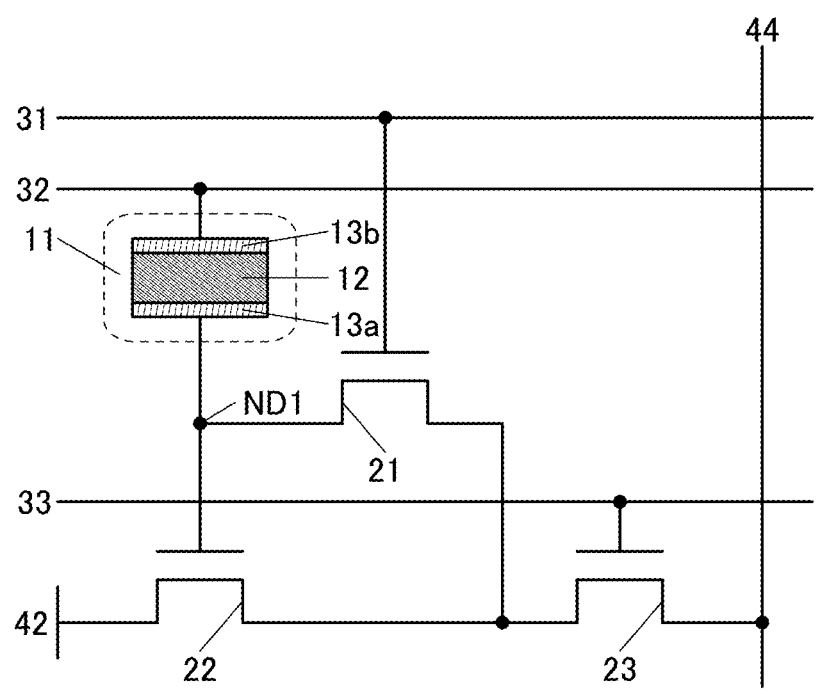

FIG. 12B is a modification example of the cell 10 illustrated in FIG. 12A, and is different from the cell 10 illustrated in FIG. 12A in that the other of the source and the drain of the transistor 21 is electrically connected to the one of the source and the drain of the transistor 22 and the one of the source and the drain of the transistor 23.

In the case where the cell 10 illustrated in FIG. 12B is driven by the method shown in FIG. 3 and the like, a high potential is supplied to the wiring 31 and to the wiring 33 in Period T1 and Period T2. As a result, the transistor 21 and the transistor 23 are brought into an on state. Accordingly, electrical continuity is established between the wiring 44 and the node ND1, so that the potential PRES, the potential PSIG, and the like can be supplied to the node ND1.

The cell 10 with the configuration illustrated in FIG. 12B can inhibit generation of parasitic capacitance between the gate of the transistor 21 and the wiring 44. Thus, generation of noise in data written to the cell 10 can be inhibited.
<Configuration Example_1 of Semiconductor Device>

Figure 13:
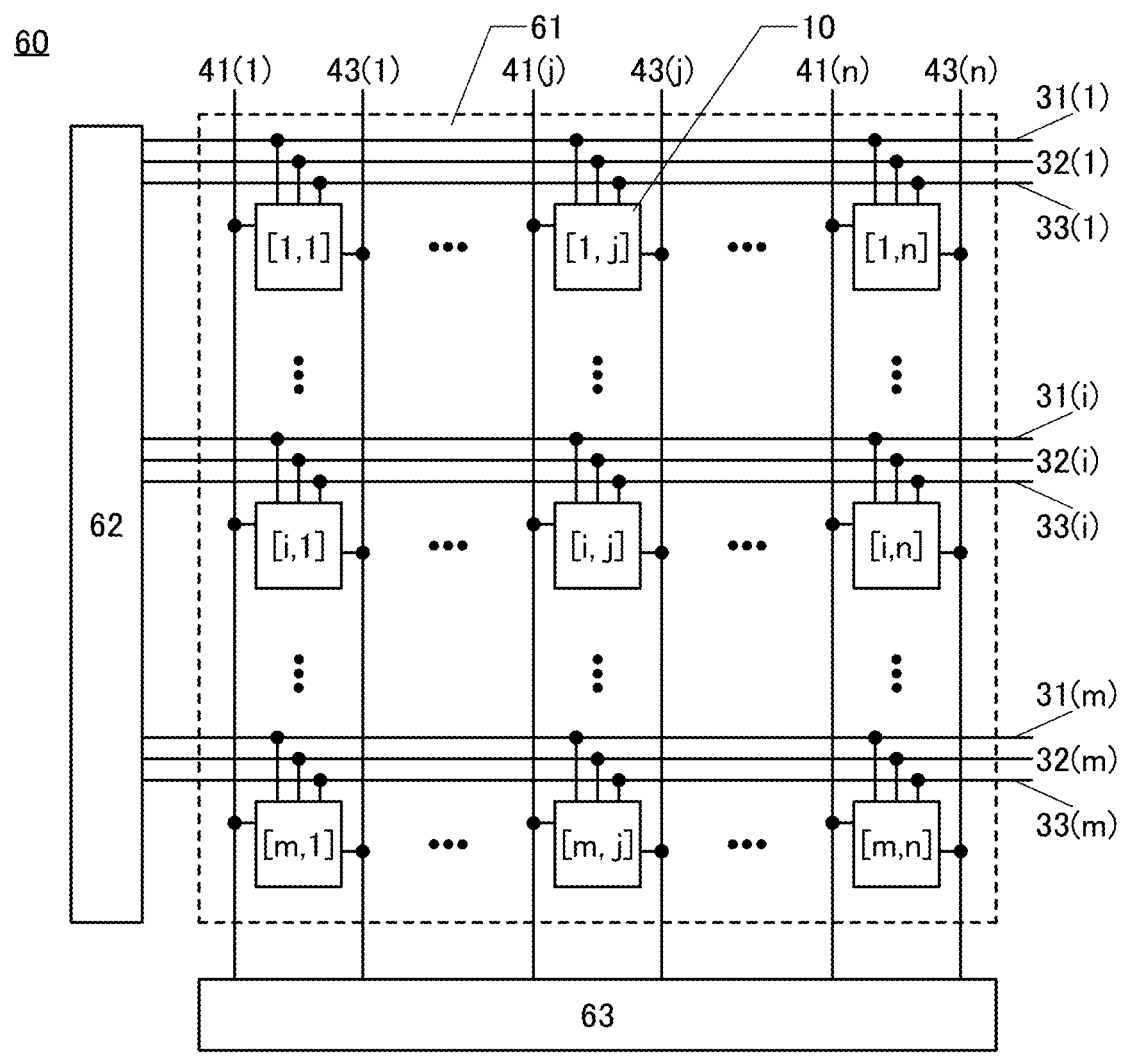
FIG. 13 is a block diagram illustrating a configuration example of a semiconductor device.

FIG. 13 is a block diagram illustrating a configuration example of a semiconductor device 60 including the cell 10. In the semiconductor device 60, cells 10 in m rows and n columns (m and n are each an integer of two or more) constitute a cell array 61. The semiconductor device 60 includes a circuit 62 and a circuit 63.

In FIG. 13, [1,1], [i,1], [m,1], [1,j], [i,j], [m,j], [1,n], [i,n], and [m,n] (i is an integer greater than or equal to one and less than or equal to m, and j is an integer greater than or equal to one and less than or equal to n) are the addresses of the cells 10. For example, the cell 10 represented by [i,j] is the cell 10 in the i-th row and the j-th column. In the following description, for example, the cell 10 whose address is [i,j] is referred to as a cell 10[i,j].

The cells 10 are electrically connected to the circuit 62 via wirings 31, wirings 32, and wirings 33, and electrically connected to the circuit 63 via wirings 41 and wirings 43. For example, the cell 10[i,j] is electrically connected to the circuit 62 via a wiring 31(i), a wiring 32(i), and a wiring 33(i), and electrically connected to the circuit 63 via a wiring 41(j) and a wiring 43(j).

The circuit 62 has a function of generating potentials required for driving the cells 10 and supplying the potentials to the wirings 31, the wirings 32, or the wirings 33. Owing to the circuit 62, writing of data to the cells 10 and reading of data retained in the cells 10 can be performed sequentially from the cells 10 in the first row to the cells 10 in the m-th row. In the case where a constant potential is supplied to the wirings 32 as shown in FIG. 9, the wirings 32 are not necessarily electrically connected to the circuit 62.

Here, the reset operation which is operation performed in Period T1 can be performed simultaneously on all of the cells 10, for example. In the case where each of the cells 10 is driven by the method shown in FIG. 9, for example, the potential PRESa, which is the potential of the corresponding wiring 41 in Period T1, is low. For example, the potential PRESa is a negative value. Thus, in the case of bringing the transistor 21 into an off state, the potential of the gate of the transistor 21 needs to be low; otherwise, the difference between the potential of the gate of the transistor 21 and the potential PRESa of the source of the transistor 21 might become higher than or equal to the threshold voltage of the transistor 21, which might disable the transistor 21 from being brought into an off state. In the case where the potential PRESa is set to −3.3 V, for example, the transistor cannot be brought into an off state in some cases even when a potential of 0 V is supplied to the gate of the transistor 21 as a low potential. In the case where the reset operation which is operation performed in Period T1 is sequentially performed on the cells 10 row by row, data reading operation is performed on cells 10 which are not under the reset operation, in some cases. When the transistor 21 is not in an off state in each of the cells 10 under data reading operation, the potential of the corresponding node ND1 becomes the potential PRESa, and data reading is not performed accurately, in some cases. Accordingly, the reset operation which is operation performed in Period T1 is preferably performed simultaneously on all of the cells 10 in the case where the cells 10 are driven by the method shown in FIG. 9, for example.

The circuit 63 has a function of writing data to the cells 10 and a function of reading data from the cells 10. The circuit 63 has a function of generating the potential PRES, the potential PSIG, and the like and supplying the potentials to the cells 10 through the wirings 41, for example. Furthermore, the circuit 63 has a function of reading data from the cells 10 on the basis of the potentials of the wirings 43.

In the case where the cells 10 each have the configuration illustrated in FIG. 11B, FIG. 12A, or FIG. 12B, the circuit 63 is electrically connected to the cells 10 via wirings 44. For example, the cell 10[i,j] can be electrically connected to the circuit 63 via a wiring 44(j).

Although all of potentials supplied to the wirings 31, potentials supplied to the wirings 32, and potentials supplied to the wirings 33 are generated by the circuit 62 in the semiconductor device 60 illustrated in FIG. 13, the potentials may be generated by different circuits. For example, a circuit for generating the potentials supplied to the wirings 32 and a circuit for generating the potentials supplied to the wiring 31 and the potentials supplied to the wirings 33 may be different from each other. Furthermore, although the circuit 63 is described as having both of a function of writing data to the cells 10 and a function of reading data from the cells 10, a circuit having a function of writing data to the cells 10 and a circuit having a function of reading data from the cells 10 may be different from each other.

At least part of the structure, method, and the like described in this embodiment can be implemented in appropriate combination with other embodiments, an example, or the like described in this specification.

Embodiment 2

In this embodiment, a semiconductor device of one embodiment of the present invention and a driving method thereof will be described. Specifically, a semiconductor device having a function of performing an arithmetic operation of a neural network will be described.

<Hierarchical Neural Network>

Figure 14A:
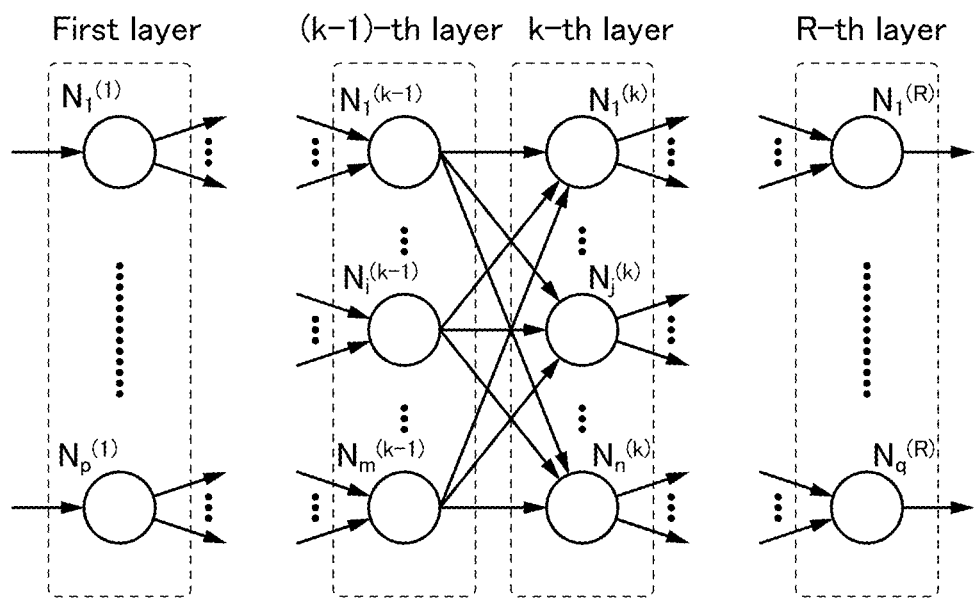
FIG. 14A and FIG. 14B are diagrams illustrating a hierarchical neural network.

First, a hierarchical neural network is described. A hierarchical neural network includes one input layer, one or a plurality of intermediate layers (hidden layers), and one output layer, for example, and is configured with a total of at least three layers. A hierarchical neural network 100 illustrated in FIG. 14A shows one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 14A illustrates the (k−1)-th layer and the k-th layer (here, k is an integer greater than or equal to 3 and less than or equal to R−1) as the intermediate layers, and does not illustrate the other intermediate layers.

Each of the layers of the neural network 100 includes one or a plurality of neurons. In FIG. 14A, the first layer includes a neuron $N_1^{(1)}$ to a neuron $N_p^{(1)}$ (here, p is an integer greater than or equal to 1); the (k−1)-th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

Note that FIG. 14A illustrates a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$; the other neurons are not illustrated.

Next, signal transmission from a neuron in one layer to a neuron in the subsequent layer and signals input to and output from the neurons are described. Note that description here is made focusing on the neuron $N_j^{(k)}$ in the k-th layer.

Figure 14B:
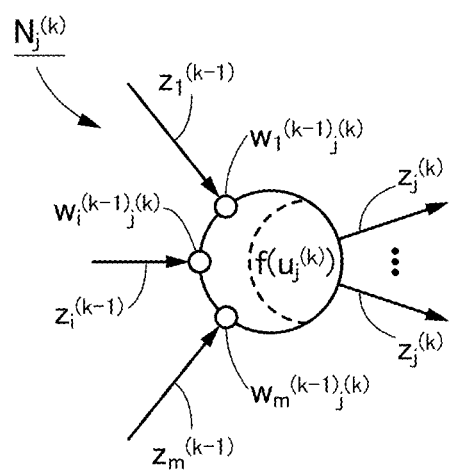

FIG. 14B illustrates the neuron $N_j^{(k)}$ in the k-th layer, signals input to the neuron $N_j^{(k)}$, and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)-th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)-th layer (not illustrated).

The efficiency of transmitting a signal input from a neuron in one layer to a neuron in the subsequent layer depends on the connection strength (hereinafter referred to as a weight coefficient) of the synapse that connects the neurons to each other. In the neural network 100, a signal output from a neuron in one layer is multiplied by the corresponding weight coefficient and then is input to a neuron in the subsequent layer. When i is an integer greater than or equal to 1 and less than or equal to m and the weight coefficient of the synapse between the neuron $N_i^{(k-1)}$ in the (k−1)-th layer and the neuron $N_j^{(k)}$ in the k-th layer is $w_i^{(k-1)}{}_j^{(k)}$, a signal input to the neuron $N_j^{(k)}$ in the k-th layer can be expressed by Formula (1).

[Formula 1]

$$w_i^{(k-1)}{}_j^{(k)} \cdot z_i^{(k-1)} \qquad (1)$$

That is, when the signals are transmitted from the neuron $N_1^{(k-1)}$ to the neuron $N_m^{(k-1)}$ in the (k−1)-th layer to the neuron $N_j^{(k)}$ in the k-th layer, the signals $z_1^{(k-1)}$ to $z_m^{(k-1)}$ are multiplied by the corresponding weight coefficients ($w_1^{(k-1)}{}_j^{(k)}$ to $w_m^{(k-1)}{}_j^{(k)}$). Then, $w_1^{(k-1)}{}_j^{(k)} \cdot z_1^{(k-1)}$ to $w_m^{(k-1)}{}_j^{(k)} z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (2).

[Formula 2]

$$u_j^{(k)} = \sum_{i=1}^{m} w_i^{(k-1)}{}_j^{(k)} \cdot z_i^{(k-1)} \qquad (2)$$

In addition, a bias may be added to the product-sum result of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ of the neurons. When the bias is denoted by b, Formula (2) can be rewritten as the following formula.

[Formula 3]

$$u_j^{(k)} = \sum_{i=1}^{m} w_i^{(k-1)}{}_j^{(k)} \cdot z_i^{(k-1)} + b \qquad (3)$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 4]

$$z_j^{(k)} = f(u_j^{(k)}) \qquad (4)$$

A function $f(u_j^{(k)})$ is an activation function in a hierarchical neural network, and a step function, a linear ramp function, a sigmoid function, or the like can be used. Note that the activation function may be the same or different among all neurons. In addition, the neuron activation function may be the same or different between the layers.

Signals output from the neurons in the layers, the weight coefficients w, or the bias b may be an analog value or a digital value. For example, a binary or ternary digital value may be used. A value having a larger number of bits may be used. In the case of an analog value, for example, a linear ramp function, a sigmoid function, or the like is used as an activation function. In the case of a binary digital value, for example, a step function with an output of −1 or 1 or an output of 0 or 1 is used. Alternatively, the neurons in the layers may each output a ternary or higher-level signal; in this case, a step function with an output of three or more values, e.g., an output of −1, 0, or 1 or an output of 0, 1, or 2, is used as an activation function. Furthermore, as an activation function for outputting five or more levels, a step function with an output of −2, −1, 0, 1, or 2 may be used, for example. The use of a digital value as at least one of the signals output from the neurons in the layers, the weight coefficient w, and the bias b enables a reduction of the circuit scale, a reduction of power consumption, or an increase of arithmetic operation speed, for example. Furthermore, the use of an analog value as at least one of the signals output from the neurons in the layers, the weight coefficient w, and the bias b can improve the arithmetic operation accuracy.

The neural network 100 performs operation in which by input of an input signal to the first layer (the input layer), output signals are sequentially generated in the layers from the first layer (the input layer) to the last layer (the output layer) according to Formula (1), Formula (2) (or Formula (3)), and Formula (4) on the basis of the signals input from the previous layers, and the output signals are output to the subsequent layers. The signal output from the last layer (the output layer) corresponds to the calculation results of the neural network 100.

<Configuration Example of Arithmetic Circuit>

Described here is an example of an arithmetic circuit that is capable of performing the arithmetic operation of Formula (2) (or Formula (3)) and Formula (4) in the above-described neural network 100. Note that in the arithmetic circuit, for example, a weight coefficient of a synapse circuit of the neural network 100 has two levels (e.g., a combination of "−1" and "+1" or a combination of "0" and "+1"), three levels (e.g., a combination of "−1", "0", and "1"), or multiple levels of four or more levels (e.g., in the case of five levels, a combination of "−2", "−1", "0", "1", and "2"), and a neuron activation function is a function that outputs two levels (e.g., a combination of "−1" and "+1" or a combination of 0" and "+1"), three levels (e.g., a combination of "−1", "0", and "1"), or multiple levels of four or more levels (e.g., in the case of four levels, a combination of "0", "1", "2", and "3"). In this specification and the like, a weight coefficient is referred to as first data, and the value of a signal (sometimes referred to as an arithmetic value) input from a neuron in one layer to a neuron in the subsequent layer is referred to as second data, in some cases. Note that the arithmetic value and the weight coefficient of the synapse circuit of the neural network 100 are not limited to digital values, and an analog value can be used as at least one of them.

Figure 15A:
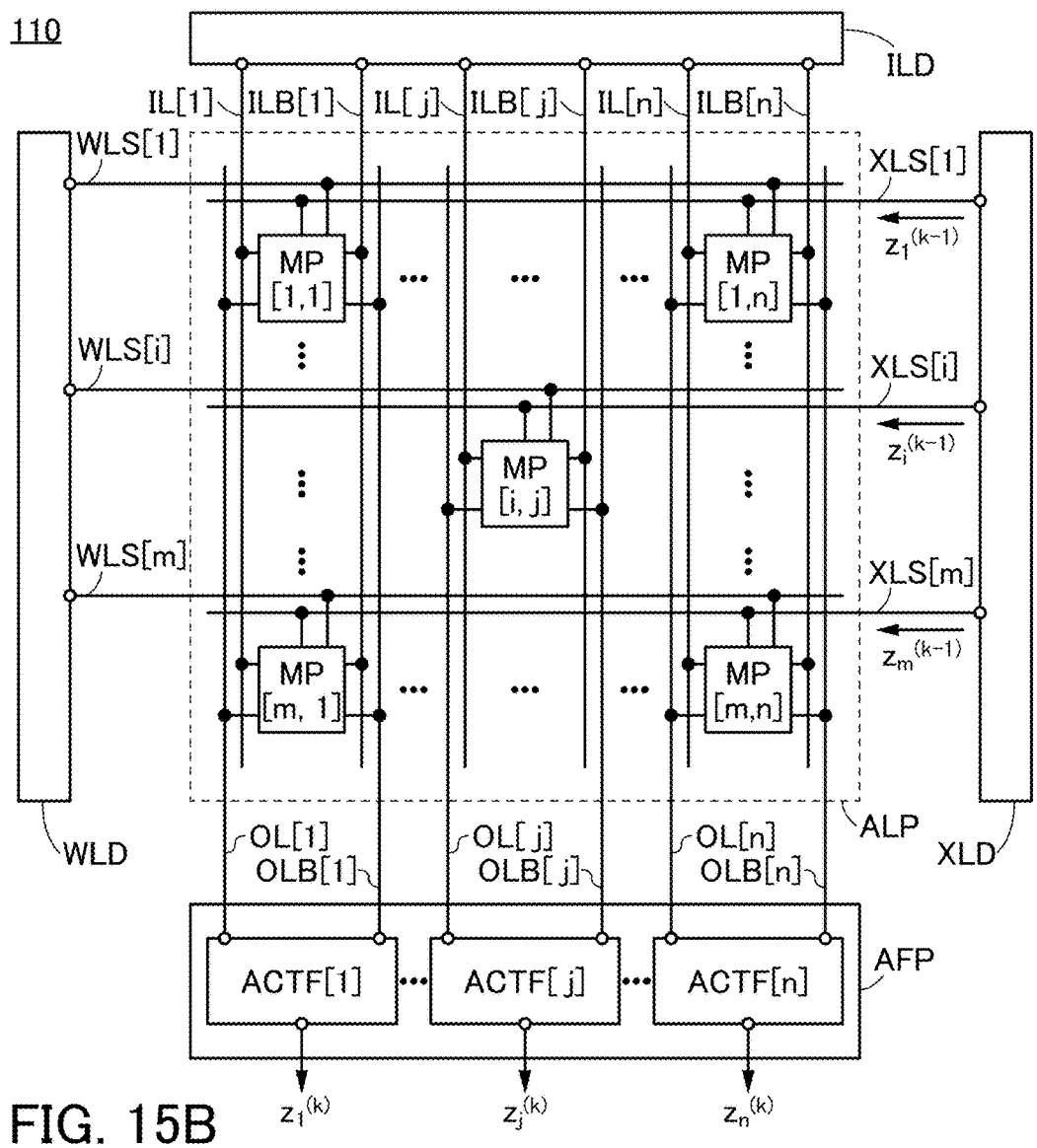
FIG. 15A is a block diagram illustrating a configuration example of a semiconductor device.

An arithmetic circuit 110 illustrated in FIG. 15A is a semiconductor device including an array portion ALP, a circuit ILD, a circuit WLD, a circuit XLD, and a circuit AFP, for example. The arithmetic circuit 110 is a circuit that processes the signals $z_1^{(k-1)}$ to $z_m^{(k-1)}$ input to the neuron $N_1^{(k)}$ to the neuron $N_n^{(k)}$ in the k-th layer in FIG. 14A and FIG. 14B and generates signals $z_1^{(k)}$ to $z_n^{(k)}$ respectively output from the neuron $N_1^{(k)}$ to the neuron $N_n^{(k)}$.

Note that the whole or part of the arithmetic circuit 110 may be used for applications other than a neural network and AI. For example, in the case where product-sum operation processing or matrix operation processing is performed in calculation for graphics, calculation for scientific calculation, or the like, the processing may be performed using the whole or part of the arithmetic circuit 110. In other words, the whole or part of the arithmetic circuit 110 may be used for not only calculation for AI but also general calculation.

The circuit ILD is electrically connected to a wiring IL[1] to a wiring IL[n] and a wiring ILB[1] to a wiring ILB[n], for example. The circuit WLD is electrically connected to a wiring WLS[1] to a wiring WLS[m], for example. The circuit XLD is electrically connected to a wiring XLS[1] to a wiring XLS[m], for example. The circuit AFP is electrically connected to a wiring OL[1] to a wiring OL[n] and a wiring OLB[1] to a wiring OLB[n], for example.

<<Array Portion ALP>>

The array portion ALP includes m×n circuits MP, for example. The circuits MP are arranged in a matrix of m rows and n columns in the array portion ALP, for example. Note that in FIG. 15A, the circuit MP positioned in the i-th row and the j-th column (here, i is an integer greater than or equal to 1 and less than or equal to m, and j is an integer greater than or equal to 1 and less than or equal to n) is denoted by a circuit MP[i,j]. Note that FIG. 15A illustrates only the circuit MP[1,1], the circuit MP[m,1], the circuit MPP[i,j], the circuit MP[1,n], and the circuit MP[m,n] and does not illustrate the other circuits MP.

The circuit MP[i,j] is electrically connected to the wiring IL[j], the wiring ILB[U], the wiring WLS[i], the wiring XLS[i], the wiring OL[j], and the wiring OLB[j], for example.

The circuit MP[i,j] has a function of retaining a weight coefficient (the first data) between the neuron $N_i^{(k-1)}$ and the neuron $N_j^{(k)}$, for example. Specifically, the circuit MP[i,j] retains information (e.g., a potential, a resistance value, or a current value) corresponding to the first data (weight coefficient) input from the wiring IL[U] and the wiring ILB[j]. In addition, the circuit MP[i,j] has a function of outputting the product of a signal $z_i^{(k-1)}$ output from the neuron $N_i^{(k-1)}$ (the second data) and the first data. As a specific example, when information (e.g., a potential, a resistance value, or a current value) corresponding to the second data $z_i^{(k-1)}$ is input from the wiring XLS[i], the circuit MP[i,j] outputs, to the wiring OL[j] and the wiring OLB[j], information (e.g., a potential, a resistance value, or a current value) corresponding to the product of the first data and the second data. Note that although an example of the case where both of the wiring IL[j] and the wiring ILB[j] are provided is described, one embodiment of the present invention is not limited thereto. Only one of the wiring IL[U] and the wiring ILB[j] may be provided.

<<Circuit ILD>>

The circuit ILD has a function of inputting information (e.g., a potential, a resistance value, or a current value) corresponding to first data $w_1^{(k-1)}{}_1^{(k)}$ to $w_m^{(k-1)}{}_n^{(k)}$ that are weight coefficients to the circuit MP[1,1] to the circuit MP[m,n] through the wiring IL[1] to the wiring IL[n] and the wiring ILB[1] to the wiring ILB[n], for example. As a specific example, the circuit ILD supplies information (e.g., a potential, a resistance value, or a current value) corresponding to the first data $w_i^{(k-1)}{}_j^{(k)}$ that is a weight coefficient to the circuit MP[i,j] through the wiring IL[j] and the wiring ILB[j].

<<Circuit XLD>>

The circuit XLD has a function of supplying the second data $z_1^{(k-1)}$ to $z_m^{(k-1)}$ corresponding to arithmetic values output from the neuron $N_1^{(k-1)}$ to the neuron $N_m^{(k-1)}$ to the circuit MP[1,1] to the circuit MP[m,n] through the wiring XLS[1] to the wiring XLS[m], for example. Specifically, the circuit XLD supplies information (e.g., a potential or a current value) corresponding to the second data $z_i^{(k-1)}$ output from the neuron $N_i^{(k-1)}$ to the circuit MP[i,1] to the circuit MP[i,n] through the wiring XLS[i].

<<Circuit WLD>>

The circuit WLD has a function of selecting the circuit MP to which information (e.g., a potential, a resistance value, or a current value) corresponding to the first data input from the circuit ILD is to be written, for example. In the case where information (e.g., a potential, a resistance value, or a current value) is written to the circuit MP[i,1] to the circuit MP[i,n] positioned in the i-th row of the array portion ALP, for example, the circuit WLD supplies, to the wiring WLS[i], a signal for turning on or off writing switching elements included in the circuit MP[i,1] to the circuit MP[i,n], and supplies, to the other wirings WLS, a potential for turning off writing switching elements included in the circuits MP in rows other than the i-th row, for example. Note that in addition to the wiring WLS[i], a wiring transmitting an inverted signal of a signal input to the wiring WLS[i] may be additionally provided, for example.

<<Circuit AFP>>

The circuit AFP includes a circuit ACTF[1] to a circuit ACTF[n], for example. The circuit ACTF[j] is electrically connected to the wiring OL[j] and the wiring OLB[j], for example. The circuit ACTF[j] generates, for example, a signal corresponding to information (e.g., a potential or a current value) input from the wiring OL[j] and the wiring OLB[j]. For example, information input from the wiring OL[j] and information input from the wiring OLB[j] (e.g., potentials or current values) are compared and a signal based on the comparison result is generated. The signal corresponds to the signal $z_j^{(k)}$ output from the neuron $N_j^{(k)}$. That is, the circuit ACTF[1] to the circuit ACTF[n] function as circuits that perform arithmetic operation of an activation function of the above-described neural network, for example. However, one embodiment of the present invention is not limited thereto. For example, the circuit ACTF[1] to the circuit ACTF[n] may have a function of converting an analog signal into a digital signal. As another example, the circuit ACTF[1] to the circuit ACTF[n] may have a function of amplifying an analog signal and outputting the amplified signal, i.e., a function of converting output impedance. As another example, the circuit ACTF[1] to the circuit ACTF[n] may have a function of converting a current or a charge into a voltage. As another example, the circuit ACTF[1] to the circuit ACTF[n] may have a function of initializing the potential of the wiring OL[j] or the wiring OLB[j].

<<Circuit MP>>

Figure 15B:
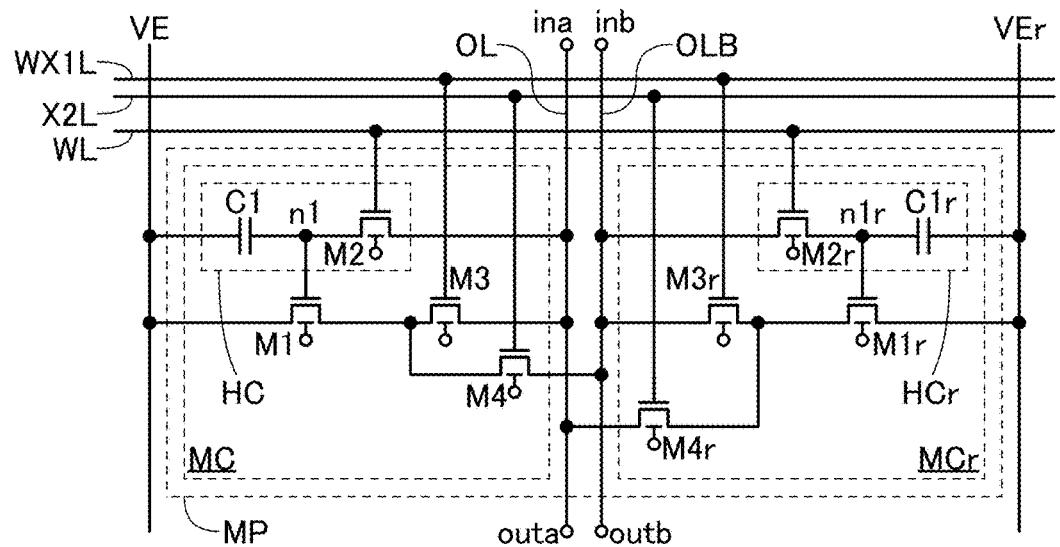
FIG. 15B is a circuit diagram illustrating a configuration example of a circuit included in the semiconductor device.

FIG. 15B is an example of a configuration of each of the circuits MP. The circuits MP each include a circuit MC and a circuit MCr. The circuit MC includes transistors M1 to M4 and a capacitor C1, for example. The circuit MCr includes transistors M1r to M4r and a capacitor C1r, for example. Each of the capacitor C1 and the capacitor C1r can have a structure similar to that of the capacitor 11 described in Embodiment 1. Note that the transistor M2 and the capacitor C1 constitute a retention portion HC, for example. Furthermore, the transistor M2r and the capacitor C1r constitute a retention portion HCr, for example.

The transistors M1 to M4 and the transistors M1r to M4r illustrated in FIG. 15B are each an n-channel transistor having a multi-gate structure including gates over and under a channel, for example. The transistors M1 to M4 and the transistors M1r to M4r each include a first gate and a second gate. In particular, the size of the transistor M3 is preferably the same as the size of the transistor M4, and the size of the transistor M3r is preferably the same as the size of the transistor M4r, for example.

In the circuit MP in FIG. 15B, one of a source and a drain of the transistor M1 is electrically connected to a wiring VE. The other of the source and the drain of the transistor M1 is electrically connected to one of a source and a drain of the transistor M3 and one of a source and a drain of the transistor M4. A gate of the transistor M1 is electrically connected to a first electrode of the capacitor C1 and one of a source and a drain of the transistor M2. A second electrode of the capacitor C1 is electrically connected to the wiring VE. The other of the source and the drain of the transistor M2 is electrically connected to the wiring OL. A gate of the transistor M2 is electrically connected to a wiring WL. The other of the source and the drain of the transistor M3 is electrically connected to the wiring OL, and a gate of the transistor M3 is electrically connected to a wiring WX1L. The other of the source and the drain of the transistor M4 is electrically connected to the wiring OLB, and a gate of the transistor M4 is electrically connected to a wiring X2L.

The connection configuration of the circuit MCr different from that of the circuit MC is described. The other of a source and a drain of the transistor M3r is electrically connected to not the wiring OL but the wiring OLB, and the other of a source and a drain of the transistor M4r is electrically connected to not the wiring OLB but the wiring OL. One of a source and a drain of the transistor M1r and a second electrode of the capacitor C1r are electrically connected to a wiring VEr.

Note that in the retention portion HC illustrated in FIG. 15B, an electrical connection point of the gate of the transistor M1, the first electrode of the capacitor C1, and the one of the source and the drain of the transistor M2 is a node n1. In the retention portion HCr illustrated in FIG. 15B, an electrical connection point of a gate of the transistor M1r, a first electrode of the capacitor C1r, and one of a source and a drain of the transistor M2r is a node n1r.

The retention portion HC has a function of retaining a potential corresponding to the first data, for example. The potential is retained in the retention portion HC included in the circuit MC in FIG. 15B in the following manner: when the transistors M2 and M3 are brought into an on state, the potential is input from the wiring OL and written to the capacitor C1, and then the transistor M2 is brought into an off state. Thus, the potential of the node n1 can be retained as the potential corresponding to the first data. At this time, current is input from the wiring OL and a potential having a level corresponding to the amount of current can be retained in the capacitor C1. Hence, the influence of variations in current characteristics of the transistor M1 can be reduced.

As the transistor M1, a transistor with a low off-state current, such as an OS transistor, is preferably used to retain the potential of the node n1 for a long time. Alternatively, a transistor including a back gate may be used as the transistor M1, and an off-state current may be reduced by applying a low potential to the back gate to shift the threshold voltage to the positive side.

In order to simply describe current input to or output from the circuit MP in an operation example described below, both ends of the wiring OL illustrated in FIG. 15B are referred to as nodes ina and outa and both ends of the wiring OLB are referred to as nodes inb and outb.

The wiring VE and the wiring VEr function as wirings for supplying a constant potential, for example. In the case where the transistor M3, the transistor M3r, the transistor M4, or the transistor M4r is an n-channel transistor, the constant potential can be VSS that is a low potential, a ground potential, a low potential other than those, or the like.

<<Operation Example>>

Next, operation examples of the circuit MP illustrated in FIG. 15B are described. Each of FIG. 16A to FIG. 16C, FIG. 17A to FIG. 17C, and FIG. 18A to FIG. 18C is a timing chart showing an operation example of the circuit MP, and shows changes in the potentials of the wirings WL, WX1L, and X2L and the node n1, and the node n1r. Note that "H" shown in FIG. 16A to FIG. 18C represents a high potential, and "L" represents a low potential. In this operation example, the amount of current output from the wiring OL to the node outa (or from the node outa to the wiring OL) is denoted by $I_{OL}$. In addition, the amount of current output from the wiring OLB to the node outb (or from the node outb to the wiring OLB) is denoted by $I_{OLB}$. The timing charts shown in FIG. 16A to FIG. 18C also show the amounts of changes in currents $I_{OL}$ and $I_{OLB}$.

In this operation example, VSS (low potential) is suppled as a constant potential to the wiring VE and the wiring VEr.

In the circuit MP illustrated in FIG. 15B, the transistor M1 has a diode-connected configuration when the transistors M2 and M3 are in an on state. Thus, when current flows from the wiring OL to the circuit MC, the potentials of the other of the source and the drain of the transistor M1 and the gate of the transistor M1 become almost equal to each other. The potentials are determined in accordance with the amount of current flowing from the wiring OL to the circuit MC, the potential (here, VSS) of the one of the source and the drain of the transistor M1, and the like. Here, when the potential of the gate of the transistor M1 is retained in the capacitor C1 and then the transistor M2 is brought into an off state, the transistor M1 functions as a current source that supplies current corresponding to the potential of the gate of the transistor M1. Thus, the influence of variations in current characteristics of the transistor M1 can be reduced.

When a current amount of $I_1$ is supplied from the wiring OL to the wiring VE through the circuit MC while the transistors M2 and M3 are in an off state, the potential of the gate of the transistor M1 (the node n1) becomes $V_1$. Here, the transistor M2 is brought into an off state, so that $V_1$ is retained in the retention portion HC. Accordingly, the transistor M1 can make $I_1$, which is the current corresponding to the potential VSS of the one of the source and the drain of the transistor M1 and the potential $V_1$ of the gate of the transistor M1, flow between a source and a drain of the transistor M1. In this specification and the like, such an operation is expressed as "the transistor M1 is programmed such that the current amount $I_1$ is supplied between the source and the drain of the transistor M1", for example.

In this operation example, the amount of current flowing from the wiring OL to the circuit MC has three levels of 0, $I_1$, and $I_2$. Accordingly, the amount of current programmed in the transistor M1 has the three levels of 0, $I_1$, and $I_2$. For example, when the potential of the gate of the transistor M1 retained in the retention portion HC is VSS, the potentials of the one of the source and the drain and the other of the source and the drain of the transistor M1 are each VSS, and thus the transistor M1 is brought into an off state when the threshold voltage of the transistor M1 is higher than zero. In this case, current does not flow between the source and the drain of the transistor M1. Thus, it can be said that the amount of current flowing between the source and the drain of the transistor M1 is programmed to be zero. As another example, when the potential of the gate of the transistor M1 retained in the retention portion HC is $V_1$ and the threshold voltage of the transistor M1 is lower than $V_1$-VSS, the transistor M1 is brought into an on state. Here, the amount of current flowing through the transistor M1 is $I_1$. Thus, when the potential of the gate of the transistor M1 is $V_1$, it can be said that the amount of current flowing between the source and the drain of the transistor M1 is programmed to be $I_1$. As another example, when the potential of the gate of the transistor M1 retained in the retention portion HC is $V_2$ and the threshold voltage of the transistor M1 is lower than $V_2$-VSS, the transistor M1 is turned on. Here, the amount of current flowing through the transistor M1 is $I_2$. Thus, when the potential of the gate of the transistor M1 is $V_2$, it can be said that the amount of current flowing between the source and the drain of the transistor M1 is programmed to be $I_2$.

Note that the current amount $I_1$ is larger than 0 and smaller than $I_2$. The potential $V_1$ is higher than VSS and lower than $V_2$. The threshold voltage of the transistor M1 is higher than 0 and lower than $V_1$-VSS.

Before the description of the operation example, the first data (e.g., a weight coefficient here) retained in the circuit MP is defined as follows. When VSS is retained at the node n1 of the retention portion HC and VSS is retained at the node n1r of the retention portion HCr, the circuit MP retains "0" as the first data (a weight coefficient). When $V_1$ is retained at the node n1 of the retention portion HC and VSS is retained at the node n1r of the retention portion HCr, the circuit MP retains "+1" as the first data (a weight coefficient). When $V_2$ is retained at the node n1 of the retention portion HC and VSS is retained at the node n1r of the retention portion HCr, the circuit MP retains "+2" as the first data (a weight coefficient). When VSS is retained at the node n1 of the retention portion HC and $V_1$ is retained at the node n1r of the retention portion HCr, the circuit MP retains "−1" as the first data (a weight coefficient). When VSS is retained at the node n1 of the retention portion HC and $V_2$ is retained at the node n1r of the retention portion HCr, the circuit MP retains "−2" as the first data (a weight coefficient).

In addition, the second data (e.g., a value of a signal of a neuron (an arithmetic value) here) input to the circuit MP is defined as follows, for example. When a high potential is applied to the wiring WX1L and a low potential is applied to the wiring X2L, "+1" is input to the circuit MP as the second data (a value of a signal of a neuron). When a low potential is applied to the wiring WX1L and a high potential is applied to the wiring X2L, "−1" is input to the circuit MP as the second data (a value of a signal of a neuron). When a low potential is applied to the wiring WX1L and a low potential is applied to the wiring X2L, "0" is input to the circuit MP as the second data (a value of a signal of a neuron). Note that the high potential is, for example, VDD or a potential higher than VDD by 10% or more or 20% or more.

Hereinafter, operation examples of the circuit MP are described for each combination of values that the first data (e.g., a weight coefficient below) and the second data (e.g., a value of a signal of a neuron (an arithmetic value) below) can have.

[Condition 1]

First, as an example, the case is considered where the first data (a weight coefficient) is "0" and the second data (a value of a signal of a neuron (an arithmetic value)) input to the circuit MP is "+1". FIG. 16A is a timing chart of the circuit MP in this case.

In Period T11, an initial potential is retained in the retention portions HC and HCr. In FIG. 16A, a potential higher than the potential VSS is retained at the nodes n1 and n1r as the initial potential, for example.

In addition, a low potential is applied to the wirings WL, WX1L, and X2L. Accordingly, the low potential is input to the gates of the transistors M2, M2r, M3, M3r, M4, and M4r; thus, the transistors M2, M2r, M3, M3r, M4, and M4r are brought into an off state.

In Period T12, a high potential is applied to the wiring WL and the wiring WX1L. Accordingly, the high potential is input to the gates of the transistors M2, M2r, M3, and M3r; thus, the transistors M2, M2r, M3, and M3r are brought into an on state.

Although not shown in FIG. 16A, an initialization potential $V_{ini}$ is applied to each of the wirings OL and OLB. Since the transistors M2, M2r, M3, and M3r are in an on state, the potentials of the node n1 of the retention portion HC and the node n1r of the retention portion HCr each become $V_{ini}$. That is, in Period T12, the potentials of the node n1 of the retention portion HC and the node n1r of the retention portion HCr are initialized.

Note that the initialization potential $V_{ini}$ is preferably a ground potential, for example. Alternatively, the initialization potential $V_{ini}$ may be VSS, a potential higher than a ground potential, or a potential lower than a ground potential. In addition, the initialization potentials $V_{ini}$ supplied to the wirings OL and OLB may be potentials different from each other. Note that the initialization potential $V_{ini}$ is not necessarily input to the wirings OL and OLB. Note that Period T12 is not necessarily provided. In addition, initialization is not necessarily performed in Period T12.

In Period T13, the potential VSS is input from the wiring OL to the circuit MC and the potential VSS is input from the wiring OLB to the circuit MCr. Hence, the potential of the node n1 of the retention portion HC becomes VSS and the potential of the node n1r of the retention portion HCr becomes VSS. Accordingly, the transistor M1 in the circuit MC is programmed such that a current amount of 0 is supplied, and thus current does not flow from the wiring OL to the wiring VE through the circuit MC. In addition, the transistor M1r in the circuit MCr is programmed such that a current amount of 0 is supplied, and thus current does not flow from the wiring OLB to the wiring VEr through the circuit MCr. In other words, in Period T13, the transistors M1 and M1r are in an off state; hence, electrical continuity is not established between the wiring OL and the wiring VE and electrical continuity is not established between the wiring OLB and the wiring VEr.

In Period T14, a low potential is applied to the wiring WL and the wiring WX1L. Accordingly, the low potential is input to the gates of the transistors M2, M2r, M3, and M3r; thus, the transistors M2, M2r, M3, and M3r are brought into an off state. When the transistors M2 and M2r are brought into an off state, the potential VSS of the node n1 of the retention portion HC is retained and the potential VSS of the node n1r of the retention portion HCr is retained. In addition, when the transistor M3 is brought into an off state, current does not flow from the wiring OL to the wiring VE through the circuit MC. Similarly, when the transistor M3r is brought into an off state, current does not flow from the wiring OLB to the wiring VEr through the circuit MCr.

By the operation in Period T11 to Period T14, "0" is set as the first data (a weight coefficient) of the circuit MP.

In Period T15, as "+1" that is a signal of a neuron (an arithmetic value) input to the circuit MP, a high potential and a low potential are input to the wiring WX1L and the wiring X2L, respectively. At this time, the high potential is input to the gates of the transistors M3 and M3r, and the low potential is input to the gates of the transistors M4 and M4r. Thus, the transistors M3 and M3r are brought into an on state and the transistors M4 and M4r are brought into an off state. That is, by this operation, electrical continuity is established between the circuit MC and the wiring OL and between the circuit MCr and the wiring OLB, and electrical continuity is not established between the circuit MC and the wiring OLB and between the circuit MCr and the wiring OL.

Since the transistor M1 is in an off state (is programmed such that a current amount of 0 is supplied), current does not flow between the wiring VE and each of the wirings OL and OLB in the circuit MC. Similarly, since the transistor M1r is in an off state (is programmed such that a current amount of 0 is supplied), current does not flow between the wiring VEr and each of the wirings OL and OLB in the circuit MCr. Accordingly, the current $I_{OL}$ output from the node outa of the wiring OL and the current $I_{OLB}$ output from the node outb of the wiring OLB do not change between Period T14 and Period T15.

Since the first data (a weight coefficient) is "0" and the second data (a value of a signal of a neuron (an arithmetic value)) input to the circuit MP is "+1" in this condition, the product of the first data (a weight coefficient) and the second data (a value of a signal of a neuron) obtained using Formula (1) is "0". The result that the product of the first data (a weight coefficient) and the second data (a value of a signal of a neuron) is "0" corresponds to the case where the current $I_{OL}$ and the current $I_{OLB}$ do not change in Period T15 in the operation of the circuit MP.

Note that processing of a plurality of product-sum operations may be performed by changing only the second data (a value of a signal of a neuron, an arithmetic value, or the like) while the first data (e.g., a weight coefficient) once input is not updated. In this case, the update of the first data (a weight coefficient) is unnecessary, so that power consumption can be reduced. For less frequent update of the first data (a weight coefficient), the first data (a weight coefficient) needs to be retained for a long time. In this case, the use of an OS transistor with a low off-state current enables the first data (a weight coefficient) to be retained for a long time, for example.

[Condition 2]

Next, as an example, the case is considered where the first data (a weight coefficient) is "+1" and the second data (a value of a signal of a neuron (an arithmetic value)) input to the circuit MP is "+1". FIG. 16B is a timing chart of the circuit MP in this case.

Since operation in Period T11 and Period T12 is similar to the operation in Period T11 and Period T12 in Condition 1, the description of the operation in Period T11 and Period T12 in Condition 1 is referred to.

In Period T13, the current amount $I_1$ is input from the wiring OL to the circuit MC and the potential VSS is input from the wiring OLB to the circuit MCr. Hence, the potential of the node n1 of the retention portion HC becomes $V_1$ and the potential of the node n1r of the retention portion HCr becomes VSS. Accordingly, the transistor M1 in the circuit MC is programmed such that the current amount $I_1$ is supplied, and thus the current amount $I_1$ is supplied from the wiring OL to the wiring VE through the circuit MC. In addition, the transistor M1r in the circuit MCr is programmed such that a current amount of 0 is supplied, and thus current does not flow from the wiring OLB to the wiring VEr through the circuit MCr.

In Period T14, a low potential is applied to the wiring WL and the wiring WX1L. Accordingly, the low potential is input to the gates of the transistors M2, M2r, M3, and M3r; thus, the transistors M2, M2r, M3, and M3r are brought into an off state. When the transistors M2 and M2r are brought into an off state, the potential $V_1$ of the node n1 of the retention portion HC is retained and the potential VSS of the node n1r of the retention portion HCr is retained. In addition, when the transistor M3 is brought into an off state, current does not flow from the wiring OL to the wiring VE through the circuit MC. Similarly, when the transistor M3r is brought into an off state, current does not flow from the wiring OLB to the wiring VEr through the circuit MCr.

By the operation in Period T11 to Period T14, "+1" is set as the first data (a weight coefficient) of the circuit MP.

In Period T15, as "+1" that is the second data (a value of a signal of a neuron (an arithmetic value)) input to the circuit MP, a high potential and a low potential are input to the wiring WX1L and the wiring X2L, respectively. At this time, the high potential is input to the gates of the transistors M3 and M3r, and the low potential is input to the gates of the transistors M4 and M4r. Thus, the transistors M3 and M3r are brought into an on state and the transistors M4 and M4r are brought into an off state. That is, by this operation, electrical continuity is established between the circuit MC and the wiring OL and between the circuit MCr and the wiring OLB, and electrical continuity is not established between the circuit MC and the wiring OLB and between the circuit MCr and the wiring OL.

At this time, in the circuit MC, the transistor M3 is in an on state and the transistor M1r is in an on state (is programmed such that the current amount $I_1$ is supplied); hence, current flows between the wiring OL and the wiring VE. In addition, since the transistor M4 is in an off state in the circuit MC, current does not flow between the wiring OLB and the wiring VE. Meanwhile, since the transistor M3r is in an on state and the transistor M1 is in an off state (is programmed such that a current amount of 0 is supplied) in the circuit MCr, current does not flow between the wiring OLB and the wiring VEr. Furthermore, since the transistor M4r is in an off state in the circuit MCr, current does not flow between the wiring OL and the wiring VEr. According to the above, the current $I_{OL}$ output from the node outa of the wiring OL increases by $I_1$ in Period T15, and the current $I_{OLB}$ output from the node outb of the wiring OLB does not change between Period T14 and Period T15.

Since the first data (a weight coefficient) is "+1" and the second data (a value of a signal of a neuron) input to the circuit MP is "+1" in this condition, the product of the first data (a weight coefficient) and the second data (a value of a signal of a neuron) obtained using Formula (1) is "+1". The result that the product of the first data (a weight coefficient) and the second data (a value of a signal of a neuron) is "+1" corresponds to the case where the current $I_{OL}$ increases by $I_1$ and the current $I_{OLB}$ does not change in Period T15 in the operation of the circuit MP.

When the current flowing from the wiring OL to the circuit MC is programmed to be $I_2$, not $I_1$, in Period T13 in this condition, $V_2$ can be retained in the retention portion HC, for example. Accordingly, "+2" is set as the first data (a weight coefficient) of the circuit MP. When the first data (a weight coefficient) is "+2" and the signal of a neuron input to the circuit MP is "+1", the product of the first data (a weight coefficient) and the second data (a value of the signal of a neuron) obtained using Formula (1) is "+2". The result that the product of the first data (a weight coefficient) and the second data (a value of the signal of a neuron) is "+2" corresponds to the case where the current $I_{OL}$ increases by 12 and the current $I_{OLB}$ does not change in Period T15 in the operation of the circuit MP. By retaining VSS in the retention portion HCr in the circuit MCr and programming a current amount other than $I_1$ in the circuit MC in the above manner, a positive value other than "+1" can be set as the first data (a weight coefficient) of the circuit MP.

[Condition 3]

Next, as an example, the case is considered where the first data (a weight coefficient) is "−1" and the second data (a value of a signal of a neuron (an arithmetic value)) input to the circuit MP is "+1". FIG. 16C is a timing chart of the circuit MP in this case.

Since operation in Period T11 and Period T12 is similar to the operation in Period T11 and Period T12 in Condition 1, the description of the operation in Period T11 and Period T12 in Condition 1 is referred to.

In Period T13, the potential VSS is input from the wiring OL to the circuit MC and the current amount $I_1$ is input from the wiring OLB to the circuit MCr. Hence, the potential of the node n1 of the retention portion HC becomes VSS and the potential of the node n1r of the retention portion HCr becomes $V_1$. Accordingly, the transistor M1 in the circuit MCr is programmed such that a current amount of 0 is supplied, and thus current does not flow from the wiring OL to the wiring VE through the circuit MC. In addition, the transistor M1r in the circuit MCr is programmed such that the current amount $I_1$ is supplied, and thus the current amount $I_1$ is supplied from the wiring OLB to the wiring VEr through the circuit MCr.

In Period T14, a low potential is applied to the wiring WL and the wiring WX1L. Accordingly, the low potential is input to the gates of the transistors M2, M2r, M3, and M3r; thus, the transistors M2, M2r, M3, and M3r are brought into an off state. When the transistors M2 and M2r are brought into an off state, the potential VSS of the node n1 of the retention portion HC is retained and the potential $V_1$ of the node n1r of the retention portion HCr is retained. In addition, when the transistor M3 is brought into an off state, current does not flow from the wiring OL to the wiring VE through the circuit MC. Similarly, when the transistor M3r is brought into an off state, current does not flow from the wiring OLB to the wiring VEr through the circuit MCr.

By the operation in Period T11 to Period T14, "−1" is set as the first data (a weight coefficient) of the circuit MP.

In Period T15, as "+1" that is the second data (a signal of a neuron (an arithmetic value)) input to the circuit MP, a high potential and a low potential are input to the wiring WX1L and the wiring X2L, respectively. At this time, the high potential is input to the gates of the transistors M3 and M3r, and the low potential is input to the gates of the transistors M4 and M4r. Thus, the transistors M3 and M3r are brought into an on state and the transistors M4 and M4r are brought into an off state. That is, by this operation, electrical continuity is established between the circuit MC and the wiring OL and between the circuit MCr and the wiring OLB, and electrical continuity is not established between the circuit MC and the wiring OLB and between the circuit MCr and the wiring OL.

At this time, in the circuit MC, the transistor M3 is in an on state and the transistor M1 is in an off state (is programmed such that a current amount of 0 is supplied); hence, current does not flow between the wiring OL and the wiring VE. In addition, since the transistor M4 is in an off state in the circuit MC, current does not flow between the wiring OLB and the wiring VE. Meanwhile, since the transistor M3r is in an on state and the transistor M1r is in an on state (is programmed such that the current amount $I_1$ is supplied) in the circuit MCr, current flows between the wiring OLB and the wiring VEr. Furthermore, since the transistor M4r is in an off state in the circuit MCr, current does not flow between the wiring OL and the wiring VEr. According to the above, the current $I_{OL}$ output from the node outa of the wiring OL does not change between Period T14 and Period T15, and the current $I_{OLB}$ output from the node outb of the wiring OLB increases by $I_1$ in Period T15.

Since the first data (a weight coefficient) is "−1" and the second data (a value of a signal of a neuron (an arithmetic value)) input to the circuit MP is "+1" in this condition, the product of the first data (a weight coefficient) and the second data (a value of a signal of a neuron) obtained using Formula (1) is "−1". The result that the product of the first data (a weight coefficient) and the second data (a value of a signal of a neuron) is "−1" corresponds to the case where the current $I_{OL}$ does not change and the current $I_{OLB}$ increases by $I_1$ in Period T15 in the operation of the circuit MP.

When the current flowing from the wiring OLB to the circuit MCr is programmed to be $I_2$, not $I_1$, in Period T13 in this condition, $V_2$ can be retained in the retention portion HCr, for example. Accordingly, "−2" is set as the first data (a weight coefficient) of the circuit MP. When the first data (a weight coefficient) is "−2" and the second data (a value of a signal of a neuron) input to the circuit MP is "+1", the product of the first data (a weight coefficient) and the second data (a value of a signal of a neuron) obtained using Formula (1) is "−2". The result that the product of the first data (a weight coefficient) and the second data (a value of a signal of a neuron) is "−2" corresponds to the case where the current $I_{OL}$ does not change and the current $I_{OLB}$ increases by $I_2$ in Period T15 in the operation of the circuit MP. By retaining VSS in the retention portion HC in the circuit MC and programming a current amount other than $I_1$ in the circuit MCr in the above manner, a positive value other than "+1" can be set as the weight coefficient of the circuit MP.
[Condition 4]

In this condition, as an example, the operation of the circuit MP of the case where the first data (a weight coefficient) is "0" and the second data (a value of a signal of a neuron (an arithmetic value)) input to the circuit MP is "−1" is considered. FIG. 17A is a timing chart of the circuit MP in this case.

Since operation in Period T11 to Period T14 is similar to the operation in Period T11 to Period T14 in Condition 1, the description of the operation in Period T11 to Period T14 in Condition 1 is referred to.

In Period T15, as "−1" that is the second data (a value of a signal of a neuron (an arithmetic value)) input to the circuit MP, a low potential and a high potential are input to the wiring WX1L and the wiring X2L, respectively. At this time, the low potential is input to the gates of the transistors M3 and M3r, and the high potential is input to the gates of the transistors M4 and M4r. Thus, the transistors M3 and M3r are brought into an off state and the transistors M4 and M4r are brought into an on state. That is, by this operation, electrical continuity is not established between the circuit MC and the wiring OL and between the circuit MCr and the wiring OLB, and electrical continuity is established between the circuit MC and the wiring OLB and between the circuit MCr and the wiring OL.

Since the transistor M1 is in an off state (is programmed such that a current amount of 0 is supplied), current does not flow between the wiring VE and each of the wirings OL and OLB in the circuit MC. In other words, the current $I_{OL}$ output from the node outa of the wiring OL and the current $I_{OLB}$ output from the node outb of the wiring OLB do not change between Period T14 and Period T15. Similarly, since the transistor M1r is in an off state (is programmed such that a current amount of 0 is supplied), current does not flow between the wiring VEr and each of the wirings OL and OLB in the circuit MCr. In other words, the current $I_{OL}$ output from the node outa of the wiring OL and the current $I_{OLB}$ output from the node outb of the wiring OLB do not change between Period T14 and Period T15.

Since the first data (a weight coefficient) is "0" and the second data (a value of a signal of a neuron (an arithmetic value)) input to the circuit MP is "−1" in this condition, the product of the first data (a weight coefficient) and the second data (a value of a signal of a neuron) obtained using Formula (1) is "0". The result that the product of the first data (a weight coefficient) and the second data (a value of a signal of a neuron) is "0" corresponds to the case where the current $I_{OL}$ and the current $I_{OLB}$ do not change between Period T14 and Period T15 in the operation of the circuit MP, which agrees with the result of the circuit operation in Condition 1.
[Condition 5]

In this condition, as an example, the operation of the circuit MP of the case where the first data (a weight coefficient) is "+1" and the second data (a value of a signal of a neuron (an arithmetic value)) input to the circuit MP is "−1" is considered. FIG. 17B is a timing chart of the circuit MP in this case.

Since operation in Period T11 to Period T14 is similar to the operation in Period T11 to Period T14 in Condition 2, the description of the operation in Period T11 to Period T14 in Condition 2 is referred to.

In Period T15, as "−1" that is the second data (a value of a signal of a neuron (an arithmetic value)) input to the circuit MP, a low potential and a high potential are input to the wiring WX1L and the wiring X2L, respectively. At this time, the low potential is input to the gates of the transistors M3 and M3r, and the high potential is input to the gates of the transistors M4 and M4r. Thus, the transistors M3 and M3r are brought into an off state and the transistors M4 and M4r are brought into an on state. That is, by this operation, electrical continuity is not established between the circuit MC and the wiring OL and between the circuit MCr and the wiring OLB, and electrical continuity is established between the circuit MC and the wiring OLB and between the circuit MCr and the wiring OL.

At this time, since the transistor M3 is in an off state in the circuit MC, current does not flow between the wiring OL and the wiring VE. In addition, since the transistor M4 is in an on state and the transistor M1r is in an on state (is programmed such that the current amount $I_1$ is supplied) in the circuit MC, current flows between the wiring OLB and the wiring VE. Meanwhile, since the transistor M3r is in an off state in the circuit MCr, current does not flow between the wiring OLB and the wiring VEr. Furthermore, since the transistor M4r is in an on state and the transistor M1 is in an off state (is programmed such that a current amount of 0 is supplied) in the circuit MCr, current does not flow between the wiring OL and the wiring VEr. According to the above, the current $I_{OL}$ output from the node outa of the wiring OL does not change between Period T14 and Period T15, and the current $I_{OLB}$ output from the node outb of the wiring OLB increases by $I_1$ in Period T15.

Since the first data (a weight coefficient) is "+1" and the second data (a value of a signal of a neuron (an arithmetic value)) input to the circuit MP is "−1" in this condition, the product of the first data (a weight coefficient) and the second data (a value of a signal of a neuron) obtained using Formula (1) is "−1". The result that the product of the first data (a weight coefficient) and the second data (a value of a signal of a neuron) is "−1" corresponds to the case where the current $I_{OL}$ does not change and the current $I_{OLB}$ increases by $I_1$ in Period T15 in the operation of the circuit MP, which agrees with the result of the circuit operation in Condition 3.

Note that as described in Condition 2, in Period T13 in this condition, the current flowing from the wiring OL to the circuit MC may be programmed to be $I_2$, not $I_1$, to retain $V_2$ in the retention portion HC, for example. Accordingly, "+2" is set as the first data (a weight coefficient) of the circuit MP. When the first data (a weight coefficient) is "+2" and the signal of a neuron input to the circuit MP is "−1", the product of the first data (a weight coefficient) and the second data (a value of the signal of a neuron) obtained using Formula (1) is "−2". The result that the product of the first data (a weight coefficient) and the second data (a value of the signal of a neuron) is "−2" corresponds to the case where the current $I_{OL}$ does not change and the current $I_{OLB}$ increases by $I_2$ in Period T15 in the operation of the circuit MP. By retaining VSS in the retention portion HCr in the circuit MCr and programming a current amount other than $I_1$ in the circuit MC in the above manner, a positive value other than "+1" can be set as the weight coefficient of the circuit MP.

[Condition 6]

In this condition, as an example, the operation of the circuit MP of the case where the first data (a weight coefficient) is "−1" and the second data (a value of a signal of a neuron (an arithmetic value)) input to the circuit MP is "−1" is considered. FIG. 17C is a timing chart of the circuit MP in this case.

Since operation in Period T11 to Period T14 is similar to the operation in Period T11 to Period T14 in Condition 3, the description of the operation in Period T11 to Period T14 in Condition 3 is referred to.

In Period T15, as "−1" that is the second data (a value of a signal of a neuron (an arithmetic value)) input to the circuit MP, a low potential and a high potential are input to the wiring WX1L and the wiring X2L, respectively. At this time, the low potential is input to the gates of the transistors M3 and M3r, and the high potential is input to the gates of the transistors M4 and M4r. Thus, the transistors M3 and M3r are brought into an off state and the transistors M4 and M4r are brought into an on state. That is, by this operation, electrical continuity is not established between the circuit MC and the wiring OL and between the circuit MCr and the wiring OLB, and electrical continuity is established between the circuit MC and the wiring OLB and between the circuit MCr and the wiring OL.

At this time, since the transistor M3 is in an off state in the circuit MC, current does not flow between the wiring OL and the wiring VE. In addition, since the transistor M4 is in an on state and the transistor M1 is in an on state (is programmed such that a current amount of 0 is supplied) in the circuit MC, current does not flow between the wiring OLB and the wiring VE. Meanwhile, since the transistor M3r is in an off state in the circuit MCr, current does not flow between the wiring OLB and the wiring VEr. Furthermore, since the transistor M4r is in an on state and the transistor M1 is in an on state (is programmed such that the current amount $I_1$ is supplied) in the circuit MCr, current flows between the wiring OL and the wiring VEr. According to the above, the current $I_{OL}$ output from the node outa of the wiring OL increases by $I_1$ in Period T15, and the current $I_{OLB}$ output from the node outb of the wiring OLB does not change between Period T14 and Period T15.

Since the first data (a weight coefficient) is "−1" and the second data (a value of a signal of a neuron (an arithmetic value)) input to the circuit MP is "−1" in this condition, the product of the first data (a weight coefficient) and the second data (a value of a signal of a neuron) obtained using Formula (1) is "+1". The result that the product of the first data (a weight coefficient) and the second data (a value of a signal of a neuron) is "+1" corresponds to the case where the current $I_{OL}$ changes between Period T14 and Period T15 and the current $I_{OLB}$ does not change in the operation of the circuit MP, which agrees with the result of the circuit operation in Condition 2.

Note that as described in Condition 3, in Period T13 in this condition, the current flowing from the wiring OLB to the circuit MCr may be programmed to be $I_2$, not $I_1$, to retain $V_2$ in the retention portion HC, for example. Accordingly, "−2" is set as the first data (a weight coefficient) of the circuit MP. When the first data (a weight coefficient) is "−2" and the second data (a value of a signal of a neuron) input to the circuit MP is "−1", the product of the first data (a weight coefficient) and the second data (a value of a signal of a neuron) obtained using Formula (1) is "+2". The result that the product of the first data (a weight coefficient) and the second data (a value of a signal of a neuron) is "+2" corresponds to the case where the current $I_{OL}$ does not change and the current $I_{OLB}$ increases by 12 in Period T15 in the operation of the circuit MP. By retaining VSS in the retention portion HC in the circuit MC and programming a current amount other than $I_1$ in the circuit MCr in the above manner, a positive value other than "+1" can be set as the weight coefficient of the circuit MP.

[Condition 7]

In this condition, as an example, the operation of the circuit MP is considered using Condition 7 where the first data (a weight coefficient) is "0" and the second data (a value of a signal of a neuron (an arithmetic value)) input to the circuit MP is "0". FIG. 18A is a timing chart of the circuit MP in this case.

Since operation in Period T11 to Period T14 is similar to the operation in Period T11 to Period T14 in Condition 1, the description of the operation in Period T11 to Period T14 in Condition 1 is referred to.

In Period T15, as "0" that is the second data (a value of a signal of a neuron (an arithmetic value)) input to the circuit MP, a low potential is input to each of the wiring WX1L and the wiring X2L. At this time, the low potential is input to the gates of the transistors M3, M3r, M4, and M4r. Thus, the transistors M3, M3r, M4, and M4r are brought into an off state. That is, by this operation, electrical continuity is not established between the circuit MC and the wiring OL, between the circuit MCr and the wiring OLB, between the circuit MC and the wiring OLB, and between the circuit MCr and the wiring OL.

Thus, in the circuit MC, current does not flow between the wiring OL and one of the wiring VE and the wiring VEr regardless of the programmed amount of current flowing through the transistor M1. Similarly, in the circuit MCr, current does not flow between the wiring OLB and the other of the wiring VE and the wiring VEr regardless of the programmed amount of current flowing through the transistor Mir. In other words, the current $I_{OL}$ output from the node outa of the wiring OL and the current $I_{OLB}$ output from the node outb of the wiring OLB do not change between Period T14 and Period T15.

Since the first data (a weight coefficient) is "0" and the second data (a value of a signal of a neuron (an arithmetic value)) input to the circuit MP is "0" in this condition, the product of the first data (a weight coefficient) and the second data (a value of a signal of a neuron) obtained using Formula (1) is "0". The result that the product of the first data (a weight coefficient) and the second data (a value of a signal of a neuron) is "0" corresponds to the case where the current $I_{OL}$ and the current $I_{OLB}$ do not change in Period T15 in the operation of the circuit MP, which agrees with the results of the circuit operations in Conditions 1 and 4.

[Condition 8]

In this condition, as an example, the operation of the circuit MP is considered using Condition 8 where the first data (a weight coefficient) is "+1" and the second data (a value of a signal of a neuron (an arithmetic value)) input to the circuit MP is "0". FIG. 18B is a timing chart of the circuit MP in this case.

Since operation in Period T11 to Period T14 is similar to the operation in Period T11 to Period T14 in Condition 2, the description of the operation in Period T11 to Period T14 in Condition 2 is referred to.

In Period T15, as "0" that is the second data (a value of a signal of a neuron (an arithmetic value)) input to the circuit MP, a low potential is input to each of the wiring WX1L and the wiring X2L. At this time, the low potential is input to the gates of the transistors M3, M3r, M4, and M4r. Thus, the transistors M3, M3r, M4, and M4r are brought into an off state. That is, by this operation, electrical continuity is not established between the circuit MC and the wiring OL, between the circuit MCr and the wiring OLB, between the circuit MC and the wiring OLB, and between the circuit MCr and the wiring OL, regardless of the programmed amounts of current flowing through the transistors M1 and Mir, as in Condition 7. Thus, current does not flow between the wiring OL and one of the wiring VE and the wiring VEr and current does not flow between the wiring OLB and the other of the wiring VE and the wiring VEr. According to the above, the current $I_{OL}$ output from the node outa of the wiring OL and the current $I_{OLB}$ output from the node outb of the wiring OLB do not change between Period T14 and Period T15.

Since the first data (a weight coefficient) is "+1" and the second data (a signal of a neuron (an arithmetic value)) input to the circuit MP is "0" in this condition, the product of the first data (a weight coefficient) and the second data (a value of a signal of a neuron) obtained using Formula (1) is "0". The result that the product of the first data (a weight coefficient) and the second data (a value of a signal of a neuron) is "0" corresponds to the case where the current $I_{OL}$ and the current $I_{OLB}$ do not change in Period T15 in the operation of the circuit MP, which agrees with the results of the circuit operations in Conditions 1, 4, and 7.

[Condition 9]

In this condition, as an example, the operation of the circuit MP is considered using Condition 9 where the first data (a weight coefficient) is "−1" and the second data (a value of a signal of a neuron (an arithmetic value)) input to the circuit MP is "0". FIG. 18C is a timing chart of the circuit MP in this case.

Since operation in Period T11 to Period T14 is similar to the operation in Period T11 to Period T14 in Condition 3, the description of the operation in Period T11 to Period T14 in Condition 3 is referred to.

In Period T15, as "0" that is the second data (a value of a signal of a neuron (an arithmetic value)) input to the circuit MP, a low potential is input to each of the wiring WX1L and the wiring X2L. At this time, the low potential is input to the gates of the transistors M3, M3r, M4, and M4r. Thus, the transistors M3, M3r, M4, and M4r are brought into an off state. That is, by this operation, electrical continuity is not established between the circuit MC and the wiring OL, between the circuit MCr and the wiring OLB, between the circuit MC and the wiring OLB, and between the circuit MCr and the wiring OL, regardless of the programmed amounts of current flowing through the transistors M1 and Mir, as in Condition 7. Thus, current does not flow between the wiring OL and one of the wiring VE and the wiring VEr and current does not flow between the wiring OLB and the other of the wiring VE and the wiring VEr. According to the above, the current $I_{OL}$ output from the node outa of the wiring OL and the current $I_{OLB}$ output from the node outb of the wiring OLB do not change between Period T14 and Period T15.

Since the first data (a weight coefficient) is "−1" and the second data (a value of a signal of a neuron (an arithmetic value)) input to the circuit MP is "0" in this condition, the product of the first data (a weight coefficient) and the second data (a value of a signal of a neuron) obtained using Formula (1) is "0". The result that the product of the first data (a weight coefficient) and the second data (a value of a signal of a neuron) is "0" corresponds to the case where the current $I_{OL}$ and the current $I_{OLB}$ do not change between Period T14 and Period T15 in the operation of the circuit MP, which agrees with the results of the circuit operations in Conditions 1, 4, 7, and 8.

The results of the operation examples under Condition 1 to Condition 9 described above are listed in the following table. Note that in the following table, a high potential is denoted by "H" and a low potential is denoted by "L".

TABLE 1

| Condition | Weight coefficient | n1 | n1r | Signal | X1L | X2L | Weight coefficient × Signal | Change amount of $I_{OL}$ | Change amount of $I_{OLB}$ |
|---|---|---|---|---|---|---|---|---|---|
| Condition 1 | 0 | VSS | VSS | +1 | H | L | 0 | 0 | 0 |
| Condition 2 | +1 | $V_1$ | VSS | +1 | H | L | +1 | $I_1$ | 0 |
| Condition 3 | −1 | VSS | $V_1$ | +1 | H | L | −1 | 0 | $I_1$ |
| Condition 4 | 0 | VSS | VSS | −1 | L | H | 0 | 0 | 0 |
| Condition 5 | +1 | $V_1$ | VSS | −1 | L | H | −1 | 0 | $I_1$ |
| Condition 6 | −1 | VSS | $V_1$ | −1 | L | H | +1 | $I_1$ | 0 |
| Condition 7 | 0 | VSS | VSS | 0 | L | L | 0 | 0 | 0 |
| Condition 8 | +1 | $V_1$ | VSS | 0 | L | L | 0 | 0 | 0 |
| Condition 9 | −1 | VSS | $V_1$ | 0 | L | L | 0 | 0 | 0 |

Here, the case where one circuit MC and one circuit MCr are connected to the wirings OL and OLB is shown as an example. In the case where a plurality of circuits MC and a plurality of circuits MCr are connected to the wirings OL and OLB as illustrated in FIG. 15A and the like, currents output from the circuits MC and the circuits MCr are added in accordance with Kirchhoff's current law. Consequently, sum operation is performed. In other words, the product operation is performed in the circuits MC and the circuits MCr, and the sum operation is performed by adding the currents from the plurality of circuits MC and the plurality of circuits MCr. As a result of the above, product-sum operation processing is performed.

In the operation of the circuit MP, when calculation using the first data (a weight coefficient) having only two levels "+1" and "−1" and the second data (a value of a signal of a neuron) having only two levels "+1" and "−1" is performed, the circuit MP can perform operation similar to that of an exclusive NOR circuit (coincidence circuit).

In the operation of the circuit MP, when calculation using the first data (a weight coefficient) having only two levels "+1" and "0" and the second data (a value of a signal of a neuron) having only two levels "+1" and "0" is performed, the circuit MP can perform operation similar to that of a logical product circuit.

In this operation example, a potential retained in the retention portions HC and HCr included in the circuits MC and MCr of the circuit MP represents a multilevel value of VSS, $V_1$, or $V_2$, for example; however, a potential representing a binary value or an analog value may be retained in the retention portions HC and HCr. For example, in the case where the first data (a weight coefficient) is a "positive analog value", a high-level analog potential is retained at the node n1 of the retention portion HC and a low potential is retained at the node n1r of the retention portion HCr. In the case where the first data (a weight coefficient) is a "negative analog value", for example, a low potential is retained at the node n1 of the retention portion HC and a high-level analog potential is retained at the node n1r of the retention portion HCr. The amounts of the current $I_{OL}$ and the current $I_{OLB}$ each become an amount corresponding to the analog potential.

At least part of the structure, method, and the like described in this embodiment can be implemented in appropriate combination with other embodiments, an example, or the like described in this specification.

Embodiment 3

In this embodiment, structure examples of transistors that can be used in the semiconductor device described in the above embodiment are described. As an example, a structure in which transistors having different electrical characteristics are stacked is described. With the structure, the flexibility in design of the semiconductor device can be increased. Stacking transistors having different electrical characteristics can increase the degree of integration of the semiconductor device.

Figure 19:
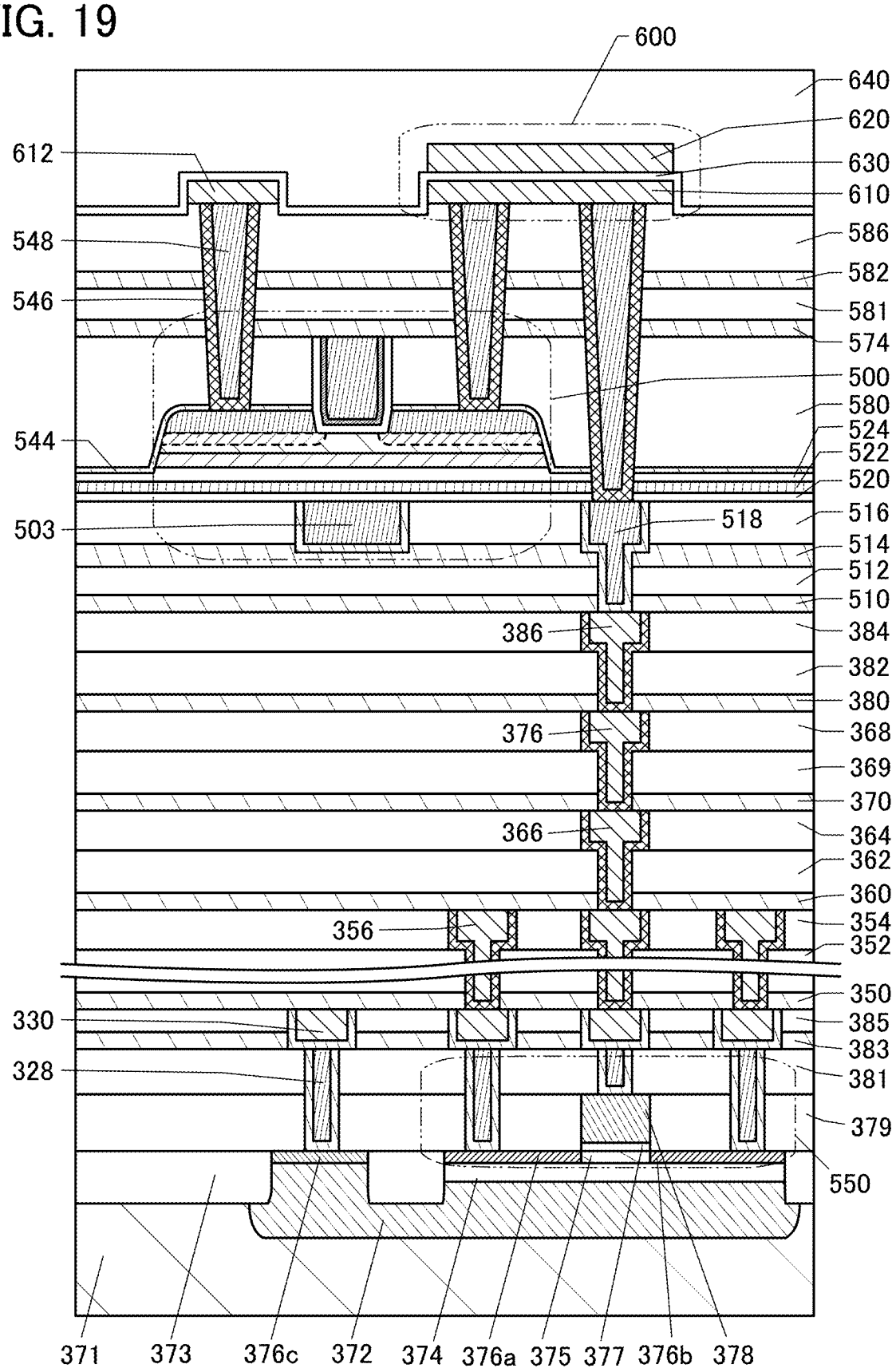
FIG. 19 is a diagram illustrating a structure example of a semiconductor device.
Figure 20A:
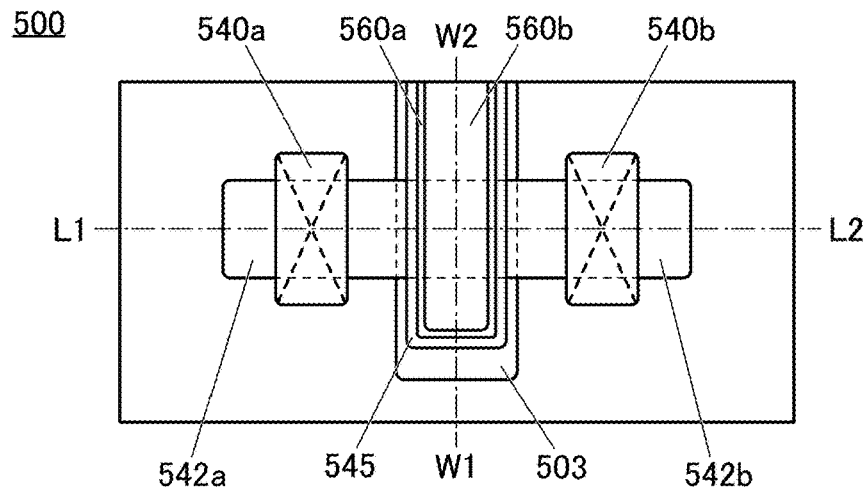
FIG. 20A to FIG. 20C are diagrams illustrating a structure example of a transistor.
Figure 20B:
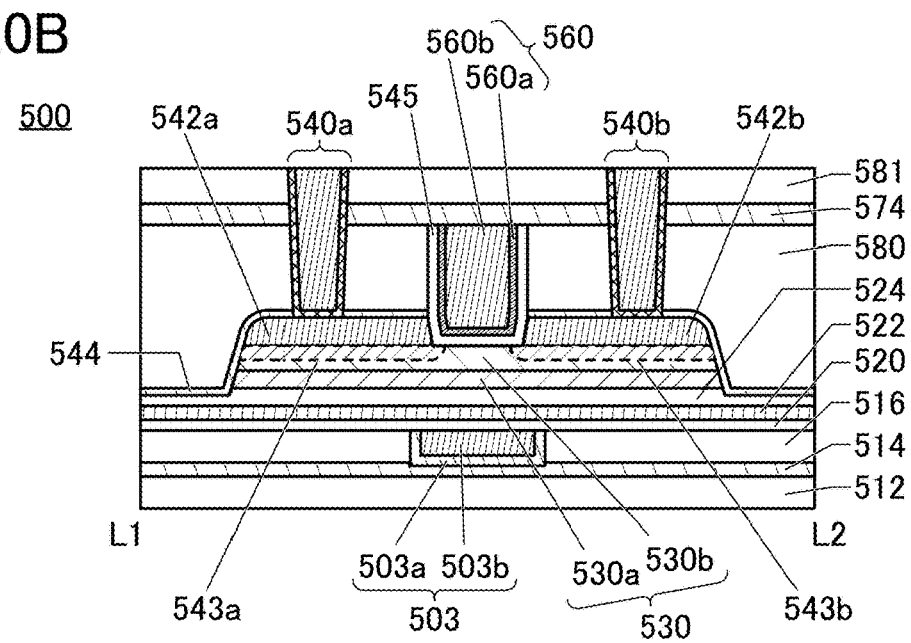
Figure 20C:
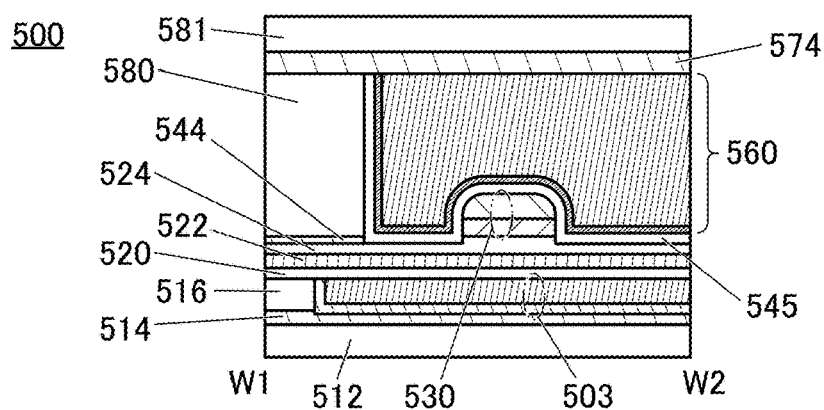

FIG. 19 illustrates part of a cross-sectional structure of a semiconductor device. The semiconductor device illustrated in FIG. 19 includes a transistor 550, a transistor 500, and a capacitor 600. FIG. 20A is a top view of the transistor 500. FIG. 20B is a cross-sectional view of a portion indicated by a dashed-dotted line L1-L2 in FIG. 20A, and is a cross-sectional view of the transistor 500 in the channel length direction. FIG. 20C is a cross-sectional view of a portion indicated by a dashed-dotted line W1-W2 in FIG. 20A, and is a cross-sectional view of the transistor 500 in the channel width direction. For example, the transistor 500 corresponds to an OS transistor included in the semiconductor device described in the above embodiment, e.g., the transistor 21. The transistor 550 corresponds to a Si transistor included in the semiconductor device described in the above embodiment, that is, the transistor 22, for example.

As described above, the transistor 500 is an OS transistor. The off-state current of an OS transistor is extremely low. Accordingly, a data potential or electric charge written to a memory node through the transistor 500 can be retained for a long time. In other words, power consumption of the semiconductor device can be reduced because the memory node has a low frequency of refresh operation or requires no refresh operation.

In FIG. 19, the transistor 500 is provided above the transistor 550, and the capacitor 600 is provided above the transistor 550 and the transistor 500.

The transistor 550 is provided on a substrate 371. The substrate 371 is a p-type silicon substrate, for example. The substrate 371 may be an n-type silicon substrate. An oxide layer 374 is preferably an insulating layer formed with an oxide buried (Burried oxide) into the substrate 371 (the insulating layer is also referred to as a BOX layer), for example, is a silicon oxide. The transistor 550 is formed using a single crystal silicon provided over the substrate 371 with the oxide layer 374 sandwiched therebetween; that is, the transistor 550 is provided on an SOI (Silicon On Insulator) substrate.

The substrate 371 included in the SOI substrate is provided with an insulator 373 serving as an element isolation layer. The substrate 371 includes a well region 372. The well region 372 is a region to which n-type or p-type conductivity is imparted in accordance with the conductivity of the transistor 550. The single-crystal silicon in the SOI substrate is provided with a semiconductor region 375 and a low-resistance region 376a and a low-resistance region 376b each of which function as a source region or a drain region. A low-resistant region 376c is provided over the well region 372.

The transistor 550 can be provided so as to overlap with the well region 372 to which an impurity element imparting conductivity is added. The well region 372 can function as a bottom-gate electrode of the transistor 550 by independently changing the potential of the low-resistance region 376c. Moreover, the threshold voltage of the transistor 550 can be controlled. In particular, when a negative potential is applied to the well region 372, the threshold voltage of the transistor 550 can be further increased, and the off-state current can be reduced. Thus, a negative potential is applied to the well region 372, so that drain current when a potential applied to a gate electrode of the Si transistor is 0 V can be reduced. As a result, power consumption due to shoot-through current or the like in the arithmetic circuit including the transistor 550 can be reduced, and the arithmetic efficiency can be improved.

The transistor 550 preferably has a structure in which the top surface and the side surface in the channel width direction of the semiconductor layer are covered with a conductor 378 with an insulator 377 therebetween, that is, a Fin-type structure. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

The conductor 378 sometimes functions as a first gate (also referred to as a top gate) electrode. In addition, the well region 372 sometimes functions as a second gate (also referred to as a bottom gate) electrode. In that case, a potential applied to the well region 372 can be controlled through the low-resistance region 376c.

A region of the semiconductor region 375 where a channel is formed, a region in the vicinity thereof, the low-resistance region 376a and the low-resistance region 376b each functioning as a source region or a drain region, the low-resistance region 376c connected to an electrode controlling a potential of the well region 372, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with the use of GaAs and GaAlAs, or the like.

The well region 372, the low-resistance region 376a, the low-resistance region 376b, and the low-resistance region 376c contain an element which imparts n-type conductivity, such as arsenic or phosphorus, or an element which imparts p-type conductivity, such as boron, in addition to the semiconductor material used for the semiconductor region 375.

For the conductor 378 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used. Alternatively, silicide such as nickel silicide may be used for the conductor 378.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

To form each of the low-resistance region 376a, the low-resistance region 376b, and the low-resistance region 376c, another conductor, for example, silicide such as nickel silicide may be stacked. With this structure, the conductivity of the region functioning as an electrode can be increased. At this time, an insulator functioning as a sidewall spacer (also referred to as a sidewall insulating layer) may be provided at the side surface of the conductor 378 functioning as a gate electrode and the side surface of the insulator functioning as a gate insulating film. This structure can prevent the conductor 378 and the low-resistance region 376a and the low-resistance region 376b from being brought into a conduction state.

An insulator 379, an insulator 381, an insulator 383, and an insulator 385 are stacked in this order to cover the transistor 550.

For the insulator 379, the insulator 381, the insulator 383, and the insulator 385, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 381 may have a function of a planarization film for eliminating a level difference caused by the transistor 550 or the like provided below the insulator 381. For example, a top surface of the insulator 381 may be planarized by planarization treatment using a chemical mechanical polishing (CMP) method or the like to improve planarity.

In addition, for the insulator 383, it is preferable to use a film having a barrier property that prevents diffusion of hydrogen or impurities from the substrate 371, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 383 that is converted into hydrogen atoms per area of the insulator 383 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 385 is preferably lower than that of the insulator 383. For example, the dielectric constant of the insulator 385 is preferably lower than 4, further preferably lower than 3. The dielectric constant of the insulator 385 is, for example, preferably 0.7 times or less, further preferably 0.6 times or less the dielectric constant of the insulator 383. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 379, the insulator 381, the insulator 383, and the insulator 385. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 385 and the conductor 330. For example, in FIG. 19, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, like the insulator 383, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 19, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, like the insulator 383, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 19, an insulator 370, an insulator 369, and an insulator 368 are provided to be stacked in this order. Furthermore, the conductor 376 is formed in the insulator 370, the insulator 369, and the insulator 368. The conductor 376 has a function of a plug or a wiring. Note that the conductor 376 can be provided using a material similar to those for the conductor 328 and the conductor 330.

Note that for example, like the insulator 383, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 368 and the conductor 376. For example, in FIG. 19, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, like the insulator 383, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen and hydrogen is preferably used for any of the insulator 510, the insulator 512, the insulator 514, and the insulator 516.

For example, for the insulator 510 and the insulator 514, it is preferable to use a film having a barrier property against hydrogen and impurities diffused from the substrate 371, a region where the transistor 550 is provided, or the like into the region where the transistor 500 is provided. Therefore, a material similar to that for the insulator 383 can be used.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 379 can be used, for example. Furthermore, when a material with a relatively low permittivity is used for these insulators, parasitic capacitance generated between wirings can be reduced. A silicon oxide film, a silicon oxynitride film, or the like can be used for the insulator 512 or the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 20A and FIG. 20B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

In addition, as illustrated in FIG. 20A and FIG. 20B, an insulator 544 is preferably positioned between the insulator 580 and the oxide 530a, the oxide 530b, the conductor 542a, and the conductor 542b. Furthermore, as illustrated in FIG. 20A and FIG. 20B, the conductor 560 preferably includes a conductor 560a provided inside the insulator 545 and a conductor 560b provided to be embedded inside the conductor 560a. Moreover, as illustrated in FIG. 20A and FIG. 20B, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 19, FIG. 20A, and FIG. 20B is an example, and the structures are not limited thereto; an appropriate transistor can be used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a gate or a top gate) electrode. In addition, the conductor 503 sometimes functions as a second gate (also referred to as a back gate or a bottom gate) electrode. In that case, the threshold voltage of the transistor 500 can be controlled by changing a potential applied to the conductor 503 not in synchronization with but independently of a voltage applied to the conductor 560. In particular, when a negative potential is applied to the conductor 503, the threshold voltage of the transistor 500 can be further increased, and the off-state current can be reduced. Thus, drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material having a function of preventing diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 is illustrated to have a stacked layer of the conductor 503a and the conductor 503b in this embodiment, the conductor 503 may have a single-layer structure.

The insulator 520, the insulator 522 and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_OH$ is sufficiently reduced. When an oxide semiconductor with sufficiently reduced $V_OH$ is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O + H$" occurs. Part of hydrogen generated at this time is bonded to oxygen to be $H_2O$, and removed from the oxide 530 or an insulator in the vicinity of the oxide 530 in some cases. Some hydrogen may be gettered into the conductor 542a and the conductor 542b in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, heat treatment may be performed in a nitrogen gas or inert gas atmosphere successively after heat treatment is performed in an atmosphere containing an oxidizing gas at 10 ppm or more, 1% or more, or 10% or more.

Note that the oxygen adding treatment performed on the oxide 530 can promote a reaction in which oxygen vacancies in the oxide 530 are filled with supplied oxygen, i.e., a reaction of "$Vo + O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen and impurities, oxygen contained in the oxide 530 is not diffused to the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

It is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that in the transistor 500 in FIG. 20A and FIG. 20B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion of the oxide 530a and the oxide 530b. In other words, the energy level of the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above-described structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 20B, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as illustrated in FIG. 20B, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately determined in consideration of required transistor characteristics.

The insulator 544 can inhibit impurities such as water and hydrogen contained in the insulator 580 from diffusing into the oxide 530b. Furthermore, oxidation of the conductor 542a and the conductor 542b due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm. The above-described microwave treatment may be performed before and/or after the insulator 545 is formed.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as a leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained.

Furthermore, the stacked-layer structure can be thermally stable and have a high dielectric constant.

Although the conductor 560 that functions as the first gate electrode and has a two-layer structure is illustrated in FIG. 20B and FIG. 20C, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material that has a function of inhibiting the diffusion of oxygen (e.g., at least one of an oxygen atom, an oxygen molecule, and the like). When the conductor 560a has a function of inhibiting diffusion of oxygen, a reduction in conductivity of the conductor 560b due to oxidation caused by oxygen contained in the insulator 545 can be inhibited. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like is preferably contained as the insulator 580. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structure of the conductor 540a and the conductor 540b are similar to a structure of a conductor 546 and a conductor 548 that will be described later.

An insulator 582 is provided over the insulator 581. A substance having a barrier property against oxygen and hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 379 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

A ferroelectric can be used for the insulator 630. For the insulator 630, it is possible to use a material similar to the material that can be used for the ferroelectric layer 12 described in the above embodiment, for example. The insulator 630 may have a stacked-layer structure including a ferroelectric layer and a paraelectric layer, which is illustrated in any of FIG. 1B1 to FIG. 1B4.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. For the insulator 640, a material similar to that for the insulator 379 can be used. In addition, the insulator 640 may function as a planarization film that covers an uneven shape therebelow.

With the use of this structure, a semiconductor device using a transistor including an oxide semiconductor can be miniaturized or highly integrated.

At least part of the structure, method, and the like described in this embodiment can be implemented in appropriate combination with other embodiments, an example, or the like described in this specification.

Embodiment 4

Described in this embodiment is a metal oxide (hereinafter also referred to as an oxide semiconductor) that can be used in an OS transistor described in the above embodiment.

The metal oxide preferably contains at least one of indium and zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor is described with reference to FIG. 21A. FIG. 21A is a diagram showing classification of crystal structures of an oxide semiconductor, typically IGZO (a metal oxide containing In, Ga, and Zn).

As shown in FIG. 21A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite). Note that the term "Crystalline" excludes single crystal, poly crystal, and completely amorphous. The term "Crystal" includes single crystal and poly crystal.

Note that the structures in the thick frame in FIG. 21A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 21B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 21B and obtained by GIXD measurement is hereinafter simply referred to as an XRD spectrum. The vertical axis and the horizontal axis in FIG. 21B represent intensity and 2θ, respectively. The CAAC-IGZO film in FIG. 21B has a composition in the vicinity of In:Ga:Zn=4:2:3 [atomic ratio]. The CAAC-IGZO film in FIG. 21B has a thickness of 500 nm.

As shown in FIG. 21B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 21B, the peak at 2θ of around 310 is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 21C shows a diffraction pattern of a CAAC-IGZO film. FIG. 21C shows a diffraction pattern obtained with the NBED method in which an electron beam is incident in the direction parallel to the substrate. The CAAC-IGZO film in FIG. 21C has a composition in the vicinity of In:Ga:Zn=4:2:3 [atomic ratio]. In the nanobeam electron diffraction method, electron diffraction is performed with a probe diameter of 1 nm.

As shown in FIG. 21C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 21A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities, defects, and the like (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and an excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of the structure, method, and the like described in this embodiment can be implemented in appropriate combination with other embodiments, an example, or the like described in this specification.

Embodiment 5

In this embodiment, examples of a semiconductor wafer where the semiconductor device or the like described in the above embodiment is formed and electronic components incorporating the semiconductor device will be described.

<Semiconductor Wafer>

Figure 22A:
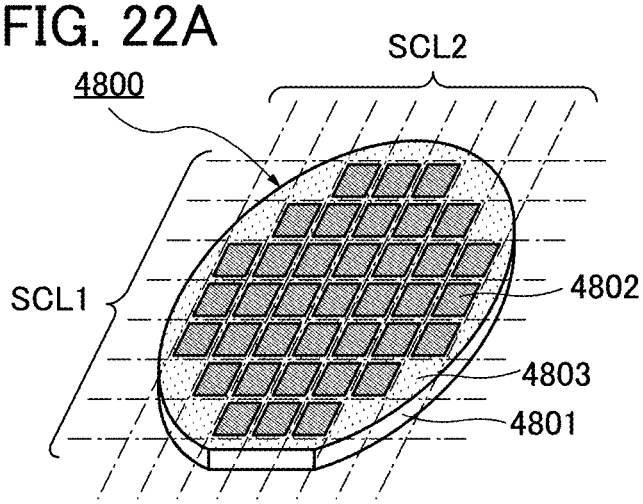
FIG. 22A is a perspective view illustrating an example of a semiconductor wafer.

First, an example of a semiconductor wafer where a semiconductor device or the like is formed is described using FIG. 22A.

A semiconductor wafer 4800 illustrated in FIG. 22A includes a wafer 4801 and a plurality of circuit portions 4802 provided on atop surface of the wafer 4801. Note that a portion without the circuit portion 4802 on the top surface of the wafer 4801 is a spacing 4803 that is a region for dicing.

The semiconductor wafer 4800 can be manufactured by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. Dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 22B:
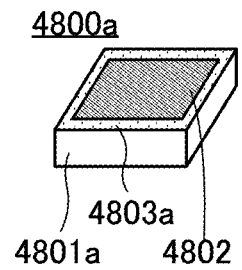
FIG. 22B is a perspective view illustrating an example of a chip.

With the dicing step, a chip 4800a as illustrated in FIG. 22B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 22A. The element substrate may be a rectangular semiconductor wafer, for example. The shape of the element substrate can be changed as appropriate, depending on a manufacturing process of an element and an apparatus for manufacturing the element.

<Electronic Component>

Figure 22C:
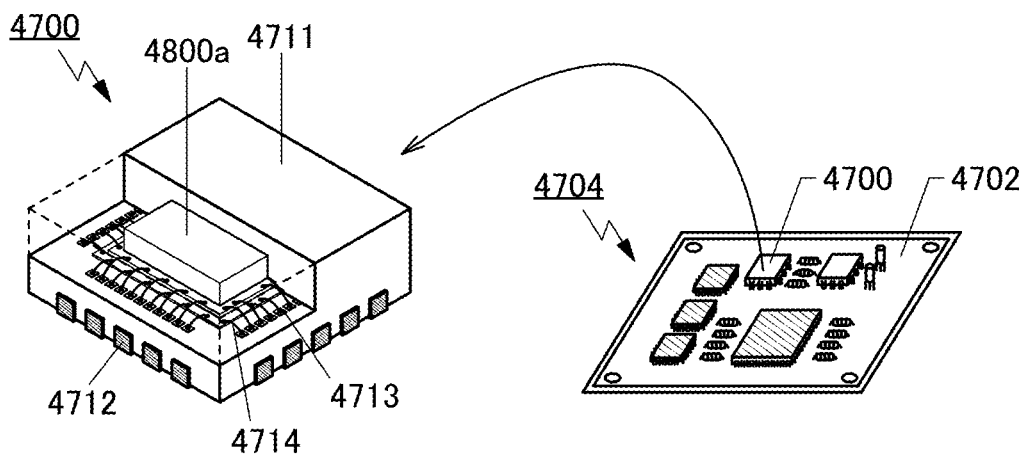
FIG. 22C and FIG. 22D are perspective views illustrating examples of electronic components.

FIG. 22C illustrates a perspective view of an electronic component 4700 and a substrate (a mounting board 4704) on which the electronic component 4700 is mounted. The electronic component 4700 illustrated in FIG. 22C includes a chip 4800a in a mold 4711. As the chip 4800a, the memory device or the like of one embodiment of the present invention can be used.

To illustrate the inside of the electronic component 4700, some portions are omitted in FIG. 22C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, so that the mounting board 4704 is completed.

Figure 22D:
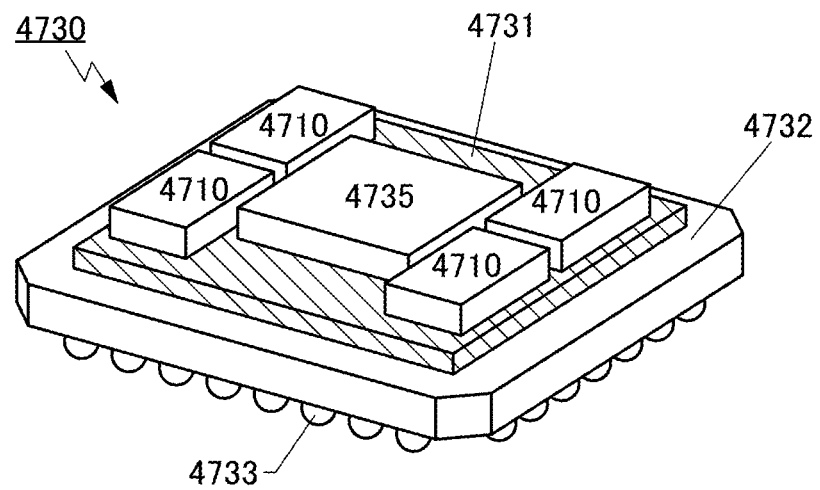

FIG. 22D illustrates a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

Examples of the semiconductor device 4710 include the chip 4800a, the semiconductor device described in the above embodiment, and a high bandwidth memory (HBM). In addition, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. In addition, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. Furthermore, a through electrode is provided in the interposer 4731 and the through electrode is used to electrically connect an integrated circuit and the package substrate 4732 in some cases. Moreover, in the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In addition, in a SiP, an MCM, or the like using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In addition, a heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 22D illustrates an example in which the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

At least part of the structure, method, and the like described in this embodiment can be implemented in appropriate combination with other embodiments, an example, or the like described in this specification.

Embodiment 6

In this embodiment, application examples of the semiconductor device of one embodiment of the present invention will be described.

The semiconductor device of one embodiment of the present invention can be applied to, for example, memory devices of a variety of electronic devices (e.g., information terminals, computers, smartphones, e-book readers, digital still cameras, video cameras, video recording/reproducing devices, navigation systems, game machines, and the like). In addition, the semiconductor device can also be used for image sensors, IoT (Internet of Things), healthcare, and the like. Note that here, the computers refer not only to tablet computers, laptop computers, and desktop computers, but also to large computers such as server systems.

An example of an electronic device including a semiconductor device of one embodiment of the present invention is described. Note that FIG. 23A to FIG. 23J and FIG. 24A to FIG. 24E each illustrate a state where the electronic component 4700 or the electronic component 4730, each of which includes the semiconductor device, is included in an electronic device.

[Cellular Phone]

Figure 23A:
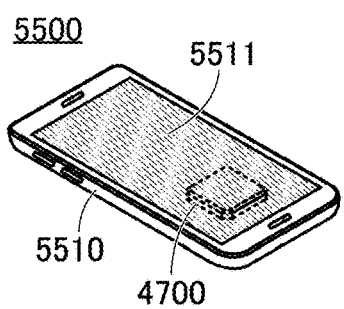
FIG. 23A to FIG. 23J are diagrams illustrating examples of electronic devices.

An information terminal 5500 illustrated in FIG. 23A is a cellular phone (smartphone), which is a type of information terminal. The information terminal 5500 includes a housing 5510 and a display portion 5511, and as input interfaces, a touch panel is provided in the display portion 5511 and a button is provided in the housing 5510.

By applying the semiconductor device of one embodiment of the present invention to the information terminal

5500, the information terminal 5500 can retain a temporary file generated at the time of executing an application (e.g., a web browser's cache or the like).

[Wearable Terminal]

Figure 23B:
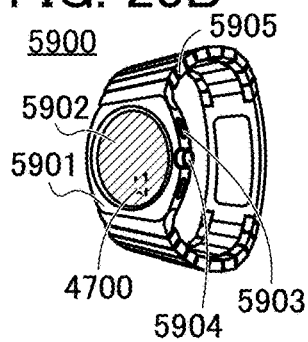

In addition, FIG. 23B illustrates an information terminal 5900 that is an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by applying the semiconductor device of one embodiment of the present invention to the wearable terminal.

[Information Terminal]

Figure 23C:
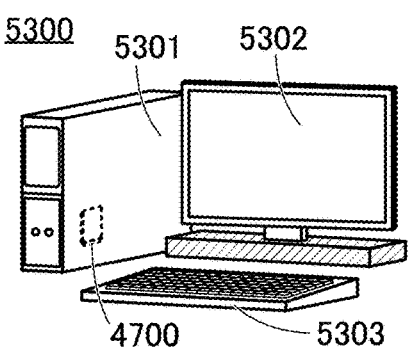

In addition, FIG. 23C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application applying the semiconductor device of one embodiment of the present invention to the desktop information terminal 5300.

Note that although the smartphone, the wearable terminal, and the desktop information terminal are respectively illustrated in FIG. 23A to FIG. 23C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

Figure 23D:
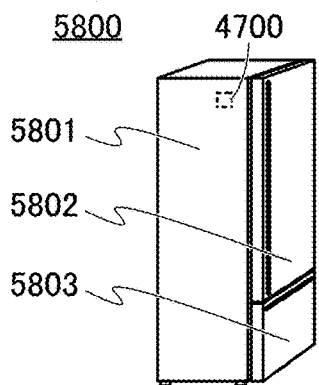

In addition, FIG. 23D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The semiconductor device of one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal and the like via the Internet. In the electric refrigerator-freezer 5800, the semiconductor device can retain a temporary file generated at the time of transmitting the information.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, an audiovisual appliance, and the like.

[Game Machine]

Figure 23E:
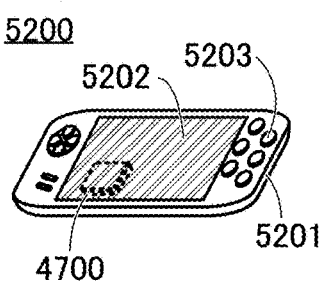

In addition, FIG. 23E illustrates a portable game machine 5200 as an example of a game machine. The portable game machine 5200 includes a housing 5201, a display portion 5202, a button 5203, and the like.

Figure 23F:
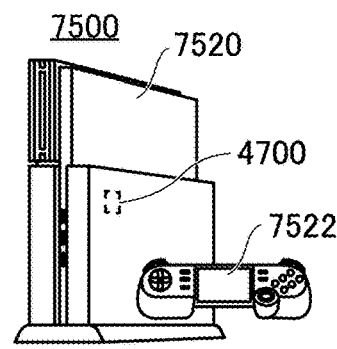

In addition, FIG. 23F illustrates a stationary game machine 7500 as another example of a game machine. The stationary game machine 7500 includes a main body 7520 and a controller 7522. Note that the controller 7522 can be connected to the main body 7520 with or without a wire. Furthermore, although not illustrated in FIG. 23F, the controller 7522 can include a display portion that displays a game image, and an input interface besides a button, such as a touch panel, a stick, a rotating knob, and a sliding knob, for example. Moreover, the shape of the controller 7522 is not limited to that illustrated in FIG. 23F, and the shape of the controller 7522 may be changed in various ways in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

In addition, videos displayed on the game machine can be output with a display device such as a television device, a personal computer display, a game display, or a head-mounted display.

The semiconductor device described in the above embodiment is employed for the portable game machine 5200 or the stationary game machine 7500, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Moreover, the semiconductor device described in the above embodiment is employed for the portable game machine 5200 or the stationary game machine 7500, so that it is possible to retain a temporary file necessary for arithmetic operation that occurs during game play.

As an example of a game machine, FIG. 23E illustrates a portable game machine. In addition, FIG. 23F illustrates a home-use stationary game machine. Note that an electronic device of one embodiment of the present invention is not limited thereto. Examples of the electronic device of one embodiment of the present invention include an arcade game machine installed in entertainment facilities (a game center, an amusement park, and the like), a throwing machine for batting practice installed in sports facilities, and the like.

[Moving Vehicle]

The semiconductor device described in the above embodiment can be used for an automobile, which is a moving vehicle, and around the driver's seat in an automobile.

Figure 23G:
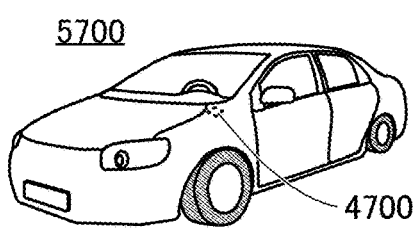

FIG. 23G illustrates an automobile 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the automobile 5700. In addition, a display device showing the above information may be provided around the driver's seat.

In particular, the display device can compensate for the view obstructed by a pillar or the like, blind areas for the driver's seat, and the like by displaying a video from an imaging device (not illustrated) provided for the automobile 5700, which can increase safety. That is, display of an image from an imaging device provided on the outside of the automobile 5700 can fill in blind areas and increase safety.

The semiconductor device described in the above embodiment can temporarily retain data. Thus, the semiconductor device can be used to retain temporary data necessary in an automatic driving system for the automobile 5700 or a system for navigation and risk prediction, for example. The display device may be configured to display temporary information regarding navigation, risk prediction, or the like. Moreover, the semiconductor device may be configured to hold a video of a driving recorder provided in the automobile 5700.

Note that although an automobile is described above as an example of a moving vehicle, the moving vehicle is not limited to an automobile. Examples of moving vehicles include a train, a monorail train, a ship, a flying object (a helicopter, an unmanned aircraft (a drone), an airplane, and a rocket), and the like.

[Camera]

The semiconductor device described in the above embodiment can be employed for a camera.

Figure 23H:
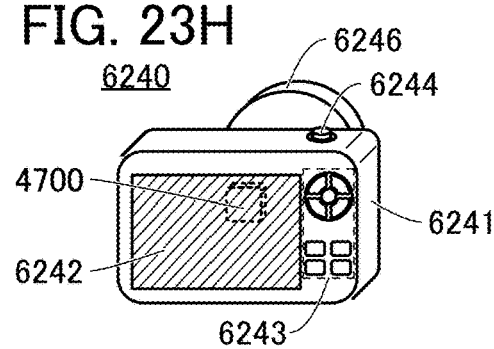

FIG. 23H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Note that here, although the camera 6240 is configured such that the lens 6246 is detachable from the housing 6241 for replacement, the lens 6246 may be integrated with the housing 6241. In addition, the digital camera 6240 can be additionally equipped with a stroboscope, a viewfinder, or the like.

When the semiconductor device described in the above embodiment is employed for the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The semiconductor device described in the above embodiment can be employed for a video camera.

Figure 23I:
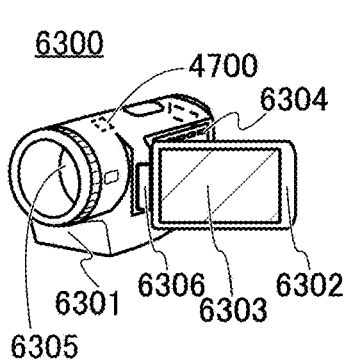

FIG. 23I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above semiconductor device, the video camera 6300 can retain a temporary file generated in encoding.

[ICD]

The semiconductor device described in the above embodiment can be employed for an implantable cardioverter-defibrillator (ICD).

Figure 23J:
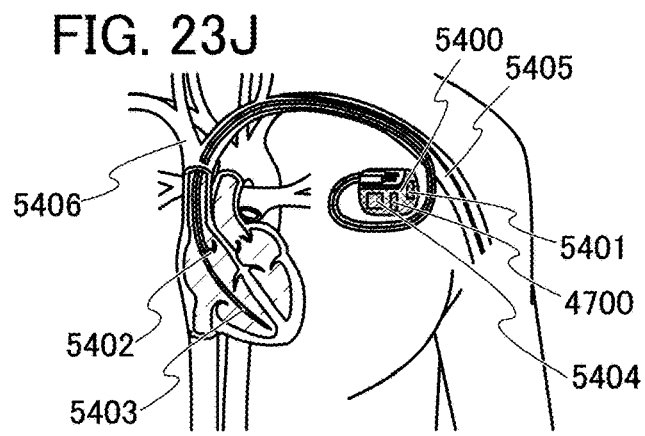

FIG. 23J is a schematic cross-sectional view showing an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing and ventricular tachycardia, ventricular fibrillation, or the like keeps occurring, treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 4700.

In addition, the antenna 5404 can receive power, and the battery 5401 is charged with the power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The semiconductor device described in the above embodiment can be employed for a calculator such as a PC (Personal Computer) and an expansion device for an information terminal.

Figure 24A:
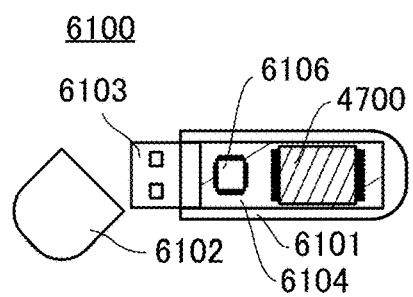
FIG. 24A to FIG. 24E are diagrams illustrating examples of electronic devices.

FIG. 24A illustrates, as an example of the expansion device, a portable expansion device 6100 that includes a chip capable of holding information and is externally provided on a PC. The expansion device 6100 can store information using the chip when connected to a PC with a USB (Universal Serial Bus) or the like, for example. Note that FIG. 24A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with the electronic component 4700 and a controller chip 6106. The USB connector 6103 functions as an interface for connection to an external device.

[SD Card]

The semiconductor device described in the above embodiment can be employed for an SD card that can be attached to an electronic device such as an information terminal or a digital camera.

Figure 24B:
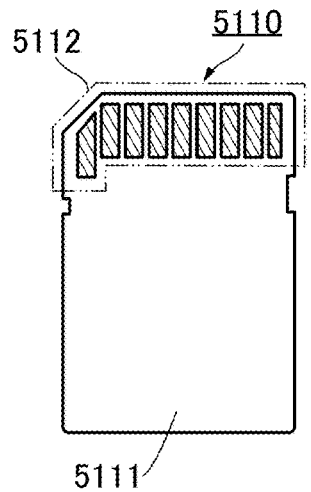
Figure 24C:
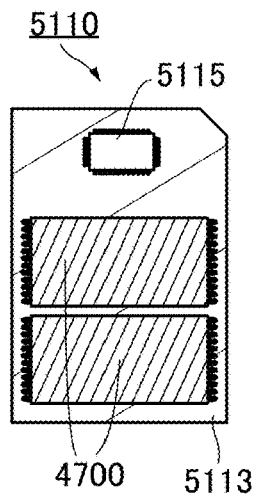

FIG. 24B is a schematic external view of an SD card, and FIG. 24C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a semiconductor device and a circuit for driving the semiconductor device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from and to the electronic components 4700.

[SSD]

The semiconductor device described in the above embodiment can be employed for an SSD (Solid State Drive) that can be attached to an electronic device such as an information terminal.

Figure 24D:
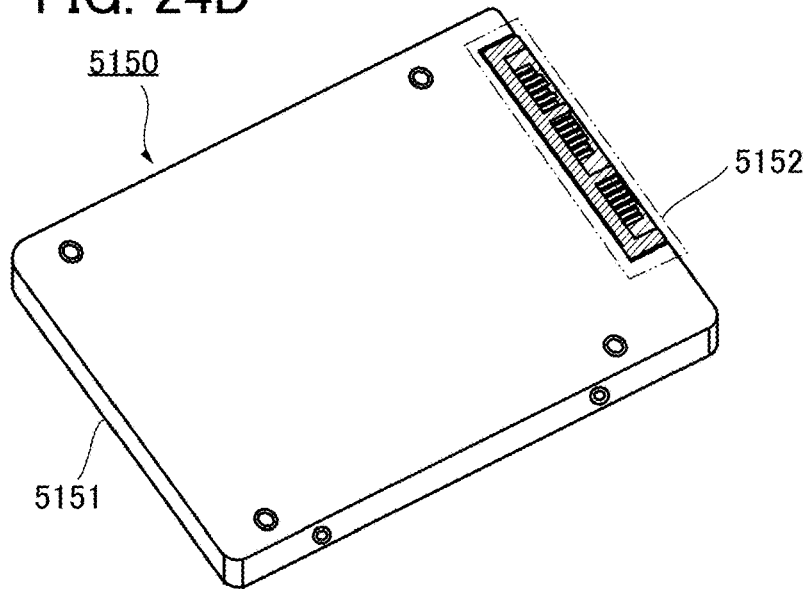
Figure 24E:
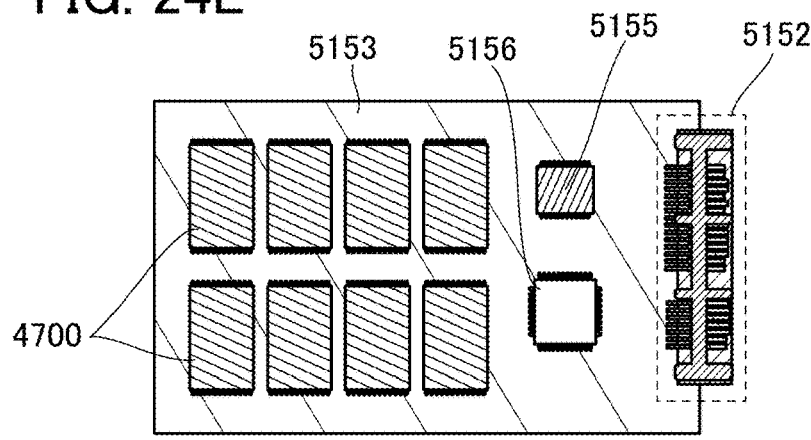

FIG. 24D is a schematic external view of an SSD, and FIG. 24E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a semiconductor device and a circuit for driving the semiconductor device. For example, the electronic components 4700, a memory chip 5155, and a controller chip 5156 are attached to the substrate 5153. When the electronic components 4700 are also provided on a rear surface side of the substrate 5153, the capacity of the SSD 5150 can be increased. A work memory is incorporated in the memory chip 5155. For example, a DRAM chip is used as the memory chip 5155. A processor, an ECC circuit, and the like are incorporated in the controller chip 5156. Note that the circuit structures of the electronic components 4700, the memory chip 5155, and the controller chip 5156 are not limited to those described above, and the circuit structures can be changed as appropriate according to circumstances. For example, a memory functioning as a work memory may also be provided in the controller chip 5156.

[Computer]

Figure 25A:
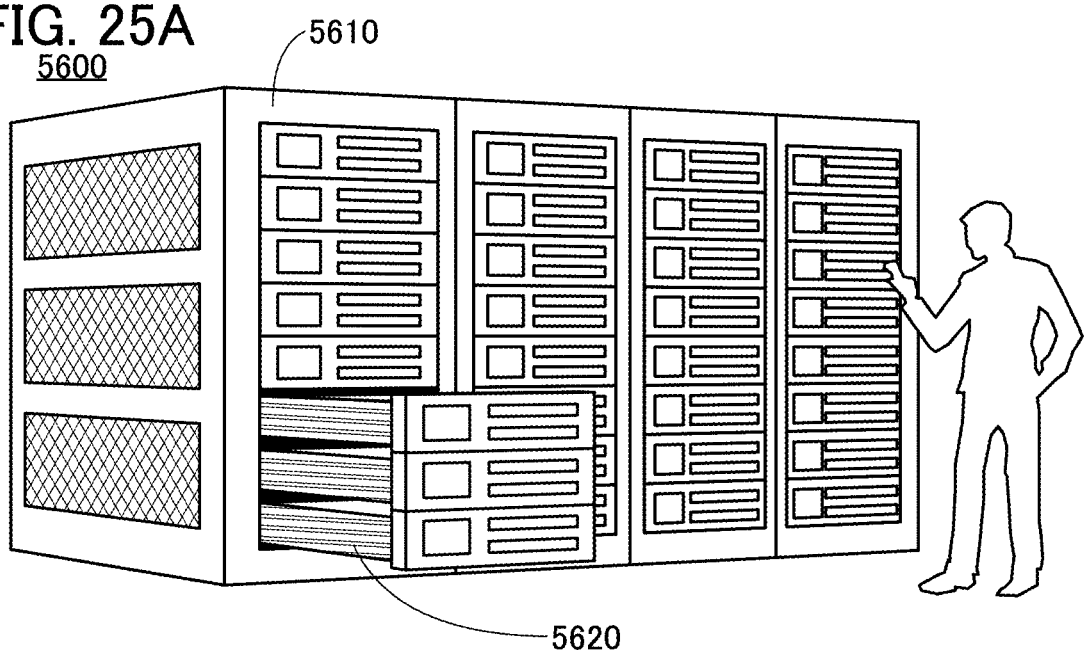
FIG. 25A to FIG. 25C are diagrams illustrating an example of an electronic device.

A computer 5600 illustrated in FIG. 25A is an example of a large computer. In the computer 5600, a plurality of rack mount computers 5620 are stored in a rack 5610.

Figure 25B:
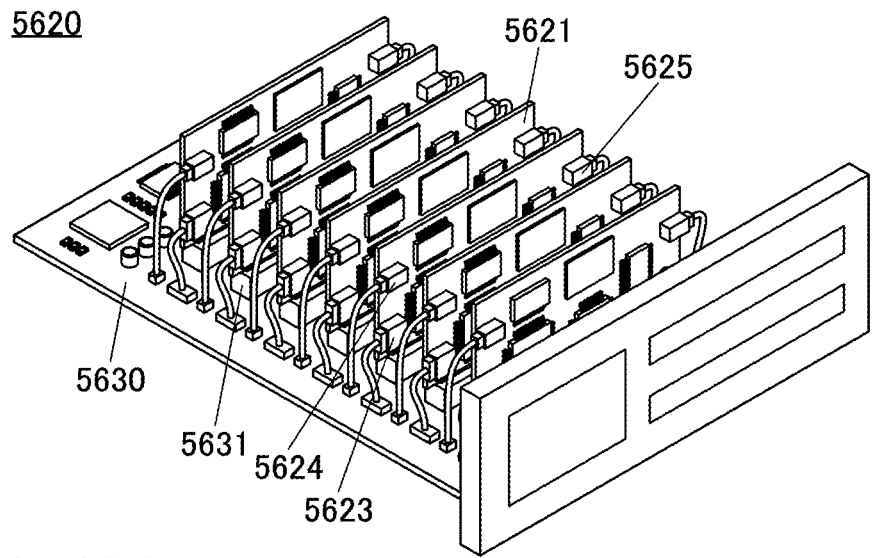

The computer 5620 can have a structure in a perspective view illustrated in FIG. 25B, for example. In FIG. 25B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 25C:
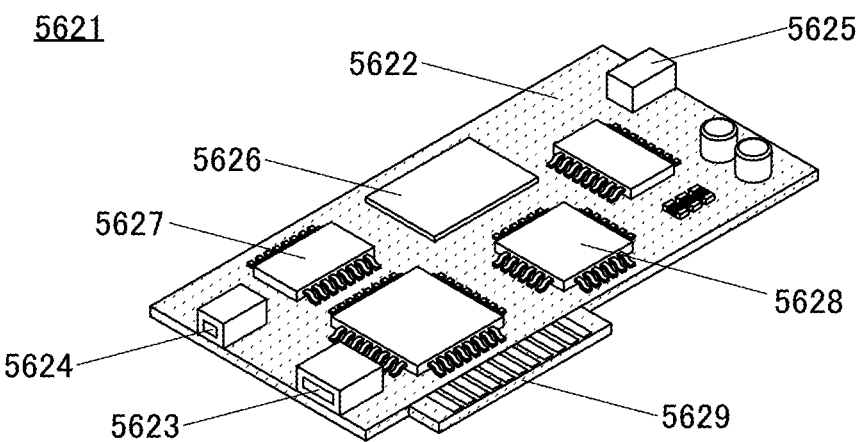

The PC card 5621 illustrated in FIG. 25C is an example of a processing board provided with a CPU, a GPU, a semiconductor device, and the like. The PC card 5621 includes a board 5622. In addition, the board 5622 includes a connection terminal 5623, a connection terminal 5624, a connection terminal 5625, a semiconductor device 5626, a semiconductor device 5627, a semiconductor device 5628, and a connection terminal 5629. Note that FIG. 25C also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe or the like.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), SCSI (Small Computer System Interface), and the like. In the case where video signals are output from the connection terminal 5623, the connection terminal 5624, and the connection terminal 5625, an example of the standard therefor is HDMI (registered trademark) or the like.

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, a CPU, and the like. As the semiconductor device 5627, the electronic component 4730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device or the like. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

When the semiconductor device of one embodiment of the present invention is used in a variety of electronic devices or the like described above, power consumption of the electronic device can be reduced.

At least part of the structure, method, and the like described in this embodiment can be implemented in appropriate combination with other embodiments, an example, or the like described in this specification.

Example

In this example, a TEG (Test Element Group) sample for measuring off-state current and a TEG sample for measuring capacitor leakage current each including the transistor 500 illustrated in FIG. 20A to FIG. 20C were fabricated, and temperature dependences were estimated.

[Measurement of Off-State Current]

First, the structure of the TEG sample for measuring off-state current including the transistor 500 is described. As illustrated in FIG. 20A to FIG. 20C, the sample includes the insulator 512 placed over a substrate (not illustrated); the insulator 514 over the insulator 512; the insulator 516 placed over the insulator 514; the conductor 503 placed to be embedded in the insulator 516; the insulator 520 placed over the insulator 516 and the conductor 503; the insulator 522 placed over the insulator 520; the insulator 524 placed over the insulator 522; the oxide 530a placed over the insulator 524; the oxide 530b placed over the oxide 530a; the region 543a and the region 543b provided apart from each other in the oxide 530b; the conductor 542a placed over the region 543a; the conductor 542b placed over the region 543b; the insulator 544 placed over the conductor 542a, a conductor 524b, and the insulator 524; the insulator 580 placed over the insulator 544; the insulator 545 placed over the oxide 530b; the conductor 560 placed over the insulator 545; the insulator 574 placed over the insulator 580 and the conductor 560; and the insulator 581 placed over the insulator 574.

As the oxide 530a, a 10-nm-thick In—Ga—Zn oxide deposited by a DC sputtering method was used. In the deposition of the oxide 530a, a target with In:Ga:Zn=1:3:4 [atomic ratio] was used.

As the oxide 530b, a 15-nm-thick In—Ga—Zn oxide deposited by a DC sputtering method was used. In the deposition of the oxide 530b, a target with In:Ga:Zn=1:1:2 [atomic ratio] was used.

The insulator 545 had a stacked-layer structure of four layers. The first layer of the insulator 545 was 1-nm-thick aluminum oxide deposited by an ALD method. The second layer of the insulator 545 was 5-nm-thick silicon oxynitride deposited by a CVD method. The third layer of the insulator 545 was 1.5-nm-thick hafnium oxide deposited by an ALD method. The fourth layer of the insulator 545 was 1-nm-thick silicon nitride deposited by an ALD method. Microwave treatment was performed after the deposition of the second layer of the insulator 545 and after the deposition of the third layer of the insulator 545. In the microwave treatment, an argon gas and an oxygen gas were used as treatment gases, the treatment temperature was 400° C., and the treatment time was 600 seconds.

Note that the sample includes the conductors 540 in addition to the above components. After the fabrication of the sample, heat treatment was performed at a temperature of 400° C. in a nitrogen atmosphere for 8 hours. In the above manner, the TEG sample for measuring off-state current including the transistor 500 was fabricated.

Figure 26:
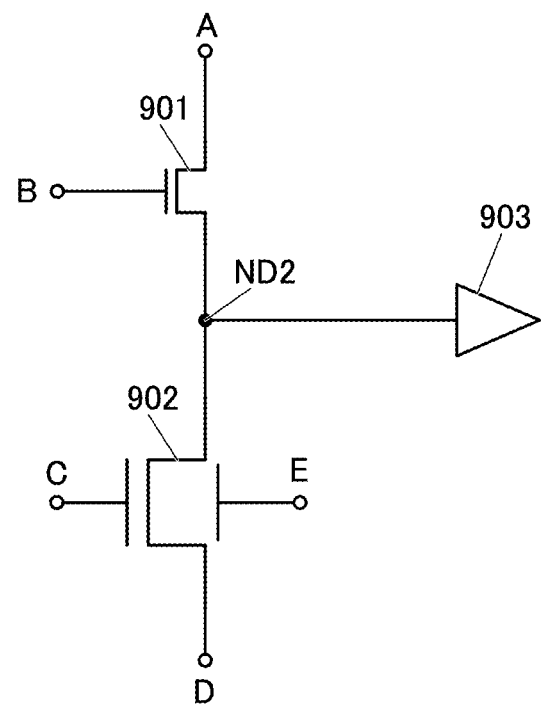
FIG. 26 is a circuit diagram schematically illustrating a TEG for measuring off-state current in Example.

Next, a circuit diagram schematically illustrating the TEG for measuring off-state current is illustrated in FIG. 26. The TEG for off-state current includes terminals A to E, a transistor 901, a transistor 902, a reading circuit 903, and a node ND2. The transistor 901 is a write transistor for supplying a potential to the node ND2. The transistor 902 is a transistor which is a target of the measurement of off-state current. As the transistor 902, 20000 transistors each having a designed channel length of 60 nm and a designed channel width of 60 nm are connected in parallel. In other words, the transistor 902 has a designed channel length of 60 nm and a designed channel width of (60 nm×20000=1.2 mm).

One of a source and a drain of the transistor 901 is electrically connected to the terminal A. The other of the source and the drain of the transistor 901 is electrically connected to the node ND2. A gate of the transistor 901 is electrically connected to the terminal B. One of a source and a drain of the transistor 902 is electrically connected to the node ND2. The other of the source and the drain of the transistor 902 is electrically connected to the terminal D. A gate of the transistor 902 is electrically connected to the terminal C. A bottom gate of the transistor 902 is electrically connected to the terminal E. The reading circuit 903 is electrically connected to the node ND2. The reading circuit 903 can read the potential of the node ND2 constantly.

Next, a method for measuring the off-state current is described. First, a potential V11 at which the transistor 901 is brought into an on state is supplied to the terminal B to bring the transistor 901 into an on state. Then, a potential V12 is supplied to the terminal A until the potential of the node ND2 becomes V12. In this example, V12 was 1.2 V. Next, a potential V13 at which the transistor 901 is brought into an off state is supplied to the terminal B to bring the transistor 901 into an off state. Note that the transistor 902 is always in an off state as long as a potential of −2 V, a potential of −3 V, and a potential of 0 V are supplied to the terminal C, the terminal E, and the terminal D, respectively.

A change in the potential of the node ND2 over the time elapsed after the transistor 901 is brought into an off state in the above manner is read by the reading circuit 903, whereby leakage current, that is, off-state current, of the transistor 902 can be calculated. Specifically, the off-state current of the transistor 902 is calculated using $I_{off}=C_{ND} \times \Delta V_{ND}/t$, where $I_{off}$ is the off-state current, $CN_D$ is the capacitance of the node ND2, $\Delta V_{ND}$ is the change in the potential of the node ND2, and t is the elapsed time. Note that a designed channel length and a designed channel width of the transistor 901 are 500 nm and 60 nm, respectively, so that the channel width of the transistor 901 is 1/20000 of the channel width of the transistor 902; accordingly, the off-state current of the transistor 901 is negligible.

In a measurement environment at a temperature of 150° C., the change $\Delta V_{ND}$ in the potential of the node ND2 in an elapsed time of 1 hour was read; in a measurement environment at a temperature of 125° C., the change $\Delta V_{ND}$ in the potential of the node ND2 in an elapsed time of 1 hour was read; in a measurement environment at a temperature of 100° C., the change $\Delta V_{ND}$ in the potential of the node ND2 in an elapsed time of 2 hours was read; and in a measurement environment at a temperature of 85° C., the change $\Delta V_{ND}$ in the potential of the node ND2 in an elapsed time of 4 hours was read.

Figure 28:
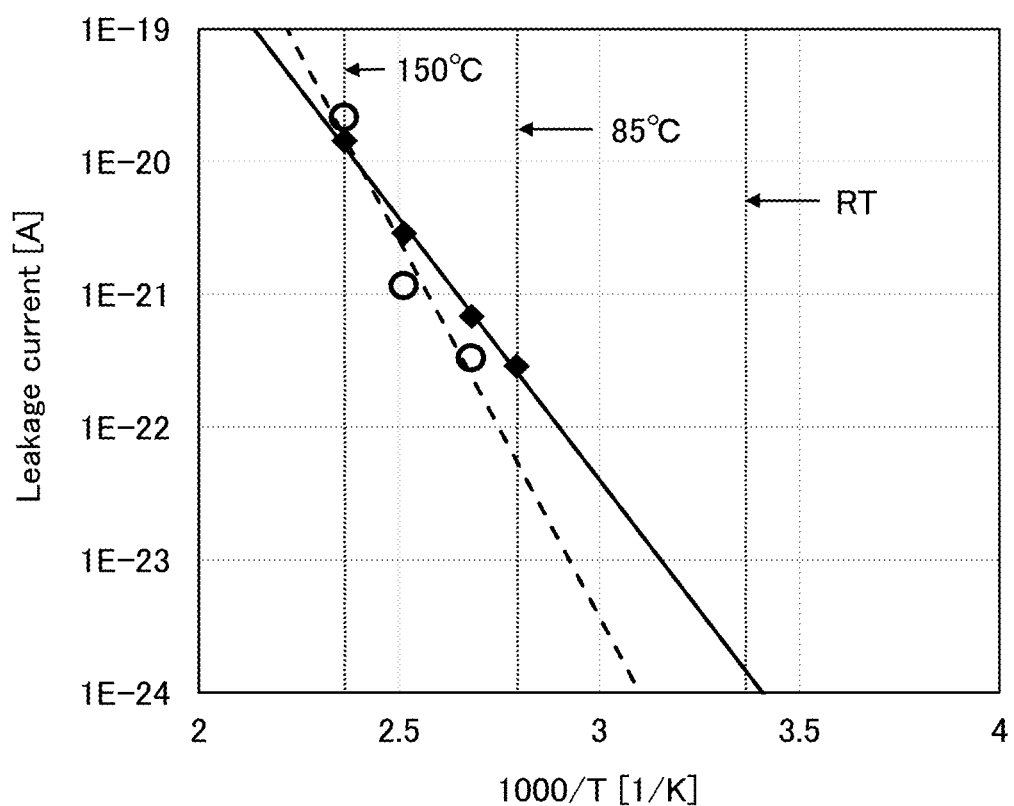
FIG. 28 is a graph showing temperature dependence of leakage current in Example.

FIG. 28 is a graph showing temperature dependence of the off-state current of the transistor 902. In FIG. 28, the horizontal axis represents 1000 times the inverse of the absolute temperature T [K], and the vertical axis represents the leakage current (off-state current). The off-state currents of the transistor 902 at the temperatures are plotted as rhombi in FIG. 28. An off-state current of $1.4 \times 10^{-20}$ (A) was obtained at a temperature of 150° C., an off-state current of $2.9 \times 10^{-21}$ (A) was obtained at a temperature of 125° C., an off-state current of $6.9 \times 10^{-22}$ (A) was obtained at a temperature of 100° C., and an off-state current of $2.9 \times 10^{-22}$ (A) was obtained at a temperature of 85° C. An approximate straight line is shown by a solid line. When the approximate straight line was extrapolated to room temperature (RT), the off-state current at room temperature was estimated to be extremely low, i.e., approximately $2 \times 10^{-24}$ (A). The above showed that the off-state current had temperature dependence.

[Measurement of Capacitor Leakage Current]

Next, the structure of the TEG sample for measuring capacitor leakage current including the transistor 500 is described. The TEG sample for measuring capacitor leakage current includes components of a capacitor in addition to the components of the TEG sample for measuring off-state current described in [Measurement of off-state current] above.

Figure 27A:
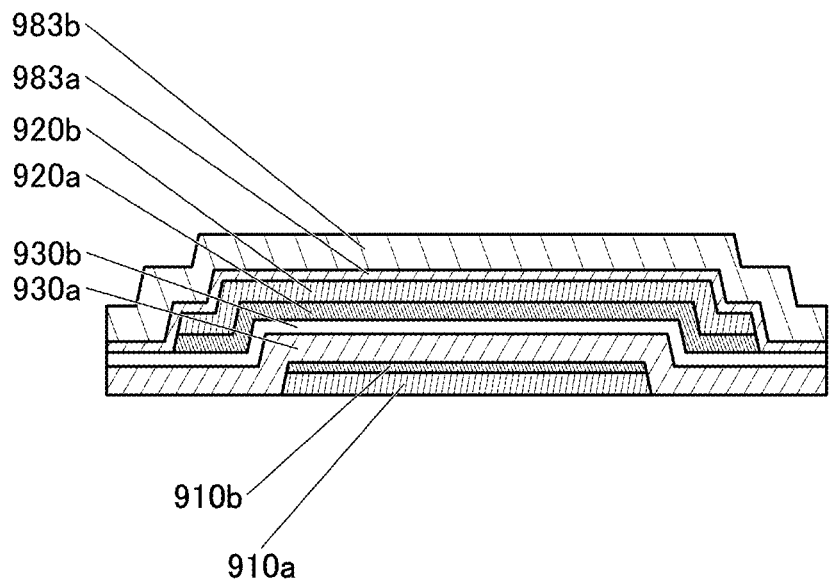
FIG. 27A is a cross-sectional view illustrating a structure of a capacitor in Example.

FIG. 27A is a cross-sectional view illustrating the components of the capacitor. The capacitor includes a conductor 910a over the transistor 500 (not illustrated), a conductor 910b over the conductor 910a, a dielectric 930a that covers the conductor 910a and the conductor 910b, a dielectric 930b over the dielectric 930a, a conductor 920a over the dielectric 930b, a conductor 920b over the conductor 920a, an insulator 983a that covers the conductor 920a and the conductor 920b, and an insulator 983b over the insulator 983a.

As the conductor 910a, 30-nm-thick tungsten deposited by a sputtering method was used. As the conductor 910b, 5-nm-thick titanium nitride deposited by a CVD method was used. Note that the conductor 910a and the conductor 910b function as a lower electrode of the capacitor.

As the dielectric 930a, 14-nm-thick aluminum oxide deposited by an ALD method was used. As the dielectric 930b, 7-nm-thick silicon oxynitride deposited by a CVD method was used. Note that the dielectric 930a and the dielectric 930b function as a dielectric of the capacitor.

As the conductor 920a, 10-nm-thick titanium nitride deposited by a CVD method was used. As the conductor 920b, 20-nm-thick tungsten deposited by a sputtering method was used. Note that the conductor 920a and the conductor 920b function as an upper electrode of the capacitor.

As the insulator 983a, 5-nm-thick aluminum oxide deposited by an ALD method was used. As the insulator 983b, 35-nm-thick aluminum oxide deposited by a sputtering method was used. Note that the insulator 983a and the insulator 983b function as a passivation film. After the formation of the capacitor, heat treatment was performed at a temperature of 400° C. in a nitrogen atmosphere for 8 hours. In the above manner, the TEG sample for measuring capacitor leakage current was fabricated.

Figure 27B:
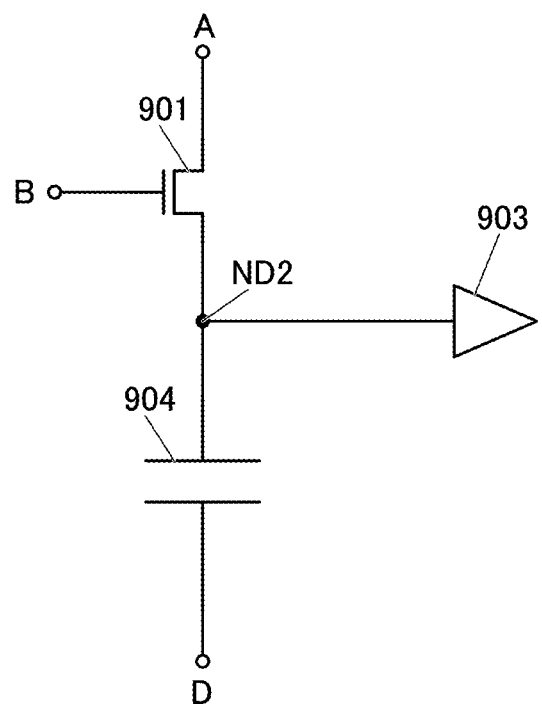
FIG. 27B is a circuit diagram schematically illustrating a TEG for measuring capacitor leakage current in Example.

Next, a circuit diagram schematically illustrating the TEG for measuring capacitor leakage current is illustrated in FIG. 27B. The TEG for measuring capacitor leakage current includes the terminal A, the terminal B, the terminal D, the transistor 901, a capacitor 904, the reading circuit 903, and the node ND2. The transistor 901 is a write transistor for supplying a potential to the node ND2. The capacitor 904 is a capacitor which is a target of the measurement of capacitor leakage current. As the capacitor 904, 60000 capacitors each having an electrostatic capacitance of 4.26 fF and the structure illustrated in FIG. 27A are connected in parallel.

The one of the source and the drain of the transistor 901 is electrically connected to the terminal A. The other of the source and the drain of the transistor 901 is electrically connected to the node ND2. The gate of the transistor 901 is electrically connected to the terminal B. One electrode of the capacitor 904 is electrically connected to the node ND2. The other electrode of the capacitor 904 is electrically connected to the terminal D. The reading circuit 903 is electrically connected to the node ND2. The reading circuit 903 can read the potential of the node ND2 constantly.

Next, a method for measuring the capacitor leakage is described. First, the potential V11 at which the transistor 901 is brought into an on state is supplied to the terminal B to bring the transistor 901 into an on state. Then, the potential V12 is supplied to the terminal A until the potential of the node ND2 becomes V12. In this example, V12 was 1.2 V. Furthermore, 0 V was supplied to the terminal D.

A change in the potential of the node ND2 over the time elapsed after the transistor 901 is brought into an off state in the above manner is read by the reading circuit 903, whereby leakage current of the capacitor 904 can be calculated. Specifically, the capacitor leakage current is calculated using $I_{CS}=C_{CS} \times \Delta V_{ND}/t$, where $I_{CS}$ is the capacitor leakage current, $C_{CS}$ is the capacitance of the capacitor 904, $\Delta V_{ND}$ is the change in the potential of the node ND2, and t is the elapsed time. Note that a change in the potential of the node ND2 due to the off-state current of the transistor 901 is negligibly small.

In a measurement environment at a temperature of 150° C., the change $\Delta V_{ND}$ in the potential of the node ND2 in an elapsed time of 1 hour was read; in a measurement environment at a temperature of 125° C., the change $\Delta V_{ND}$ in the potential of the node ND2 in an elapsed time of 4 hours was read; and in a measurement environment at a temperature of 100° C., the change $\Delta V_{ND}$ in the potential of the node ND2 in an elapsed time of 8 hours was read.

FIG. 28 is a graph showing temperature dependence of the leakage current of the capacitor 904. As described above, the horizontal axis in FIG. 28 represents 1000 times the inverse of the absolute temperature T [K], and the vertical axis represents the leakage current. The leakage currents of the capacitor 904 at the temperatures are plotted as white circles in FIG. 28. A leakage current of $2.2 \times 10^{-20}$ (A) was obtained at a temperature of 150° C., a leakage current of $1.2 \times 10^{-21}$ (A) was obtained at a temperature of 125° C., and a leakage current of $3.3 \times 10^{-22}$ (A) was obtained at a temperature of 100° C. An approximate straight line is shown by a dashed line. It was found that, according to the approximate straight line, the capacitor leakage current decreased as the temperature became lower. The capacitor leakage current at room temperature was estimated to be extremely low. The above showed that the capacitor leakage current had temperature dependence.

At least part of the structure, method, and the like described in this example can be implemented in appropriate combination with other embodiments or the like described in this specification.

REFERENCE NUMERALS

10: cell, 11: capacitor, 12: ferroelectric layer, 12a: ferroelectric layer, 12b: ferroelectric layer, 13a: electrode, 13b: electrode, 14: paraelectric layer, 14a: paraelectric layer, 14b: paraelectric layer, 21: transistor, 22: transistor, 23: transistor, 31: wiring, 32: wiring, 33: wiring, 41: wiring, 42: wiring, 43: wiring, 44: wiring, 51: curve, 52: curve, 60: semiconductor device, 61: cell array, 62: circuit, 63: circuit, 100: neural network, 110: arithmetic circuit, 328: conductor, 330: conductor, 350: insulator, 352: insulator, 354: insulator, 356: conductor, 360: insulator, 362: insulator, 364: insulator, 366: conductor, 368: insulator, 369: insulator, 370: insulator, 371: substrate, 372: well region, 373: insulator, 374: oxide layer, 375: semiconductor region, 376: conductor, 376a: low-resistance region, 376b: low-resistance region, 376c: low-resistance region, 377: insulator, 378: conductor, 379: insulator, 380: insulator, 381: insulator, 382: insulator, 383: insulator, 384: insulator, 385: insulator, 386: insulator, 500: transistor, 503: conductor, 503a: conductor, 503b: conductor, 510: insulator, 512: insulator, 514: insulator, 516: insulator, 518: conductor, 520: insulator, 522: insulator, 524:

insulator, 524b: conductor, 530: oxide, 530a: oxide, 530b: oxide, 540: conductor, 540a: conductor, 540b: conductor, 542a: conductor, 542b: conductor, 543a: region, 543b: region, 544: insulator, 545: insulator, 546: conductor, 548: conductor, 550: transistor, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 901: transistor, 902: transistor, 903: reading circuit, 904: capacitor, 910a: conductor, 910b: conductor, 920a: conductor, 920b: conductor, 930a: dielectric, 930b: dielectric, 983a: insulator, 983b: insulator, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display portion, 5303: keyboard, 5400: ICD main unit, 5401: battery, 5402: wire, 5403: wire, 5404: antenna, 5405: subclavian vein, 5406: superior vena cava, 5500: information terminal, 5510: housing, 5511: display portion, 5600: computer, 5610: rack, 5620: computer, 5621: PC card, 5622: board, 5623: connection terminal, 5624: connection terminal, 5625: connection terminal, 5626: semiconductor device, 5627: semiconductor device, 5628: semiconductor device, 5629: connection terminal, 5630: motherboard, 5631: slot, 5700: automobile, 5800: electric refrigerator-freezer, 5801: housing, 5802: refrigerator door, 5803: freezer door, 5900: information terminal, 5901: housing, 5902: display portion, 5903: operation switch, 5904: operation switch, 5905: band, 6100: expansion device, 6101: housing, 6102: cap, 6103: USB connector, 6104: substrate, 6106: controller chip, 6240: digital camera, 6241: housing, 6242: display portion, 6243: operation switch, 6244: shutter button, 6246: lens, 6300: video camera, 6301: housing, 6302: housing, 6303: display portion, 6304: operation switch, 6305: lens, 6306: connection portion, 7500: stationary game machine, 7520: main body, 7522: controller

The invention claimed is:

1. A driving method of a semiconductor device, the semiconductor device comprising a cell which comprises a capacitor, a first transistor, a second transistor, and a third transistor,
   wherein the capacitor comprises a first electrode, a second electrode, and a ferroelectric layer,
   wherein the ferroelectric layer is provided between the first electrode and the second electrode,
   wherein polarization reversal occurs in the ferroelectric layer by application of a first saturated polarization voltage or a second saturated polarization voltage whose polarity is different from a polarity of the first saturated polarization voltage,
   wherein the first electrode, one of a source and a drain of the first transistor, and a gate of the second transistor are electrically connected to one another,
   wherein one of a source and a drain of the second transistor is electrically connected to one of a source and a drain of the third transistor,
   wherein the driving method comprises the steps of:
   applying the first saturated polarization voltage to the ferroelectric layer in a first period; and
   applying a voltage having a value between the first saturated polarization voltage and the second saturated polarization voltage to the ferroelectric layer as a data voltage in a second period,
   wherein the first transistor is in an on state in the first period and the second period,
   wherein the first transistor is in an off state in a third period,
   wherein the third transistor is in an off state in the first to third periods, and
   wherein the third transistor is in an on state in a fourth period.

2. The driving method of the semiconductor device, according to claim 1,
   wherein a potential of the first electrode in the first period is different from a potential of the first electrode in the second period, and
   wherein a potential of the second electrode in the first period is different from a potential of the second electrode in the second period.

3. The driving method of the semiconductor device, according to claim 1,
   wherein the data voltage represents analog data.

4. The driving method of the semiconductor device, according to claim 1,
   wherein the first transistor comprises a metal oxide in a channel formation region.

5. The driving method of the semiconductor device, according to claim 1,
   wherein a potential of the second electrode is not changed in the second to fourth periods.

6. The driving method of the semiconductor device, according to claim 1,
   wherein a constant potential is supplied to the other of the source and the drain of the second transistor in the first to fourth periods.

7. A driving method of a semiconductor device, the semiconductor device comprising a cell which comprises a capacitor, a first transistor, and a second transistor,
   wherein the capacitor comprises a first electrode, a second electrode, and a ferroelectric layer,
   wherein the ferroelectric layer is provided between the first electrode and the second electrode,
   wherein polarization reversal occurs in the ferroelectric layer by application of a first saturated polarization voltage or a second saturated polarization voltage whose polarity is different from a polarity of the first saturated polarization voltage,
   wherein the first electrode, one of a source and a drain of the first transistor, and a gate of the second transistor are electrically connected to one another,
   wherein the driving method comprises the steps of:
   applying the first saturated polarization voltage to the ferroelectric layer in a first period; and
   applying a voltage having a value between the first saturated polarization voltage and the second saturated polarization voltage to the ferroelectric layer as a data voltage in a second period, and
   wherein a polarity of a polarization amount of the ferroelectric layer in the first period and a polarity of a polarization amount of the ferroelectric layer in the second period are the same.

8. The driving method of the semiconductor device, according to claim 7,
wherein the data voltage represents analog data.

9. The driving method of the semiconductor device, according to claim 7,
wherein the first transistor comprises a metal oxide in a channel formation region.

10. The driving method of the semiconductor device, according to claim 7,
wherein the first transistor is in an on state in the first period and the second period, and
wherein the first transistor is in an off state in a third period.

11. The driving method of the semiconductor device, according to claim 10,
wherein the cell comprises a third transistor,
wherein one of a source and a drain of the second transistor is electrically connected to one of a source and a drain of the third transistor,
wherein the third transistor is in an off state in the first to third periods, and
wherein the third transistor is in an on state in a fourth period.

12. The driving method of the semiconductor device, according to claim 11,
wherein the potential of the second electrode is not changed in the second to fourth periods.

13. The driving method of the semiconductor device, according to claim 12,
wherein a constant potential is supplied to the other of the source and the drain of the second transistor in the first to fourth periods.

14. A driving method of a semiconductor device, the semiconductor device comprising a cell which comprises a capacitor, a first transistor, a second transistor, and a third transistor,
wherein the capacitor comprises a first electrode, a second electrode, a ferroelectric layer, a first paraelectric layer, and a second paraelectric layer,
wherein the ferroelectric layer is provided between the first paraelectric layer and the second paraelectric layer,
wherein the first paraelectric layer is provided between the ferroelectric layer and the first electrode,
wherein the second paraelectric layer is provided between the ferroelectric layer and the second electrode,
wherein polarization reversal occurs in the ferroelectric layer by application of a first saturated polarization voltage or a second saturated polarization voltage whose polarity is different from a polarity of the first saturated polarization voltage,
wherein the first electrode, one of a source and a drain of the first transistor, and a gate of the second transistor are electrically connected to one another,
wherein one of a source and a drain of the second transistor is electrically connected to one of a source and a drain of the third transistor,
wherein the driving method comprises the steps of:
applying the first saturated polarization voltage to the ferroelectric layer in a first period; and
applying a voltage having a value between the first saturated polarization voltage and the second saturated polarization voltage to the ferroelectric layer as a data voltage in a second period,
wherein the first transistor is in an on state in the first period and the second period,
wherein the first transistor is in an off state in a third period,
wherein the third transistor is in an off state in the first to third periods, and
wherein the third transistor is in an on state in a fourth period.

15. The driving method of the semiconductor device, according to claim 14,
wherein a potential of the first electrode in the first period is different from a potential of the first electrode in the second period, and
wherein a potential of the second electrode in the first period is different from a potential of the second electrode in the second period.

16. The driving method of the semiconductor device, according to claim 14,
wherein the data voltage represents analog data.

17. The driving method of the semiconductor device, according to claim 14,
wherein the first transistor comprises a metal oxide in a channel formation region.

18. The driving method of the semiconductor device, according to claim 14,
wherein a potential of the second electrode is not changed in the second to fourth periods.

19. The driving method of the semiconductor device, according to claim 14,
wherein a constant potential is supplied to the other of the source and the drain of the second transistor in the first to fourth periods.

20. The driving method of the semiconductor device, according to claim 14,
wherein a polarity of a polarization amount of the ferroelectric layer in the first period and a polarity of a polarization amount of the ferroelectric layer in the second period are the same.

* * * * *